United States Patent

Iwasawa et al.

(10) Patent No.: US 11,835,857 B2
(45) Date of Patent: Dec. 5, 2023

(54) RESIST COMPOSITION AND METHOD OF FORMING RESIST PATTERN

(71) Applicant: TOKYO OHKA KOGYO CO., LTD., Kawasaki (JP)

(72) Inventors: Yuta Iwasawa, Kawasaki (JP); Yosuke Suzuki, Kawasaki (JP); Tasuku Matsumiya, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 260 days.

(21) Appl. No.: 17/304,620

(22) Filed: Jun. 23, 2021

(65) Prior Publication Data

US 2021/0405527 A1 Dec. 30, 2021

(30) Foreign Application Priority Data

Jun. 30, 2020 (JP) .................................. 2020-113267

(51) Int. Cl.
*G03F 7/004* (2006.01)
*G03F 7/039* (2006.01)
*G03F 7/20* (2006.01)
*G03F 7/32* (2006.01)

(52) U.S. Cl.
CPC .......... *G03F 7/0045* (2013.01); *G03F 7/0392* (2013.01); *G03F 7/2004* (2013.01); *G03F 7/32* (2013.01)

(58) Field of Classification Search
CPC .................................................... G03F 7/0045
See application file for complete search history.

(56) References Cited

U.S. PATENT DOCUMENTS

2018/0149973 A1* 5/2018 Arai ...................... G03F 7/0125

FOREIGN PATENT DOCUMENTS

JP 2018-092159 A 6/2018

* cited by examiner

*Primary Examiner* — Mark F. Huff
*Assistant Examiner* — Nicholas E Brown
(74) *Attorney, Agent, or Firm* — Knobbe, Martens, Olson & Bear, LLP

(57) ABSTRACT

A resist composition that contains a base material component (A), a first acid generator, and a second acid generator, the first acid generator is a compound represented by General Formula (b1), the second acid generator is a compound (B2) having an anion moiety having a molar volume of 250 cm$^3$/mol or less, and the molar volume of the anion moiety of the compound (B2) is smaller than the molar volume of the anion moiety of the compound (B1). In the formula, $Rb^0$ represents a specific condensed cyclic group, $Yb^0$ represents a divalent linking group, $Vb^0$ represents a single bond, $Rc^1$ represents an aryl group having an electron-withdrawing group, Rc2 and Rc3 each independently represent an aryl group or are bonded to each other to form a ring together with a sulfur atom in the formula.

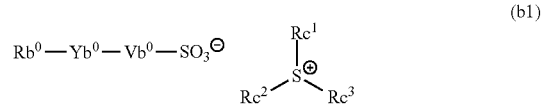

(b1)

7 Claims, No Drawings

RESIST COMPOSITION AND METHOD OF FORMING RESIST PATTERN

BACKGROUND OF THE INVENTION

Field of the Invention

The present invention relates to a resist composition and a method of forming a resist pattern.

Priority is claimed on Japanese Patent Application No. 2020-113267, filed on Jun. 30, 2020, the content of which is incorporated herein by reference.

Description of Related Art

In recent years, in the production of semiconductor elements and liquid crystal display elements, advances in lithography techniques have led to a rapid progress in the field of pattern miniaturization. Typically, these miniaturization techniques involve shortening the wavelength (increasing the energy) of the light source for exposure.

Resist materials for use with these types of light sources for exposure require lithography characteristics such as a high resolution capable of reproducing patterns of minute dimensions, and a high level of sensitivity to these types of light sources for exposure.

As a resist material that satisfies these requirements, a chemical amplification-type resist composition which contains a base material component exhibiting changed solubility in a developing solution under action of acid, and an acid generator component which generates an acid upon exposure has been conventionally used.

In the formation of the resist pattern, the behavior of an acid generated from an acid generator component upon exposure is considered as one factor that has a great influence on lithography characteristics.

As the acid generator that is used in the chemical amplification-type resist composition, a wide variety of acid generators have been proposed so far. For example, onium salt-based acid generators such as an iodonium salt and a sulfonium salt, oxime sulfonate-based acid generators, diazomethane-based acid generators, nitrobenzyl sulfonate-based acid generators, iminosulfonate-based acid generators, and disulfonate-based acid generators are known.

As the onium salt-based acid generators, those having an onium ion such as triphenylsulfonium in the cation moiety are mainly used. For an anion moiety of the onium salt-based acid generator, an alkyl sulfonate ion or a fluorinated alkyl sulfonate ion in which part or all of hydrogen atoms of the alkyl group are substituted with fluorine atoms is generally used.

Further, for improving the lithography characteristics in the formation of the resist pattern, an onium salt-based acid generator having an anion having a specific structure, as an anion moiety of the onium salt-based acid generator, has also been proposed (for example, Patent Document 1).

CITATION LIST

Patent Document

[Patent Document 1] Japanese Unexamined Patent Application, First Publication No. 2018-92159

SUMMARY OF THE INVENTION

Recently, with further advances in lithography techniques, rapid progress in the field of pattern miniaturization is being achieved together with the expansion of application fields. Along with this progress, in a case where manufacturing a semiconductor element or the like, a technique capable of forming, in a good shape, a fine pattern having a pattern width dimension of about 50 nm is required.

In a case of forming a fine pattern with a narrow pitch, the exposure light source may not reach the deep part (the substrate side) of the resist composition, and a region having a small number of photons may be generated. In the conventional resist composition as disclosed in Patent Document 1 described above, the resolution in a region where the number of photons is small is still insufficient, and it is difficult to achieve both high sensitivity and lithography characteristics.

The present invention has been made in consideration of the above circumstances, and an object of the present invention is to provide a resist composition, which has higher sensitivity and with which a resist pattern having good resolution and a good roughness reduction property can be formed, and a method of forming a resist pattern by using the resist composition.

In order to achieve the above-described object, the present invention employs the following configurations.

That is, the first aspect of the present invention is a resist composition which generates an acid upon exposure and exhibiting changed solubility in a developing solution under action of acid, where the resist composition contains a base material component (A) exhibiting changed solubility in a developing solution under action of acid and an acid generator component (B) generating an acid upon exposure, the acid generator component (B) contains a first acid generator and a second acid generator, the first acid generator is a compound (B1) represented by General Formula (b1), the second acid generator is a compound (B2) composed of a cation moiety and an anion moiety having a molar volume of 250 cm$^3$/mol or less, and the molar volume of the anion moiety of the compound (B2) is smaller than a molar volume of the anion moiety of the compound (B1).

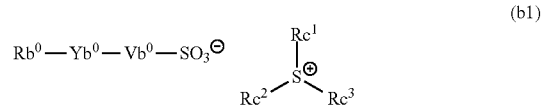

(b1)

[In the formula, Rb$^0$ represents a condensed cyclic group containing a condensed ring having at least one aromatic ring. Yb$^0$ represents a divalent linking group or a single bond. Vb$^0$ represents a single bond, an alkylene group, or a fluorinated alkylene group.

Rc$^1$ represents an aryl group having an electron-withdrawing group. Rc$^2$ and Rc$^3$ each independently represents an aryl group which may have a substituent or are bonded to each other to form a ring together with a sulfur atom in the formula.]

The second aspect according to the present invention is a method of forming a resist pattern, including a step of forming a resist film on a support using the resist composition according to the first aspect, a step of exposing the resist film, and a step of developing the exposed resist film to form a resist pattern.

According to the present invention, it is possible to provide a resist composition, which has higher sensitivity and with which a resist pattern having a good resolution and a good roughness reduction property, and a method of forming a resist pattern by using the resist composition.

DETAILED DESCRIPTION OF THE INVENTION

In the present specification and the scope of the present claims, the term "aliphatic" is a relative concept used with respect to the term "aromatic" and defines a group or compound that has no aromaticity.

The term "alkyl group" includes a monovalent saturated hydrocarbon group that is linear, branched, or cyclic, unless otherwise specified. The same applies to the alkyl group of an alkoxy group.

The term "alkylene group" includes a divalent saturated hydrocarbon group that is linear, branched, or cyclic, unless otherwise specified.

Examples of the "halogen atom" include a fluorine atom, a chlorine atom, a bromine atom, and an iodine atom.

The term "constitutional unit" means a monomer unit (monomeric unit) that constitutes to the formation of a polymer compound (a resin, a polymer, or a copolymer).

In a case where "may have a substituent" is described, both of a case where a hydrogen atom (—H) is substituted with a monovalent group and a case where a methylene group (—$CH_2$—) is substituted with a divalent group are included.

The term "exposure" is used as a general concept that includes irradiation with any form of radiation.

The term "acid-decomposable group" indicates a group in which at least a part of a bond in the structure of the acid-decomposable group can be cleaved by action of acid.

Examples of the acid-decomposable group having a polarity which is increased by action of acid include groups which are decomposed by action of acid to generate a polar group.

Examples of the polar group include a carboxy group, a hydroxyl group, an amino group, and a sulfo group (—$SO_3H$).

More specific examples of the acid-decomposable group include a group in which the above-described polar group has been protected with an acid-dissociable group (for example, a group in which a hydrogen atom of the OH-containing polar group has been protected with an acid-dissociable group).

The "acid-dissociable group" indicates any one of (i) a group in which a bond between the acid-dissociable group and an atom adjacent to the acid-dissociable group can be cleaved by action of acid; and (ii) a group in which a part of bonds are cleaved by action of acid, and then a decarboxylation reaction occurs, thereby cleaving the bond between the acid-dissociable group and the atom adjacent to the acid-dissociable group."

It is necessary that the acid-dissociable group that constitutes the acid-decomposable group be a group that exhibits a lower polarity than the polar group generated by the dissociation of the acid-dissociable group. Thus, in a case where the acid-dissociable group is dissociated by action of acid, a polar group exhibiting a higher polarity than the acid-dissociable group is generated, thereby increasing the polarity. As a result, the polarity of the entire component (A1) is increased. By the increase in the polarity, the solubility in a developing solution relatively changes. The solubility in a developing solution is increased in a case where the developing solution is an alkali developing solution, whereas the solubility in a developing solution is decreased in a case where the developing solution is an organic developing solution.

The "base material component" is an organic compound having a film-forming ability. The organic compounds used as the base material component are roughly classified into a non-polymer and a polymer. As the non-polymer, those having a molecular weight of 500 or more and less than 4,000 are usually used. Hereinafter, a "low-molecular-weight compound" refers to a non-polymer having a molecular weight of 500 or more and less than 4,000. As the polymer, those having a molecular weight of 1,000 or more are usually used. Hereinafter, a "resin", a "polymer compound", or a "polymer" refers to a polymer having a molecular weight of 1,000 or more. As the molecular weight of the polymer, a polystyrene-equivalent weight-average molecular weight determined by gel permeation chromatography (GPC) is used.

A "constitutional unit derived from" means a constitutional unit that is formed by the cleavage of a multiple bond between carbon atoms, for example, an ethylenic double bond.

In the "acrylic acid ester", the hydrogen atom bonded to the carbon atom at the α-position may be substituted with a substituent. The substituent ($R^{\alpha x}$) that is substituted for the hydrogen atom bonded to the carbon atom at the α-position is an atom other than a hydrogen atom or a group. Further, itaconic acid diester in which the substituent ($R^{\alpha x}$) is substituted with a substituent having an ester bond or α-hydroxyacryl ester in which the substituent ($R^{\alpha x}$) is substituted with a hydroxyalkyl group or a group in which a hydroxyl group thereof is modified can be mentioned as an acrylic acid ester. A carbon atom at the α-position of acrylic acid ester indicates the carbon atom bonded to the carbonyl group of acrylic acid, unless otherwise specified.

Hereinafter, acrylic acid ester in which the hydrogen atom bonded to the carbon atom at the α-position is substituted with a substituent is also referred to as an α-substituted acrylic acid ester".

The term "derivative" includes a compound in which the hydrogen atom at the α-position of the object compound has been substituted with another substituent such as an alkyl group or a halogenated alkyl group; and derivatives thereof. Examples of the derivatives thereof include a derivative in which the hydrogen atom of the hydroxyl group of the object compound in which the hydrogen atom at the α-position may be substituted with a substituent is substituted with an organic group; and a derivative in which a substituent other than a hydroxyl group is bonded to the object compound in which the hydrogen atom at the α-position may be substituted with a substituent. The α-position refers to the first carbon atom adjacent to the functional group unless otherwise specified.

Examples of the substituent that is substituted for the hydrogen atom at the α-position of hydroxystyrene include the same group as $R^{\alpha x}$.

In the present specification and the scope of the present claims, asymmetric carbon atoms may be present, and thus enantiomers or diastereomers may be present depending on the structures of the chemical formula. In that case, these isomers are represented by one chemical formula. These isomers may be used alone or in the form of a mixture.

(Resist Composition)

The resist composition according to the present embodiment is a resist composition which generates an acid upon exposure and exhibiting changed solubility in a developing solution under action of acid.

Such a resist composition contains a base material component (A) (hereinafter, also referred to as a "component (A)") exhibiting changed solubility in a developing solution under action of acid, and an acid generator component (B) generating an acid upon exposure (hereinafter, also referred to as a "component (B)"). The component (B) contains a first acid generator and a second acid generator.

In a case where a resist film is formed using the resist composition according to the present embodiment and the formed resist film is subjected to selective exposure, an acid is generated from the component (B) at the exposed portion of the resist film, and the generated acid acts on the component (A) to change the solubility of the component (A) in a developing solution, whereas the solubility of the component (A) in a developing solution is not changed at the unexposed portion, thereby which generates the difference in solubility in the developing solution between the exposed portion and the unexposed portion of the resist film. Therefore, by subjecting the resist film to development, the exposed portion of the resist film is dissolved and removed to form a positive-tone resist pattern in a case where the resist composition is a positive-tone type, whereas the unexposed portion of the resist film is dissolved and removed to form a negative-tone resist pattern in a case where the resist composition is a negative-tone type.

In the present specification, a resist composition which forms a positive-tone resist pattern by dissolving and removing the exposed portion of the resist film is called a positive-tone resist composition, and a resist composition which forms a negative-tone resist pattern by dissolving and removing the unexposed portion of the resist film is called a negative-tone resist composition. The resist composition according to the present embodiment may be a positive-tone resist composition or a negative-tone resist composition. Further, in the formation of a resist pattern, the resist composition according to the present embodiment can be applied to an alkali developing process using an alkali developing solution in the developing treatment, or a solvent developing process using a developing solution containing an organic solvent (organic developing solution) in the developing treatment.

<Component (A)>

In the resist composition according to the present embodiment, the component (A) preferably contains a resin component (A1) (hereinafter, also referred to as a "component (A1)") exhibiting changed solubility in a developing solution under action of acid. In the alkali developing process and the solvent developing process, since the polarity of the base material component before and after the exposure is changed by using the component (A1), an excellent development contrast can be obtained.

As the component (A), at least the component (A1) is used, and another polymer compound and/or a low-molecular-weight compound may be used in combination with the component (A1).

In a case of applying an alkali developing process, a base material component containing the component (A1) is substantially insoluble in an alkali developing solution prior to exposure, and, for example, in a case where an acid is generated from the component (B) upon exposure, the action of this acid causes an increase in the polarity of the base material component, thereby increasing the solubility of the base material component in an alkali developing solution. Therefore, in the formation of a resist pattern, by performing selective exposure of a resist film formed by applying the resist composition onto a support, the exposed portion of the resist film changes from an insoluble state to a soluble state in an alkali developing solution, whereas the unexposed portion of the resist film remains insoluble in an alkali developing solution, and thus, a positive-tone resist pattern is formed by alkali developing.

On the other hand, in a case of a solvent developing process, the base material component containing the component (A1) exhibits high solubility in an organic developing solution prior to exposure, and, for example, in a case where an acid is generated from the component (B) upon exposure, polarity is increased by the action of the generated acid, thereby decreasing the solubility in an organic developing solution. Therefore, in the formation of a resist pattern, by performing selective exposure of a resist film formed by applying the resist composition onto a support, the exposed portion of the resist film changes from a soluble state to an insoluble state in an organic developing solution, whereas the unexposed portion of the resist film remains soluble and does not change, thereby a contrast between the exposed portion and the unexposed portion can be obtained, and thus a negative-tone resist pattern is formed by developing in the organic developing solution.

In the resist composition according to the present embodiment, the component (A) may be used alone or in a combination of two or more kinds thereof.

In Regard to Component (A1)

The component (A1) is a resin component exhibiting changed solubility in a developing solution under action of acid.

The component (A1) preferably has a constitutional unit (a1) that includes an acid-decomposable group having a polarity which is increased by action of acid.

The component (A1) may have other constitutional units as necessary in addition to the constitutional unit (a1).

<<Constitutional Unit (a1)>>

The constitutional unit (a1) is a constitutional unit that contains an acid-decomposable group having a polarity which is increased by action of acid.

Examples of the acid-dissociable group are the same as those which have been proposed so far as acid-dissociable groups for the base resin for a chemical amplification-type resist composition.

Specific examples of acid-dissociable groups of the base resin proposed for a chemical amplification-type resist composition contains an "acetal-type acid-dissociable group", a "tertiary alkyl ester-type acid-dissociable group", and a "tertiary alkyloxycarbonyl acid-dissociable group" described below.

Acetal-Type Acid-Dissociable Group:

Examples of the acid-dissociable group for protecting a carboxy group or a hydroxyl group as a polar group include the acid-dissociable group represented by General Formula (a1-r-1) shown below (hereinafter, also referred to as an "acetal-type acid-dissociable group").

(a1-r-1)

[In the formula, $Ra'^1$ to $Ra'^2$ represent hydrogen atoms or alkyl groups. $Ra'^3$ represents a hydrocarbon group, and $Ra'^3$ may be bonded to $Ra'^1$ or $Ra'^2$ to form a ring.]

In General Formula (a1-r-1), it is preferable that at least one of $Ra'^1$ and $Ra'^2$ represent a hydrogen atom and more preferable that both of $Ra'^1$ and $Ra'^2$ represent hydrogen atoms.

In a case where $Ra^{t1}$ or $Ra^{t2}$ represents an alkyl group, examples of the alkyl group include the same alkyl group as that mentioned as the substituent which may be bonded to the carbon atom at the α-position in the description on the α-substituted acrylic acid ester, and the alkyl group preferably has 1 to 5 carbon atoms. Specific examples thereof preferably include a linear or branched alkyl group. More specific examples thereof include a methyl group, an ethyl group, a propyl group, an isopropyl group, an n-butyl group, an isobutyl group, a tert-butyl group, a pentyl group, an isopentyl group, and a neopentyl group. Among these, a methyl group or an ethyl group is preferable, and a methyl group is particularly preferable.

In General Formula (a1-r-1), examples of the hydrocarbon group as $Ra^{t3}$ include a linear or branched alkyl group and a cyclic hydrocarbon group.

The linear alkyl group has preferably 1 to 5 carbon atoms, more preferably 1 to 4 carbon atoms, and still more preferably 1 or 2 carbon atoms. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The branched alkyl group has preferably 3 to 10 carbon atoms and more preferably 3 to 5 carbon atoms. Specific examples thereof include an isopropyl group, an isobutyl group, a tert-butyl group, an isopentyl group, a neopentyl group a 1,1-diethylpropyl group, and a 2,2-dimethylbutyl group. Among these, an isopropyl group is preferable.

In a case where $Ra^{t3}$ represents a cyclic hydrocarbon group, the cyclic hydrocarbon group may be an aliphatic hydrocarbon group or an aromatic hydrocarbon group and may be a polycyclic group or a monocyclic group.

The aliphatic hydrocarbon group which is a monocyclic group is preferably a group in which one hydrogen atom has been removed from a monocycloalkane. The monocycloalkane preferably has 3 to 6 carbon atoms, and specific examples thereof include cyclopentane and cyclohexane.

The aliphatic hydrocarbon group which is a polycyclic group is preferably a group in which one hydrogen atom has been removed from a polycycloalkane. The polycycloalkane preferably has 7 to 12 carbon atoms, and specific examples thereof include adamantane, norbornane, isobornane, tricyclodecane, and tetracyclododecane.

In a case where the cyclic hydrocarbon group as $Ra^{t3}$ is an aromatic hydrocarbon group, the aromatic hydrocarbon group is a hydrocarbon group having at least one aromatic ring.

The aromatic ring is not particularly limited as long as it is a cyclic conjugated system having (4n+2) π electrons, and may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms.

Specific examples of the aromatic ring include aromatic hydrocarbon rings such as benzene, naphthalene, anthracene, and phenanthrene; and an aromatic heterocyclic ring in which a part of carbon atoms constituting the above-described aromatic hydrocarbon ring have been substituted with a hetero atom. Examples of the hetero atom in the aromatic heterocyclic rings include an oxygen atom, a sulfur atom, and a nitrogen atom. Specific examples of the aromatic heterocyclic ring include a pyridine ring and a thiophene ring.

Specific examples of the aromatic hydrocarbon group as $Ra^{t3}$ include a group in which one hydrogen atom has been removed from the above-described aromatic hydrocarbon ring or aromatic heterocyclic ring (an aryl group or a heteroaryl group); a group in which one hydrogen atom has been removed from an aromatic compound having two or more aromatic rings (for example, biphenyl or fluorene); and a group in which one hydrogen atom of the above-described aromatic hydrocarbon ring or aromatic heterocyclic ring has been substituted with an alkylene group (for example, an arylalkyl group such as a benzyl group, a phenethyl group, a 1-naphthylmethyl group, a 2-naphthylmethyl group, a 1-naphthylethyl group, or a 2-naphthylethyl group). The alkylene group bonded to the aromatic hydrocarbon ring or aromatic heterocyclic ring preferably has 1 to 4 carbon atoms, more preferably 1 or 2 carbon atoms, and particularly preferably 1 carbon atom.

The cyclic hydrocarbon group as $Ra^{t3}$ may have a substituent. Examples of the substituent include, $-R^{P1}$, $-R^{P2}-O-R^{P1}$, $-R^{P2}-CO-R^{P1}$, $-R^{P2}-CO-OR^{P1}$, $-R^{P2}-O-CO-R^{P1}$, $-R^{P2}-OH$, $-R^{P2}-CN$, and $-R^{P2}-COOH$ (hereinafter, these substituents are also collectively referred to as "$Rax^{x5}$").

Here, $R^{P1}$ represents a monovalent chain-like saturated hydrocarbon group having 1 to 10 carbon atoms, a monovalent aliphatic cyclic saturated hydrocarbon group having 3 to 20 carbon atoms, or a monovalent aromatic hydrocarbon group having 6 to carbon atoms. In addition, $R^{P2}$ represents a single bond, a divalent chain-like saturated hydrocarbon group having 1 to 10 carbon atoms, a divalent aliphatic cyclic saturated hydrocarbon group having 3 to 20 carbon atoms, or a divalent aromatic hydrocarbon group having 6 to 30 carbon atoms. However, part or all of hydrogen atoms included in the chain-like saturated hydrocarbon group, the aliphatic cyclic saturated hydrocarbon group, and the aromatic hydrocarbon group of $R^{P1}$ and $R^{P2}$ may be substituted with a fluorine atom. In the aliphatic cyclic hydrocarbon group, one or more of the above-described substituents may be included as a single kind, or one or more of the above-described substituents may be included as a plurality of kinds.

Examples of the monovalent chain-like saturated hydrocarbon group having 1 to carbon atoms include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms include monocyclic aliphatic saturated hydrocarbon groups such as a cyclopropyl group, a cyclobutyl group, a cyclopentyl group, a cyclohexyl group, a cycloheptyl group, a cyclooctyl group, a cyclodecyl group, and cyclododecyl group; and polycyclic aliphatic saturated hydrocarbon groups such as a bicyclo[2.2.2]octanyl group, a tricyclo[5.2.1.02,6]decanyl group, a tricyclo[3.3.1.13,7]decanyl group, a tetracyclo [6.2.1.13,6.02,7]dodecanyl group, and an adamantyl group.

Examples of the monovalent aromatic hydrocarbon group having 6 to 30 carbon atoms include a group in which one hydrogen atom has been removed from an aromatic hydrocarbon ring such as benzene, biphenyl, fluorene, naphthalene, anthracene, or phenanthrene.

In a case where $Ra^{t3}$ is bonded to $Ra^{t1}$ or $Ra^{t2}$ to form a ring, the cyclic group is preferably a 4- to 7-membered ring, and more preferably a 4- to 6-membered ring. Specific examples of the cyclic group include a tetrahydropyranyl group and a tetrahydrofuranyl group.

Tertiary Alkyl Ester-Type Acid-Dissociable Group:

Among the above polar groups, examples of the acid-dissociable group for protecting the carboxy group include the acid-dissociable group represented by General Formula (a1-r-2) shown below.

Among the acid-dissociable groups represented by General Formula (a1-r-2), for convenience, a group which is constituted of alkyl groups is referred to as a "tertiary alkyl ester-type acid-dissociable group".

(a1-r-2)

[In the formula, $Ra'^4$ to $Ra'^6$ each represents a hydrocarbon group, and $Ra'^5$ and $Ra'^6$ may be bonded to each other to form a ring.]

Examples of the hydrocarbon group as $Ra'^4$ include a linear or branched alkyl group, a chain-like or cyclic alkenyl group, and a cyclic hydrocarbon group.

Examples of the linear or branched alkyl group and the cyclic hydrocarbon group (the aliphatic hydrocarbon group which is a monocyclic group, the aliphatic hydrocarbon group which is a polycyclic group, or the aromatic hydrocarbon group) as $Ra'^4$ include the same groups as $Ra'^3$ described above.

The chain-like or cyclic alkenyl group as $Ra'^4$ is preferably an alkenyl group having 2 to 10 carbon atoms.

Examples of the hydrocarbon group as $Ra'^5$ or $Ra'^6$ include the same group as $Ra'^3$ described above.

In a case where $Ra'^5$ to $Ra'^6$ are bonded to each other to form a ring, groups represented by General Formula (a1-r2-1), General Formula (a1-r2-2), and General Formula (a1-r2-3) can be suitably mentioned.

On the other hand, in a case where $Ra'^4$ to $Ra'^6$ are not bonded to each other and represent an independent hydrocarbon group, a group represented by General Formula (a1-r2-4) can be suitably mentioned.

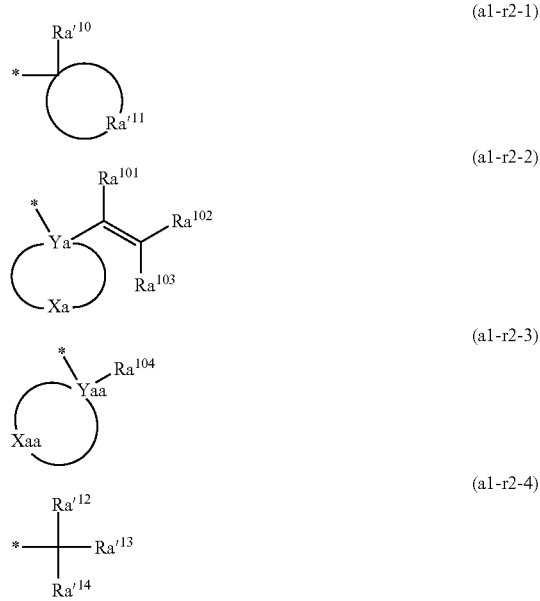

[In General Formula (a1-r2-1), $Ra'^{10}$ represents a linear or branched alkyl group having 1 to 12 carbon atoms, a part of which may be substituted with a halogen atom or a hetero atom-containing group. $Ra'^{11}$ represents a group that forms an aliphatic cyclic group together with a carbon atom to which $Ra'^{10}$ is bonded. In General Formula (a1-r2-2), Ya represents a carbon atom. Xa is a group that forms a cyclic hydrocarbon group together with Ya. Part or all of the hydrogen atoms which the cyclic hydrocarbon group has may be substituted. $Ra^{101}$ to $Ra^{103}$ each independently represents a hydrogen atom, a monovalent chain-like saturated hydrocarbon group having 1 to 10 carbon atoms, or a monovalent aliphatic cyclic saturated hydrocarbon group having 3 to 20 carbon atoms. Part or all of the hydrogen atoms which the chain-like saturated hydrocarbon group and the aliphatic cyclic saturated hydrocarbon group have may be substituted. Two or more of $Ra^{101}$ to $Ra^{103}$ may be bonded to each other to form a ring structure. In General Formula (a1-r2-3), Yaa represents a carbon atom. Xaa is a group that forms an aliphatic cyclic group together with Yaa. $Ra^{104}$ represents an aromatic hydrocarbon group which may have a substituent. In General Formula (a1-r2-4), $Ra'^{12}$ and $Ra'^{13}$ each independently represent a monovalent chain-like saturated hydrocarbon group having 1 to 10 carbon atoms or a hydrogen atom. Part or all of the hydrogen atoms which the chain-like saturated hydrocarbon group has may be substituted. $Ra'^{14}$ represents a hydrocarbon group which may have a substituent. * represents a bonding site.]

In General Formula (a1-r2-1), $Ra'^{10}$ represents a linear or branched alkyl group having 1 to 12 carbon atoms, a part of which may be substituted with a halogen atom or a hetero atom-containing group.

The linear alkyl group as $Ra'^{10}$ has 1 to 12 carbon atoms, and preferably has 1 to carbon atoms and particularly preferably 1 to 5 carbon atoms.

Examples of the branched alkyl group as $Ra'^{10}$ include the same group as $Ra'^3$.

A part of the alkyl group as $Ra'^{10}$ may be substituted with a halogen atom or a hetero atom-containing group. For example, a part of hydrogen atoms constituting the alkyl group may be substituted with a halogen atom or a hetero atom-containing group. Further, a part of carbon atoms (such as methylene group) constituting the alkyl group may be substituted with a hetero atom-containing group.

Examples of the hetero atom mentioned here include an oxygen atom, a sulfur atom, and a nitrogen atom. Examples of the hetero atom-containing group include (—O—), —C(=O)—O—, —O—C(=O)—, —C(=O)—, —O—C(=O)—O—, —C(=O)—NH—, —NH—, —S—, —S(=O)$_2$—, and —S(=O)$_2$—O—.

In General Formula (a1-r2-1), $Ra'^{11}$ (a group that forms an aliphatic cyclic group together with a carbon atom to which $Ra'^{10}$ is bonded) is preferably the group mentioned as the aliphatic hydrocarbon group (the alicyclic hydrocarbon group) which is a monocyclic group or a polycyclic group as $Ra'^3$ in General Formula (a1-r-1). Among them, a monocyclic alicyclic hydrocarbon group is preferable, specifically, a cyclopentyl group or a cyclohexyl group is more preferable, and a cyclopentyl group is still more preferable.

In General Formula (a1-r2-2), examples of the cyclic hydrocarbon group that is formed by Xa together with Ya include a group in which one or more hydrogen atoms are further removed from a cyclic monovalent hydrocarbon group (an aliphatic hydrocarbon group) as $Ra'^3$ in General Formula (a1-r-1).

The cyclic hydrocarbon group that is formed by Xa together with Ya may have a substituent. Examples of this substituent include the same group as the substituent which the cyclic hydrocarbon group as $Ra^{t3}$ may have.

In General Formula (a1-r2-2), as $Ra^{101}$ to $Ra^{103}$, examples of the monovalent chain-like saturated hydrocarbon group having 1 to 10 carbon atoms include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms, as $Ra^{101}$ to $Ra^{103}$, include monocyclic aliphatic saturated hydrocarbon groups such as a cyclopropyl group, a cyclobutyl group, a cyclopentyl group, a cyclohexyl group, a cycloheptyl group, a cyclooctyl group, a cyclodecyl group, and cyclododecyl group; and polycyclic aliphatic saturated hydrocarbon groups such as a bicyclo[2.2.2]octanyl group, a tricyclo[5.2.1.02,6]decanyl group, a tricyclo[3.3.1.13,7]decanyl group, a tetracyclo[6.2.1.13,6.02,7]dodecanyl group, and an adamantyl group.

Among them, $Ra^{101}$ to $Ra^{103}$ are preferably a hydrogen atom or a monovalent chain-like saturated hydrocarbon group having 1 to 10 carbon atoms, and among them, a hydrogen atom, a methyl group, and an ethyl group are more preferable, and a hydrogen atom is particularly preferable from the viewpoint of easy synthesis.

Examples of the substituent which the chain-like saturated hydrocarbon group represented by $Ra^{101}$ to $Ra^{103}$ or the aliphatic cyclic saturated hydrocarbon group has include the same groups as $Ra^{x5}$ described above.

Examples of the group containing a carbon-carbon double bond generated by forming a ring structure, in which two or more of $Ra^{101}$ to $Ra^{103}$ are bonded to each other, include a cyclopentenyl group, a cyclohexenyl group, a methylcyclopentenyl group, a methylcyclohexenyl group, a cyclopentylideneethenyl group, and a cyclohexylideneethenyl group. Among these, a cyclopentenyl group, a cyclohexenyl group, and a cyclopentylideneethenyl group are preferable from the viewpoint of easy synthesis.

In General Formula (a1-r2-3), an aliphatic cyclic group that is formed by Xaa together with Yaa is preferably the group mentioned as the aliphatic hydrocarbon group which is a monocyclic group or a polycyclic group as $Ra^{t3}$ in General Formula (a1-r-1).

In General Formula (a1-r2-3), Examples of the aromatic hydrocarbon group as $Ra^{104}$ include a group in which one or more hydrogen atoms have been removed from an aromatic hydrocarbon ring having 5 to 30 carbon atoms. Among them, $Ra^{104}$ is preferably a group in which one or more hydrogen atoms have been removed from an aromatic hydrocarbon ring having 6 to 15 carbon atoms, more preferably a group in which one or more hydrogen atoms have been removed from benzene, naphthalene, anthracene, or phenanthrene, still more preferably a group in which one or more hydrogen atoms have been removed from benzene, naphthalene, or anthracene, particularly preferably a group in which one or more hydrogen atoms have been removed from benzene or naphthalene, and most preferably a group in which one or more hydrogen atoms have been removed from benzene.

Examples of the substituent which $Ra^{104}$ in General Formula (a1-r2-3) may have include a methyl group, an ethyl group, propyl group, a hydroxy group, a carboxy group, a halogen atom, an alkoxy group (a methoxy group, an ethoxy group, a propoxy group, a butoxy group, and the like), and an alkyloxycarbonyl group.

In General Formula (a1-r2-4), $Ra^{t12}$ and $Ra^{t13}$ each independently represent a monovalent chain-like saturated hydrocarbon group having 1 to 10 carbon atoms or a hydrogen atom. Examples of the monovalent chain-like saturated hydrocarbon group having 1 to 10 carbon atoms as $Ra^{t12}$ and $Ra^{t13}$ include the same group as the monovalent chain-like saturated hydrocarbon group having 1 to 10 carbon atoms as $Ra^{101}$ to $Ra^{103}$ as described above. Part or all of the hydrogen atoms which the chain-like saturated hydrocarbon group has may be substituted.

Among them, $Ra^{t12}$ and $Ra^{t13}$ are preferably a hydrogen atom or an alkyl group having 1 to 5 carbon atoms, more preferably an alkyl group having 1 to 5 carbon atoms, still more preferably a methyl group or an ethyl group, and particularly preferably a methyl group.

In a case where the chain-like saturated hydrocarbon groups represented by $Ra^{t12}$ and $Ra^{t13}$ are substituted, examples of the substituent include the same group as $Ra^{x5}$ described above.

In General Formula (a1-r2-4), $Ra^{t14}$ represents a hydrocarbon group which may have a substituent. Examples of the hydrocarbon group as $Ra^{t14}$ include a linear or branched alkyl group and a cyclic hydrocarbon group.

The linear alkyl group as $Ra^{t14}$ has preferably 1 to 5 carbon atoms, more preferably 1 to 4 carbon atoms, and still more preferably 1 or 2 carbon atoms. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The branched alkyl group as $Ra^{t14}$ has preferably 3 to 10 carbon atoms and more preferably 3 to 5 carbon atoms. Specific examples thereof include an isopropyl group, an isobutyl group, a tert-butyl group, an isopentyl group, a neopentyl group a 1,1-diethylpropyl group, and a 2,2-dimethylbutyl group. Among these, an isopropyl group is preferable.

In a case where $Ra^{t14}$ represents a cyclic hydrocarbon group, the cyclic hydrocarbon group may be an aliphatic hydrocarbon group or an aromatic hydrocarbon group and may be a polycyclic group or a monocyclic group.

The aliphatic hydrocarbon group which is a monocyclic group is preferably a group in which one hydrogen atom has been removed from a monocycloalkane. The monocycloalkane preferably has 3 to 6 carbon atoms, and specific examples thereof include cyclopentane and cyclohexane.

The aliphatic hydrocarbon group which is a polycyclic group is preferably a group in which one hydrogen atom has been removed from a polycycloalkane. The polycycloalkane preferably has 7 to 12 carbon atoms, and specific examples thereof include adamantane, norbornane, isobornane, tricyclodecane, and tetracyclododecane.

Examples of the aromatic hydrocarbon group as $Ra^{t14}$ include the same group as the aromatic hydrocarbon group as $Ra^{104}$. Among them, $Ra^{t14}$ is preferably a group in which one or more hydrogen atoms have been removed from an aromatic hydrocarbon ring having 6 to 15 carbon atoms, more preferably a group in which one or more hydrogen atoms have been removed from benzene, naphthalene, anthracene, or phenanthrene, still more preferably a group in which one or more hydrogen atoms have been removed from benzene, naphthalene, or anthracene, particularly preferably a group in which one or more hydrogen atoms have been removed from naphthalene or anthracene, and most preferably a group in which one or more hydrogen atoms have been removed from naphthalene.

Examples of the substituent which $Ra^{t14}$ may have include the same group as the substituent which $Ra^{104}$ may have.

In a case where Ra'¹⁴ in General Formula (a1-r2-4) is a naphthyl group, the position at which the tertiary carbon atom in General Formula (a1-r2-4) is bonded is any of the 1-position and the 2-position of the naphthyl group.

In a case where Ra'¹⁴ in Formula (a1-r2-4) is an anthryl group, the position at which the tertiary carbon atom in Formula (a1-r2-4) is bonded is any of the 1-position, the 2-position, and 9-position of the anthryl group.

Specific examples of the group represented by General Formula (a1-r2-1) are shown below.

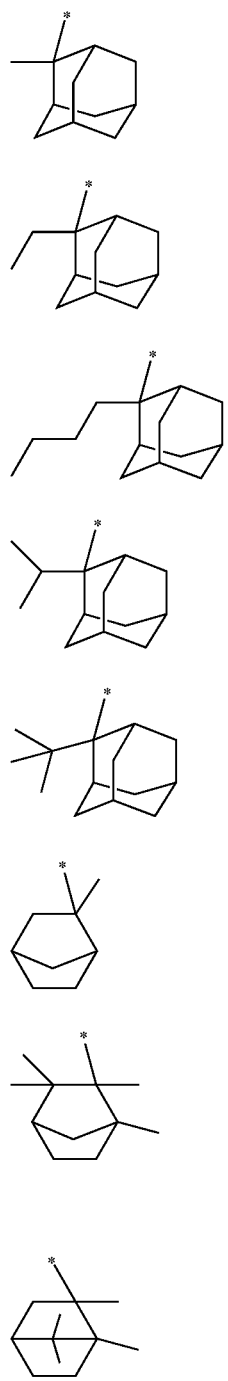

(r-pr-m1)
(r-pr-m2)
(r-pr-m3)
(r-pr-m4)
(r-pr-m5)
(r-pr-m6)
(r-pr-m7)
(r-pr-m8)

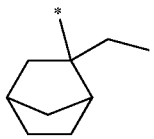

(r-pr-m9)

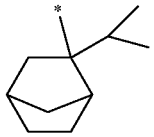

(r-pr-m10)

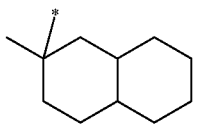

(r-pr-m11)

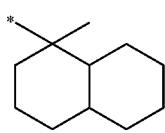

(r-pr-m12)

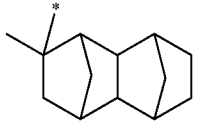

(r-pr-m13)

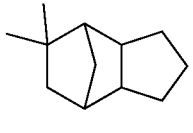

(r-pr-m14)

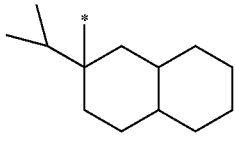

(r-pr-m15)

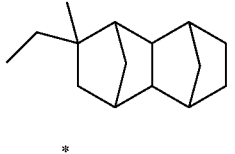

(r-pr-m16)

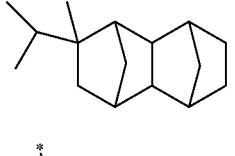

(r-pr-m17)

(r-pr-s1)

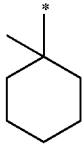

(r-pr-s2)

-continued
(r-pr-s3) 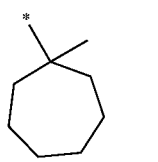
(r-pr-s4) 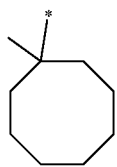
(r-pr-s5) 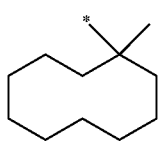
(r-pr-s6) 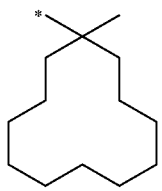
(r-pr-s7) 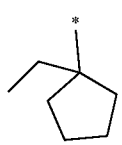
(r-pr-s8) 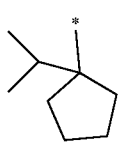
(r-pr-s9) 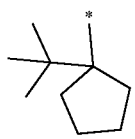
(r-pr-s10) 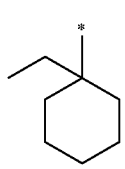
(r-pr-s11) 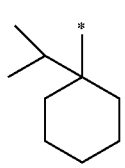
-continued
(r-pr-s12) 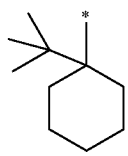
(r-pr-s13) 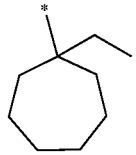
(r-pr-s14) 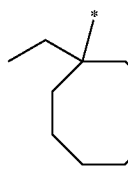
(r-pr-s15)
(r-pr-s16)
(r-pr-s17)
(r-pr-s18)
(r-pr-s19)
(r-pr-s20)
(r-pr-sp1) 

(r-pr-sp2)
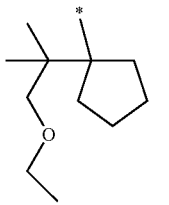
(r-pr-sp3)
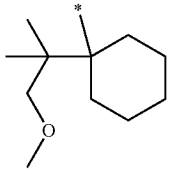
(r-pr-sp4)
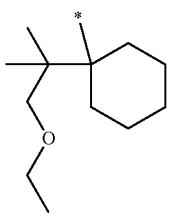
(r-pr-mp1)
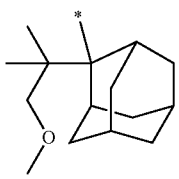
(r-pr-mp2)
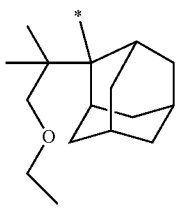
Specific examples of the group represented by General Formula (a1-r2-2) are shown below.
(r-pr-sv1)
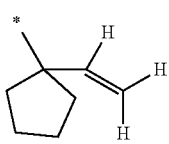
(r-pr-sv2)
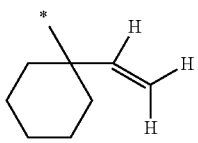
(r-pr-sv3)
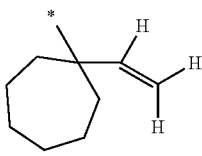
(r-pr-sv4)
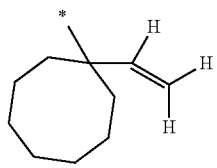
(r-pr-sv5)
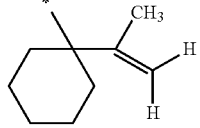
(r-pr-sv6)
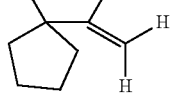
(r-pr-sv7)
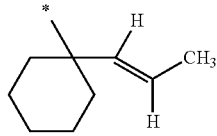
(r-pr-sv8)
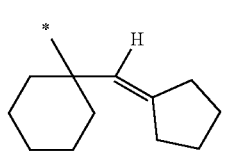
(r-pr-sv9)
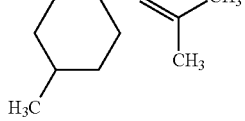
(r-pr-sv10)
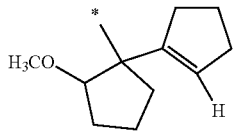
(r-pr-sv11)
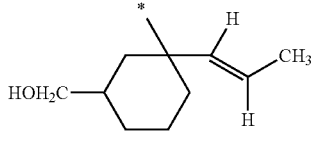
(r-pr-sv12)
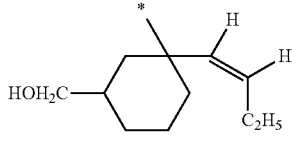
(r-pr-mv1)
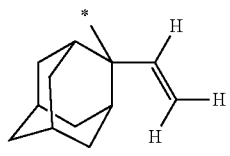

(r-pr-mv2)
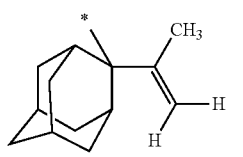
(r-pr-mv3)
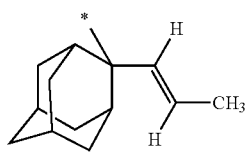
(r-pr-mv4)
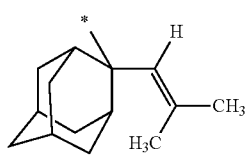
(r-pr-mv5)
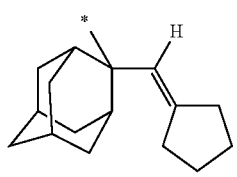
(r-pr-mv6)
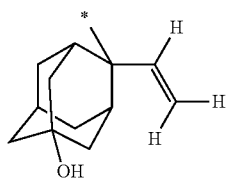
(r-pr-mv7)
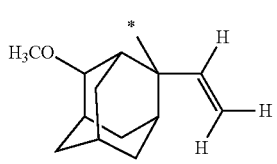
(r-pr-mv8)
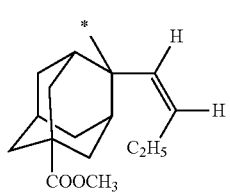
(r-pr-mv9)
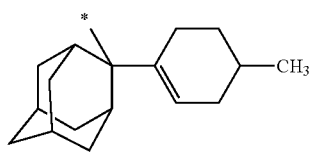
(r-pr-mv10)
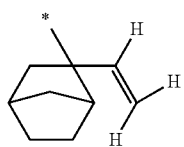
(r-pr-mv11)
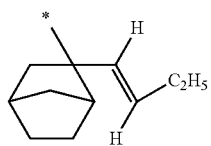
(r-pr-mv12)
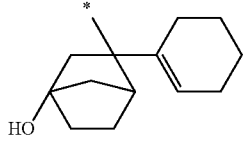
(r-pr-mv13)
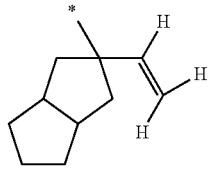
(r-pr-mv14)
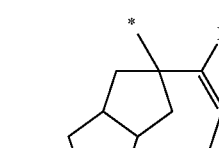
(r-pr-mv15)
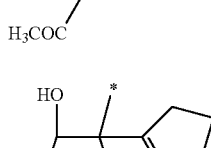
(r-pr-mv16)
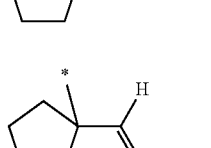
(r-pr-mv17)
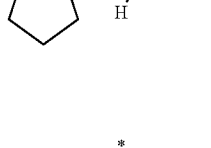
(r-pr-mv18)
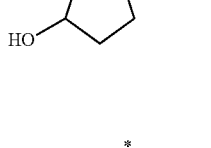
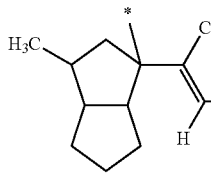

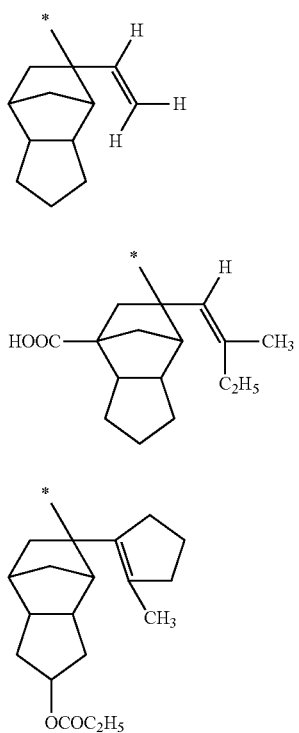
Specific examples of the group represented by Formula (a1-r2-3) are shown below.
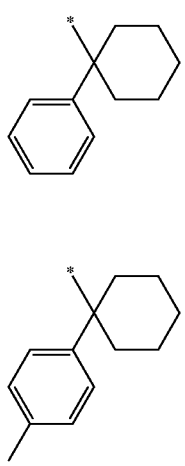
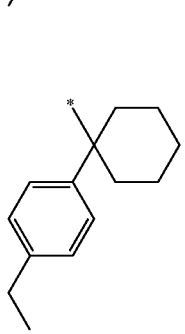
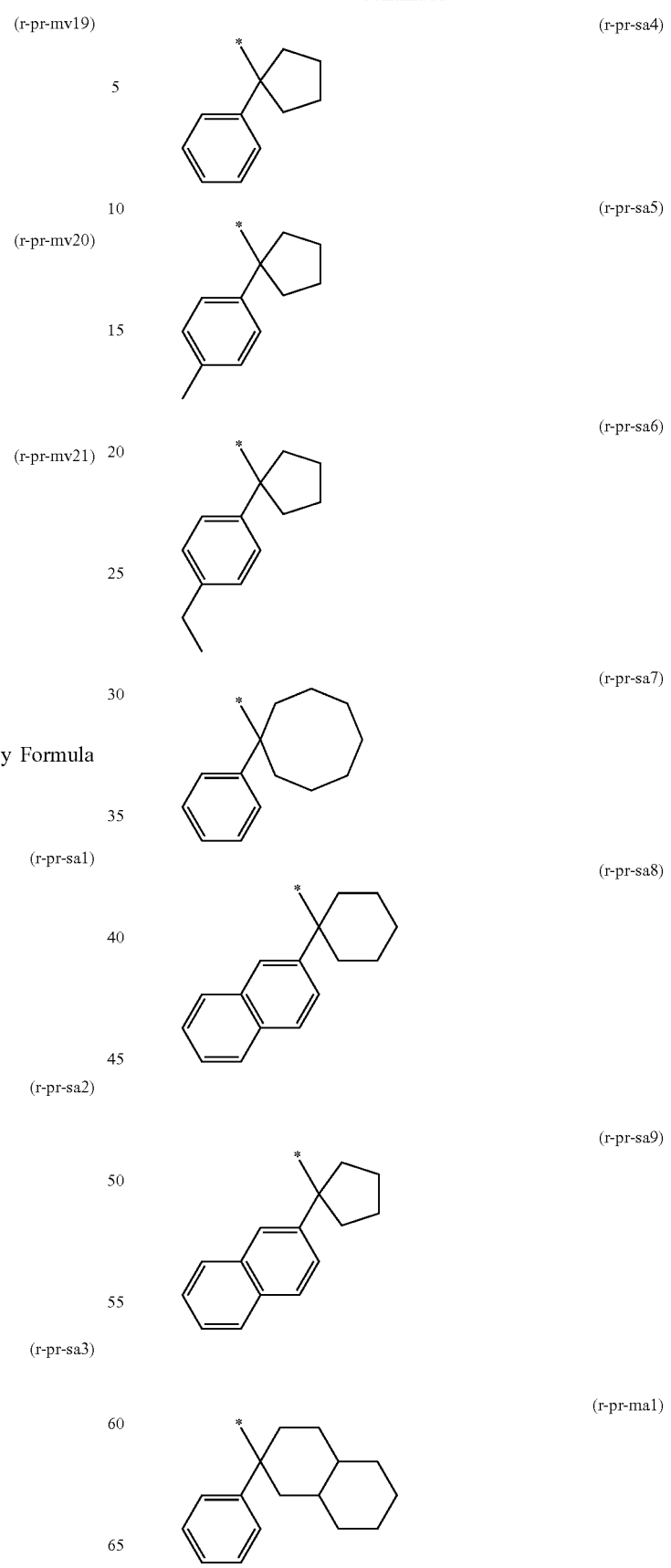

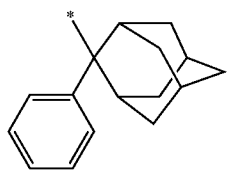
(r-pr-ma2)
Specific examples of the group represented by General Formula (a1-r2-4) are shown below.
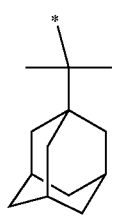
(r-pr-cm1)
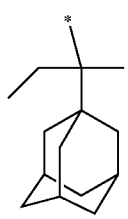
(r-pr-cm2)
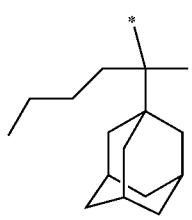
(r-pr-cm3)
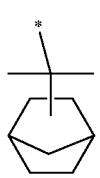
(r-pr-cm4)
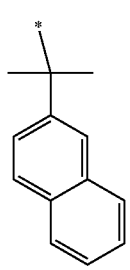
(r-pr-cm5)
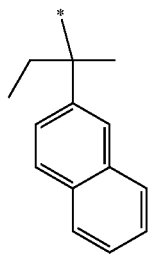
(r-pr-cm6)
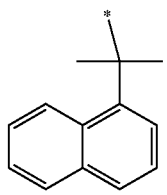
(r-pr-cm7)
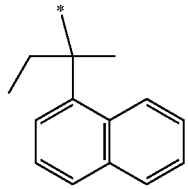
(r-pr-cm8)
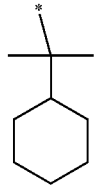
(r-pr-cs1)
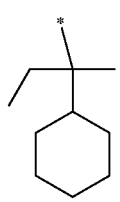
(r-pr-cs2)
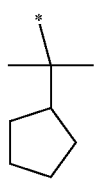
(r-pr-cs3)
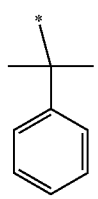
(r-pr-cs4)

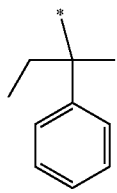
(r-pr-cs5)

(r-pr-c1)

(r-pr-c2)

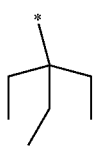
(r-pr-c3)

Tertiary Alkyloxycarbonyl Acid-Dissociable Group:

Among the polar groups, examples of the acid-dissociable group for protecting a hydroxyl group include an acid-dissociable group (hereinafter, for convenience, also referred to as a "tertiary alkyloxycarbonyl acid-dissociable group") represented by General Formula (a1-r-3) shown below.

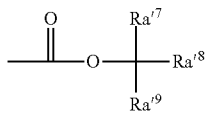
(a1-r-3)

[In the formula, $Ra'^7$ to $Ra'^9$ each represents an alkyl group.]

In General Formula (a1-r-3), $Ra'^7$ to $Ra'^9$ are each preferably an alkyl group having 1 to 5 carbon atoms and more preferably an alkyl group having 1 to 3 carbon atoms.

Further, the total number of carbon atoms in each of the alkyl groups is preferably in a range of 3 to 7, more preferably in a range of 3 to 5, and most preferably 3 or 4.

Examples of the constitutional unit (a1) include a constitutional unit derived from acrylic acid ester in which the hydrogen atom bonded to the carbon atom at the ex-position may be substituted with a substituent; a constitutional unit derived from acrylamide; a constitutional unit in which at least a part of hydrogen atoms in a hydroxyl group of a constitutional unit derived from hydroxystyrene or a hydroxystyrene derivative are protected by the substituent including an acid-decomposable group; and a constitutional unit in which at least a part of hydrogen atoms in —C(=O)—OH of a constitutional unit derived from vinylbenzoic acid or a vinylbenzoic acid derivative are protected by the substituent including an acid-decomposable group.

Among the above, the constitutional unit (a1) is preferably a constitutional unit derived from acrylic acid ester in which the hydrogen atom bonded to the carbon atom at the α-position may be substituted with a substituent.

Preferred specific examples of such a constitutional unit (a1) include constitutional units represented by General Formula (a1-1) or (a1-2).

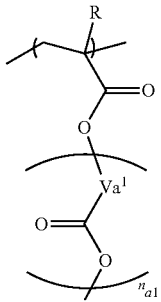
(a1-1)

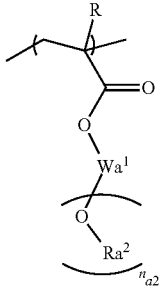
(a1-2)

[In the formula, R represents a hydrogen atom, an alkyl group having 1 to 5 carbon atoms, or a halogenated alkyl group having 1 to 5 carbon atoms. $Va^1$ represents a divalent hydrocarbon group which may have an ether bond. $n_{a1}$ represents an integer in a range of 0 to 2. $Ra^1$ is an acid-dissociable group represented by General Formula (a1-r-1) or (a1-r-2). $Wa^1$ represents an ($n_{a2}$+1)-valent hydrocarbon group, $n_{a2}$ represents an integer in a range of 1 to 3, and $Ra^2$ represents an acid-dissociable group represented by General Formula (a1-r-1) or (a1-r-3).]

In General Formula (a1-1), the alkyl group having 1 to 5 carbon atoms as R is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which part or all of hydrogen atoms in the alkyl group having 1 to 5 carbon atoms have been substituted with a halogen atom. The halogen atom is particularly preferably a fluorine atom.

As R, a hydrogen atom, an alkyl group having 1 to 5 carbon atoms, or a fluorinated alkyl group having 1 to 5 carbon atoms is preferable, and a hydrogen atom or a methyl group is most preferable in terms of industrial availability.

In General Formula (a1-1), the divalent hydrocarbon group as $Va^1$ may be an aliphatic hydrocarbon group or an aromatic hydrocarbon group.

The aliphatic hydrocarbon group as the divalent hydrocarbon group represented by $Va^1$ may be saturated or unsaturated. In general, it is preferable that the aliphatic hydrocarbon group be saturated.

Specific examples of the aliphatic hydrocarbon group include a linear or branched aliphatic hydrocarbon group, and an aliphatic hydrocarbon group containing a ring in the structure thereof.

The linear aliphatic hydrocarbon group described above preferably has 1 to 10 carbon atoms, more preferably 1 to 6 carbon atoms, still more preferably 1 to 4 carbon atoms, and most preferably 1 to 3 carbon atoms.

The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group described above preferably has 2 to carbon atoms, more preferably 3 to 6 carbon atoms, still more preferably 3 or 4 carbon atoms, and most preferably 3 carbon atoms.

The branched aliphatic hydrocarbon group is preferably a branched alkylene group, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$>, —$C(CH_3)(CH_2CH_2CH_3)$>, and —$C(CH_2CH_3)_2$—; alkylethylene groups such as —$CH(CH_3)CH_2$—, —$CH(CH_3)CH(CH_3)$>, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. The alkyl group in the alkylalkylene group is preferably a linear alkyl group having 1 to 5 carbon atoms.

Examples of the aliphatic hydrocarbon group containing a ring in the structure thereof include an alicyclic hydrocarbon group (a group in which two hydrogen atoms have been removed from an aliphatic hydrocarbon ring), a group in which the alicyclic hydrocarbon group is bonded to the terminal of the linear or branched aliphatic hydrocarbon group, and a group in which the alicyclic hydrocarbon group is interposed in the linear or branched aliphatic hydrocarbon group. Examples of the linear or branched aliphatic hydrocarbon group include the same group as the above-described linear aliphatic hydrocarbon group or the above-described branched aliphatic hydrocarbon group.

The alicyclic hydrocarbon group preferably has 3 to 20 carbon atoms and more preferably 3 to 12 carbon atoms.

The alicyclic hydrocarbon group may be a polycyclic group or a monocyclic group. The monocyclic alicyclic hydrocarbon group is preferably a group in which two hydrogen atoms have been removed from a monocycloalkane. The monocycloalkane preferably has 3 to 6 carbon atoms, and specific examples thereof include cyclopentane and cyclohexane. The polycyclic alicyclic hydrocarbon group is preferably a group in which two hydrogen atoms have been removed from a polycycloalkane, and the polycycloalkane is preferably a group having 7 to 12 carbon atoms. Specific examples of the polycycloalkane include adamantane, norbornane, isobornane, tricyclodecane, and tetracyclododecane.

The aromatic hydrocarbon group as the divalent hydrocarbon group represented by $Va^1$ is a hydrocarbon group having an aromatic ring.

The aromatic hydrocarbon group preferably has 3 to 30 carbon atoms, more preferably 5 to 30 carbon atoms, still more preferably 5 to 20 carbon atoms, particularly preferably 6 to 15 carbon atoms, and most preferably 6 to 12 carbon atoms. Here, the number of carbon atoms in a substituent is not included in the number of carbon atoms.

Specific examples of the aromatic ring which the aromatic hydrocarbon group has include aromatic hydrocarbon rings such as benzene, biphenyl, fluorene, naphthalene, anthracene, and phenanthrene; and an aromatic heterocyclic ring in which a part of carbon atoms constituting the above-described aromatic hydrocarbon rings have been substituted with a hetero atom. Examples of the hetero atom in the aromatic heterocyclic rings include an oxygen atom, a sulfur atom, and a nitrogen atom.

Specific examples of the aromatic hydrocarbon group include a group in which two hydrogen atoms have been removed from the above-described aromatic hydrocarbon ring (an arylene group); and a group in which one hydrogen atom of a group (an aryl group) formed by removing one hydrogen atom from the aromatic hydrocarbon ring has been substituted with an alkylene group (for example, a group in which one or more hydrogen atoms have been removed from an aryl group in arylalkyl groups such as a benzyl group, a phenethyl group, a 1-naphthylmethyl group, a 2-naphthylmethyl group, a 1-naphthylethyl group, or a 2-naphthylethyl group). The alkylene group (an alkyl chain in the arylalkyl group) preferably has 1 to 4 carbon atoms, more preferably 1 or 2 carbon atoms, and particularly preferably 1 carbon atom.

In General Formula (a1-1), $Ra^1$ is an acid-dissociable group represented by General Formula (a1-r-1) or (a1-r-2).

In General Formula (a1-2), the $(n_{a2}+1)$-valent hydrocarbon group as $Wa^1$ may be an aliphatic hydrocarbon group or an aromatic hydrocarbon group. The aliphatic hydrocarbon group indicates a hydrocarbon group that has no aromaticity and may be saturated or unsaturated. In general, it is preferable that the aliphatic hydrocarbon group be saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof.

The valency of $(n_{a2}+1)$ is preferably divalent, trivalent, or tetravalent, and more preferably divalent or trivalent.

In General Formula (a1-2), $Ra^2$ is an acid-dissociable group represented by General Formula (a1-r-1) or (a1-r-3).

Specific examples of the constitutional unit represented by General Formula (a1-1) are shown below. In each of the formulae shown below, R″ represents a hydrogen atom, a methyl group, or a trifluoromethyl group.

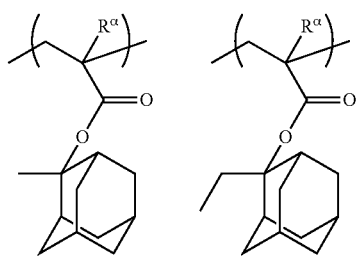

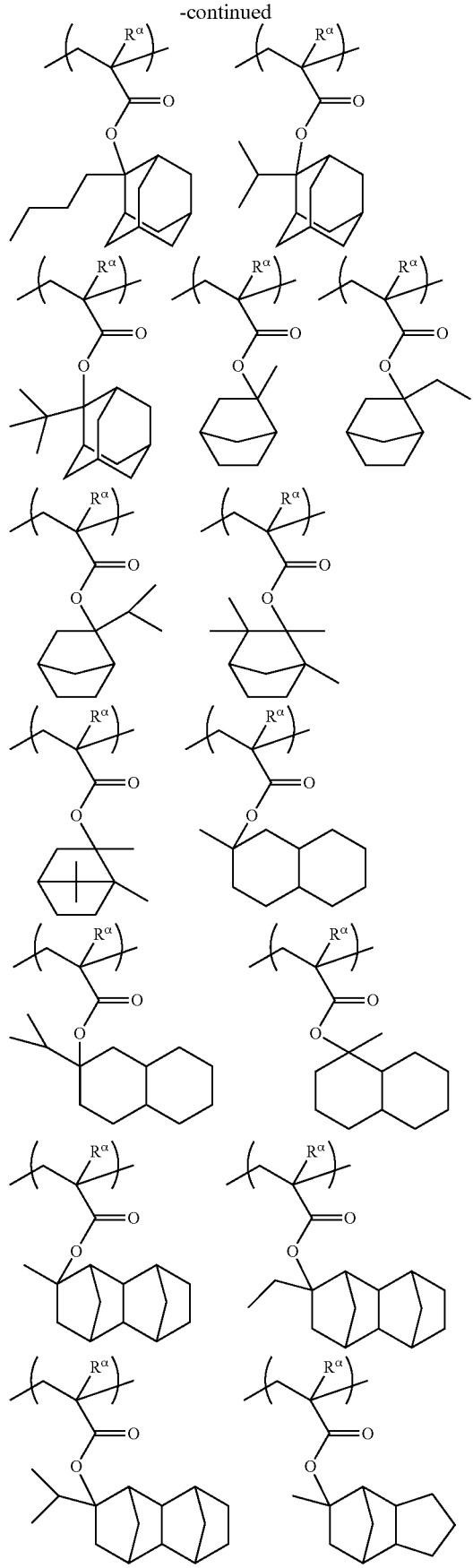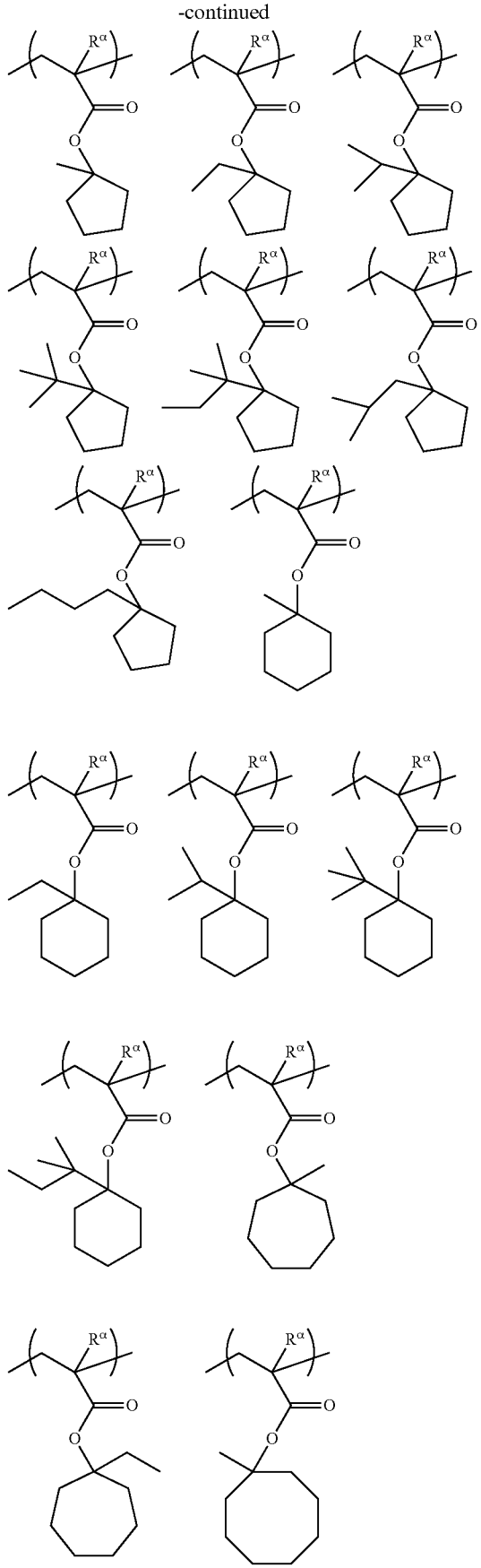

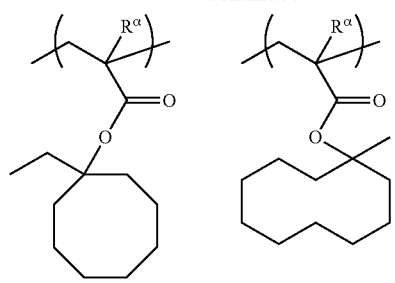
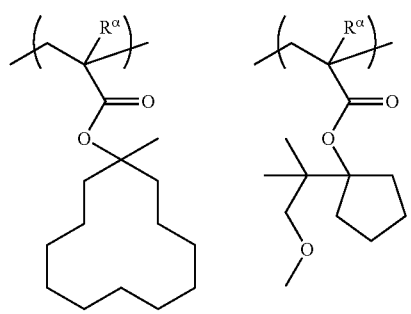
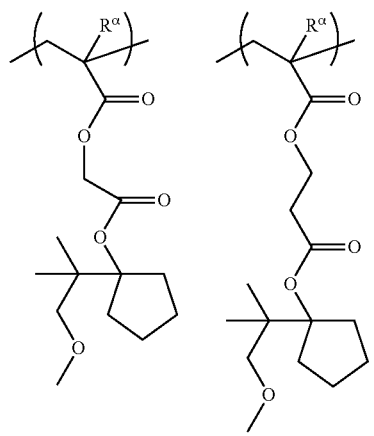
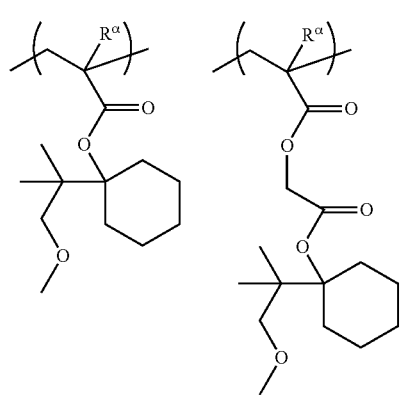
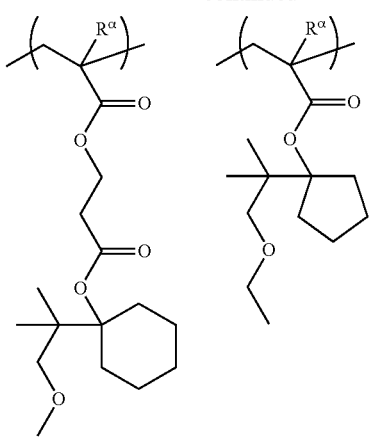
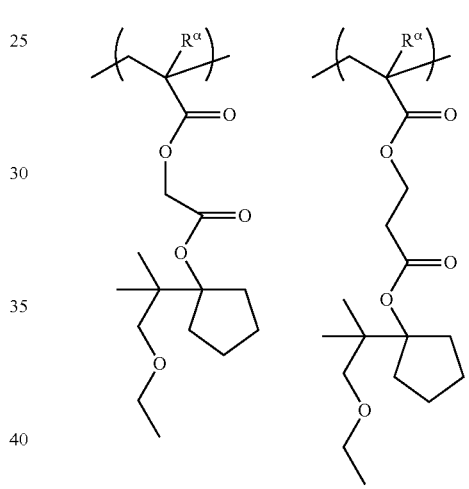
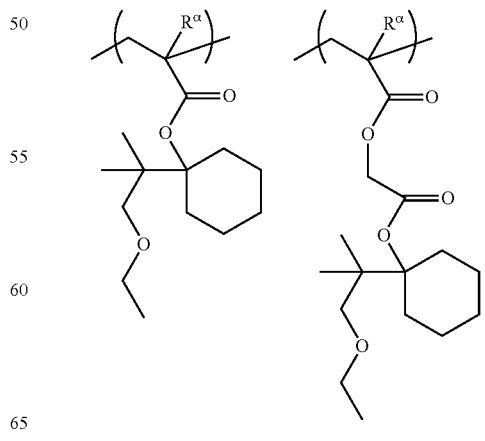

33
-continued
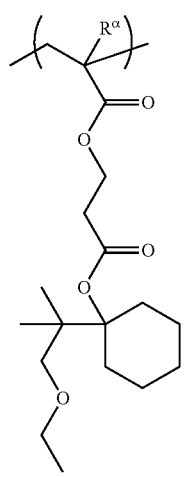 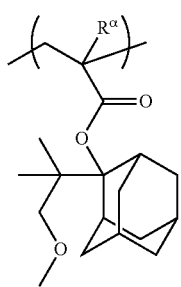
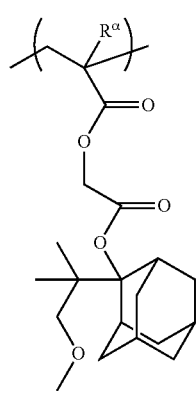 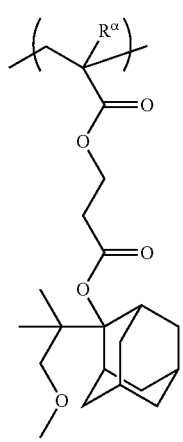
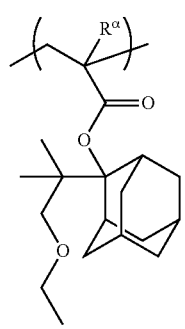 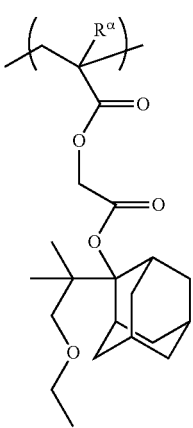
34
-continued
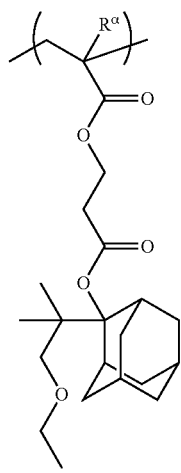 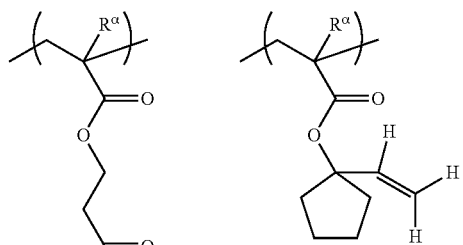
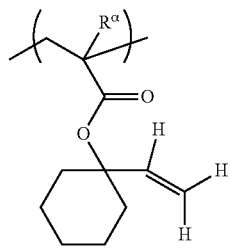 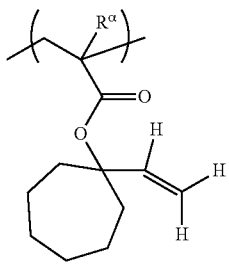
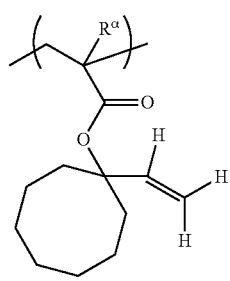 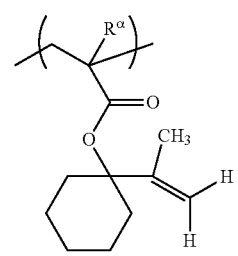
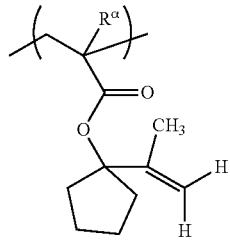 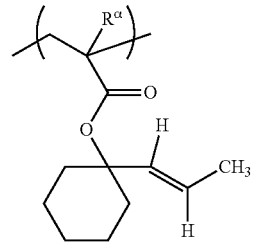
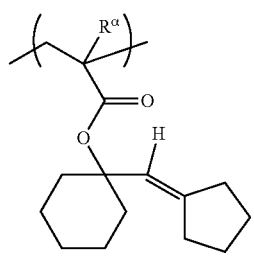 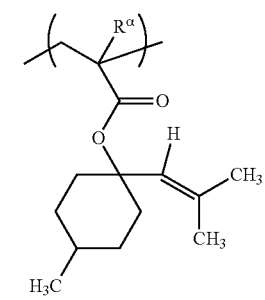

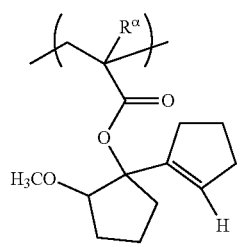
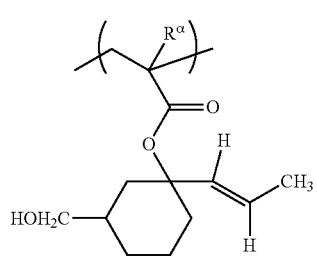
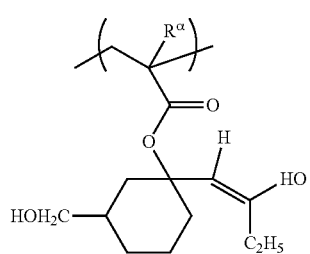
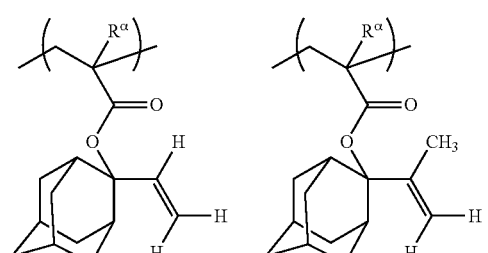
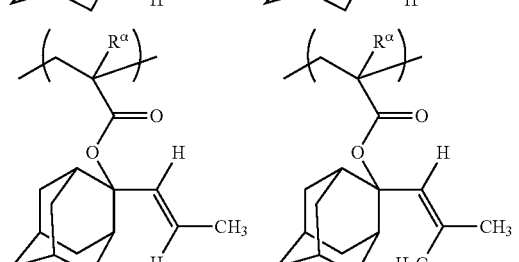
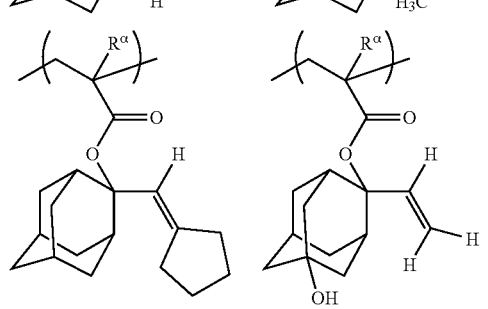
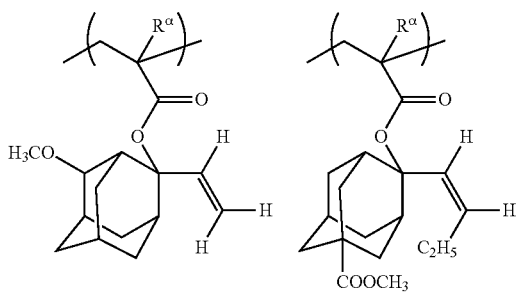
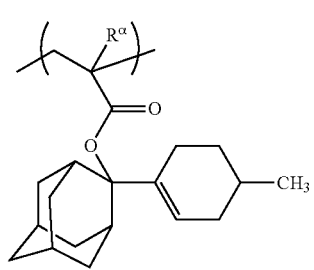
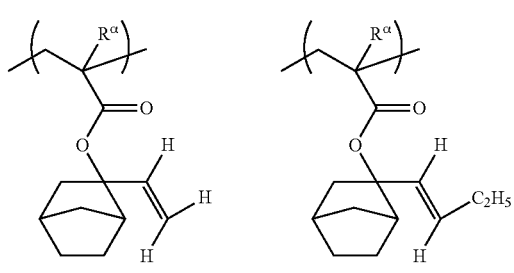
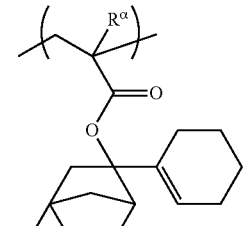
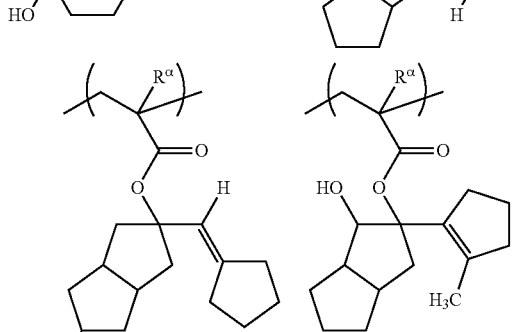
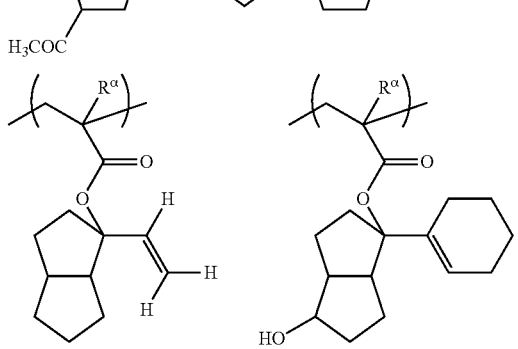

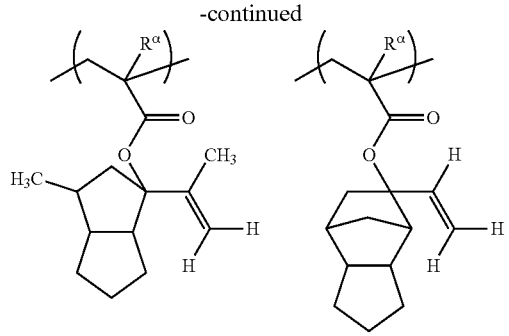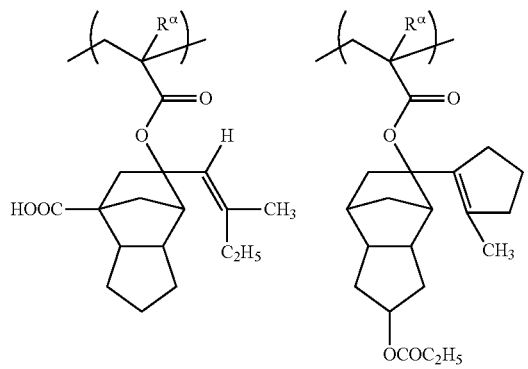

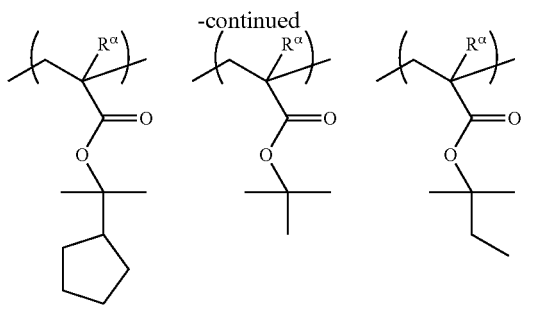
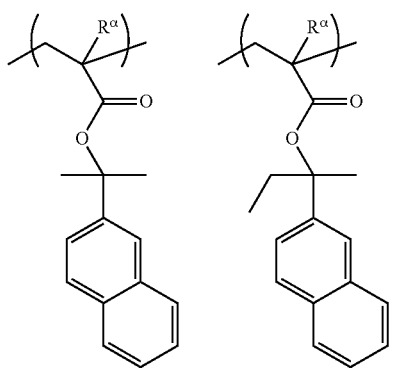
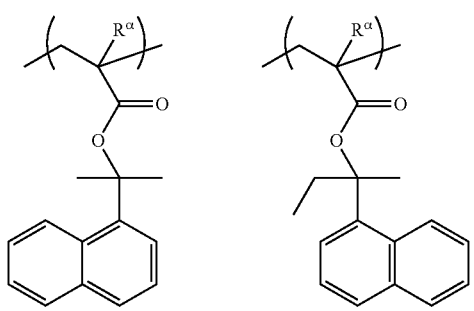
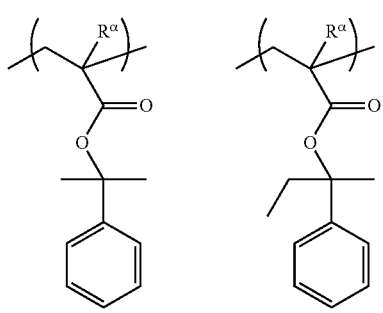

The constitutional unit (a1) which the component (A1) has may be one kind or may be two or more kinds.

The constitutional unit (a1) is more preferably a constitutional unit represented by General Formula (a1-1) since lithography characteristics (sensitivity, shape, and the like) in lithography depending on an electron beam or EUV can be more easily increased.

Among these, the constitutional unit (a1) particularly preferably includes a constitutional unit represented by General Formula (a1-1-1) shown below.

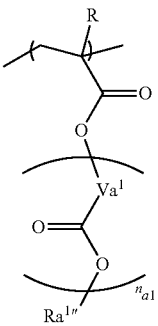 (a1-1-1)

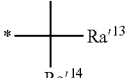 (a1-r2-1)

(a1-r2-3)

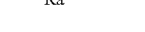

 (a1-r2-4)

[In the formula, $Ra^{1'''}$ is an acid-dissociable group represented by General Formula (a1-r2-1), (a1-r2-3), or (a1-r2-4).]

In General Formula (a1-1-1), R, $Va^1$, and $n_{a1}$ are each the same as R, $Va^1$, and $n_{a1}$ in General Formula (a1-1).

The description for the acid-dissociable group represented by General Formula (a1-r2-1), (a1-r2-3), or (a1-r2-4) is as described above. Among them, it is preferable to select a group in which the acid-dissociable group is a cyclic group due to the fact that the reactivity can be increased, which is suitable for EB or EUV.

In General Formula (a1-1-1), $Ra^{1'''}$ is preferably, among the above, an acid-dissociable group represented by General Formula (a1-r2-1).

The proportion of the constitutional unit (a1) in the component (A1) is preferably in a range of 5% to 80% by mole, more preferably in a range of 10% to 75% by mole, still more preferably in a range of 30% to 70% by mole, and particularly preferably in a range of 40% to 60% by mole, with respect to the total amount (100% by mole) of all constitutional units constituting the component (A1).

In a case where the proportion of the constitutional unit (a1) is equal to or more than the lower limit value of the preferred range described above, lithography characteristics such as sensitivity, resolution, and roughness are improved. On the other hand, in a case where the proportion is equal to or lower than the upper limit value of the preferred range, balance with other constitutional units can be obtained, and various lithography characteristics are improved.

<<Other Constitutional Units>>

The component (A1) may have other constitutional units as necessary in addition to the constitutional unit (a1) described above.

Examples of other constitutional units include a constitutional unit (a10) represented by General Formula (a10-1)

described later; a constitutional unit (a2) containing a lactone-containing cyclic group, a —SO$_2$—-containing cyclic group, or a carbonate-containing cyclic group; a constitutional unit (a3) containing a polar group-containing aliphatic hydrocarbon group; a constitutional unit (a4) containing an acid non-dissociable aliphatic cyclic group; and a constitutional unit (st) derived from styrene or a derivative thereof.

In Regard to Constitutional Unit (a10):

The constitutional unit (a10) is a constitutional unit represented by General Formula (a10-1).

(a10-1)

[In the formula, R represents a hydrogen atom, an alkyl group having 1 to 5 carbon atoms, or a halogenated alkyl group having 1 to 5 carbon atoms. $Ya^{x1}$ represents a single bond or a divalent linking group. $Wa^{x1}$ represents an aromatic hydrocarbon group which may have a substituent, $n_{ax1}$ represents an integer of 1 or more.]

In General Formula (a10-1), R represents a hydrogen atom, an alkyl group having 1 to 5 carbon atoms, or a halogenated alkyl group having 1 to 5 carbon atoms.

As the alkyl group having 1 to 5 carbon atoms as R, a linear or branched alkyl group having 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group, and a neopentyl group.

The halogenated alkyl group having 1 to 5 carbon atoms as R is a group in which part or all of hydrogen atoms of the above-described alkyl group having 1 to 5 carbon atoms have been substituted with a halogen atom. The halogen atom is particularly preferably a fluorine atom.

R is preferably a hydrogen atom, an alkyl group having 1 to 5 carbon atoms, or a fluorinated alkyl group having 1 to 5 carbon atoms, and in terms of industrial availability, R is more preferably a hydrogen atom, a methyl group, or trifluoromethyl group, still more preferably a hydrogen atom or a methyl group, and particularly preferably a methyl group.

In General Formula (a10-1), $Ya^{x1}$ represents a single bond or a divalent linking group.

In the chemical formulae described above, the divalent linking group as $Ya^{x1}$ is not particularly limited, and suitable examples thereof include a divalent hydrocarbon group which may have a substituent and a divalent linking group having hetero atoms.

Divalent Hydrocarbon Group which May have Substituent:

In a case where $Ya^{x1}$ represents a divalent hydrocarbon group which may have a substituent, the hydrocarbon group may be an aliphatic hydrocarbon group or an aromatic hydrocarbon group.

Aliphatic Hydrocarbon Group as $Ya^{x1}$

The aliphatic hydrocarbon group indicates a hydrocarbon group that has no aromaticity. The aliphatic hydrocarbon group may be saturated or unsaturated. In general, it is preferable that the aliphatic hydrocarbon group be saturated.

Examples of the aliphatic hydrocarbon group include a linear or branched aliphatic hydrocarbon group, and an aliphatic hydrocarbon group containing a ring in the structure thereof.

Linear or Branched Aliphatic Hydrocarbon Group

The linear aliphatic hydrocarbon group described above preferably has 1 to 10 carbon atoms, more preferably 1 to 6 carbon atoms, still more preferably 1 to 4 carbon atoms, and most preferably 1 to 3 carbon atoms.

The linear aliphatic hydrocarbon group is preferably a linear alkylene group, and specific examples thereof include a methylene group [—CH$_2$—], an ethylene group [—(CH$_2$)$_2$—], a trimethylene group [—(CH$_2$)$_3$—], a tetramethylene group [—(CH$_2$)$_4$—], and a pentamethylene group [—(CH$_2$)$_5$—].

The branched aliphatic hydrocarbon group described above preferably has 2 to carbon atoms, more preferably 3 to 6 carbon atoms, still more preferably 3 or 4 carbon atoms, and most preferably 3 carbon atoms.

The branched aliphatic hydrocarbon group is preferably a branched alkylene group, and specific examples thereof include alkylalkylene groups, for example, alkylmethylene groups such as —CH(CH$_3$)—, —CH(CH$_2$CH$_3$)—, —C(CH$_3$)$_2$—, —C(CH$_3$)(CH$_2$CH$_3$)>, —C(CH$_3$)(CH$_2$CH$_2$CH$_3$)>, and —C(CH$_2$CH$_3$)$_2$—; alkylethylene groups such as —CH(CH$_3$)CH$_2$—, —CH(CH$_3$)CH(CH$_3$)>, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. The alkyl group in the alkylalkylene group is preferably a linear alkyl group having 1 to 5 carbon atoms.

The linear or branched aliphatic hydrocarbon group may a substituent or may not have a substituent. Examples of the substituent include a fluorine atom, a fluorinated alkyl group having 1 to 5 carbon atoms, which has been substituted with a fluorine atom, and a carbonyl group.

Aliphatic Hydrocarbon Group Containing Ring in Structure Thereof

Examples of the aliphatic hydrocarbon group containing a ring in the structure thereof include a cyclic aliphatic hydrocarbon group which may have a substituent containing a hetero atom in the ring structure thereof (a group in which two hydrogen atoms have been removed from an aliphatic hydrocarbon ring), a group in which the cyclic aliphatic hydrocarbon group is bonded to the terminal of a linear or branched aliphatic hydrocarbon group, and a group in which the cyclic aliphatic hydrocarbon group is interposed in a linear or branched aliphatic hydrocarbon group. Examples of the linear or branched aliphatic hydrocarbon group include the same groups as those described above.

The cyclic aliphatic hydrocarbon group preferably has 3 to 20 carbon atoms and more preferably 3 to 12 carbon atoms.

The cyclic aliphatic hydrocarbon group may be a polycyclic group or a monocyclic group. The monocyclic alicyclic hydrocarbon group is preferably a group in which two hydrogen atoms have been removed from a monocycloalkane. The monocycloalkane preferably has 3 to 6 carbon atoms, and specific examples thereof include cyclopentane and cyclohexane. The polycyclic alicyclic hydrocarbon group is preferably a group in which two hydrogen atoms have been removed from a polycycloalkane, and the polycycloalkane is preferably a group having 7 to 12 carbon atoms. Specific examples of the polycycloalkane include adamantane, norbornane, isobornane, tricyclodecane, and tetracyclododecane.

The cyclic aliphatic hydrocarbon group may have or may not have a substituent. Examples of the substituent include an alkyl group, an alkoxy group, a halogen atom, a halogenated alkyl group, a hydroxyl group, and a carbonyl group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and still more preferably a methoxy group or an ethoxy group.

The halogen atom as the substituent is preferably a fluorine atom.

Examples of the halogenated alkyl group as the substituent include groups in which part or all of hydrogen atoms in the above-described alkyl groups have been substituted with the above-described halogen atoms.

In the cyclic aliphatic hydrocarbon group, a part of carbon atoms constituting the ring structure thereof may be substituted with a substituent containing a hetero atom. The substituent containing a hetero atom is preferably —O—, —C(=O)—O—, —S—, —S(=O)$_2$—, or —S(=O)$_2$—O—.

Aromatic Hydrocarbon Group as Ya$^{x1}$

The aromatic hydrocarbon group is a hydrocarbon group having at least one aromatic ring.

The aromatic ring is not particularly limited as long as it is a cyclic conjugated system having (4n+2) π electrons, and may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms. Here, the number of carbon atoms in a substituent is not included in the number of carbon atoms.

Specific examples of the aromatic ring include aromatic hydrocarbon rings such as benzene, naphthalene, anthracene, and phenanthrene; and an aromatic heterocyclic ring in which a part of carbon atoms constituting the above-described aromatic hydrocarbon ring have been substituted with a hetero atom. Examples of the hetero atom in the aromatic heterocyclic rings include an oxygen atom, a sulfur atom, and a nitrogen atom. Specific examples of the aromatic heterocyclic ring include a pyridine ring and a thiophene ring.

Specific examples of the aromatic hydrocarbon group include a group in which two hydrogen atoms have been removed from the above-described aromatic hydrocarbon ring or aromatic heterocyclic ring (an arylene group or a heteroarylene group); a group in which two hydrogen atoms have been removed from an aromatic compound having two or more aromatic rings (for example, biphenyl or fluorene); and a group in which one hydrogen atom of a group (an aryl group or a heteroaryl group) obtained by removing one hydrogen atom from the above-described aromatic hydrocarbon ring or aromatic heterocyclic ring has been substituted with an alkylene group (for example, a group in which one hydrogen atom further has been removed from an aryl group in arylalkyl groups such as a benzyl group, a phenethyl group, a 1-naphthylmethyl group, a 2-naphthylmethyl group, a 1-naphthylethyl group, or a 2-naphthylethyl group). The alkylene group bonded to the aryl group or the heteroaryl group preferably has 1 to 4 carbon atoms, more preferably 1 or 2 carbon atoms, and particularly preferably 1 carbon atoms.

With respect to the aromatic hydrocarbon group, the hydrogen atom which the aromatic hydrocarbon group has may be substituted with a substituent. For example, the hydrogen atom bonded to the aromatic ring in the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group having 1 to 5 carbon atoms, and a methyl group, an ethyl group, a propyl group, an n-butyl group, or a tert-butyl group is most preferable.

Examples of the alkoxy group, the halogen atom, and the halogenated alkyl group, as the substituent, include the same groups as those exemplified as the substituent that is substituted for a hydrogen atom which the cyclic aliphatic hydrocarbon group has.

Divalent Linking Group Containing Hetero Atom

In a case where Ya$^{x1}$ represents a divalent linking group containing a hetero atom, preferred examples of the linking group include —O—, —C(=O)—O—, —O—C(=O)—, —C(=O)—, —O—C(=O)—O—, —C(=O)—NH—, —NH—, —NH—C(=NH)— (H may be substituted with a substituent such as an alkyl group, an acyl group, or the like), —S—, —S(=O)$_2$—, —S(=O)$_2$—O—, and a group represented by General Formula —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$—, —Y$^{21}$—O—C(=O)—Y$^{22}$— or —Y$^{21}$—S(=O)$_2$—O—Y$^{22}$— [in the formulae, Y$^{21}$ and Y$^{22}$ each independently represent a divalent hydrocarbon group which may have a substituent, O represents an oxygen atom, and m″ represents an integer in a range of 0 to 3].

In a case where the divalent linking group containing a hetero atom is —C(=O)—NH—, —C(=O)—NH—C(=O)—, —NH—, or —NH—C(=NH)—, H may be substituted with a substituent such as an alkyl group, an acyl group, or the like. The substituent (an alkyl group, an acyl group, or the like) preferably has 1 to 10 carbon atoms, more preferably 1 to 8 carbon atoms, and most preferably 1 to 5 carbon atoms.

In General Formulae —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$—, —Y$^{21}$—O—C(=O)—Y$^{22}$—, and —Y$^{21}$—S(=O)$_2$—O—Y$^{22}$—, Y$^{21}$, and Y$^{22}$ each independently represent a divalent hydrocarbon group which may have a substituent. Examples of the divalent hydrocarbon group include the same groups as those (the divalent hydrocarbon groups which may have a substituent) described in the description of the above divalent linking group as Ya$^{x1}$.

Y$^{21}$ is preferably a linear aliphatic hydrocarbon group, more preferably a linear alkylene group, still more preferably a linear alkylene group having 1 to 5 carbon atoms, and particularly preferably a methylene group or an ethylene group.

Y$^{22}$ is preferably a linear or branched aliphatic hydrocarbon group and more preferably a methylene group, an ethylene group, or an alkylmethylene group. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula —[Y$^{21}$—C(=O)—O]$_{m''}$—Y$^{22}$—, m″ represents an integer in a range of 0 to 3, preferably an integer in a range of 0 to 2, more preferably 0 or 1, and particularly preferably 1. In other words, it is particularly preferable that the group represented by Formula $-[Y^{21}-C(=O)-O]_{m''}-Y^{22}-$ represent a group represented by Formula $-Y^{21}-C(=O)-O-Y^{22}-$. Among these, a group represented by Formula $-(CH_2)_{a'}-C(=O)-O-(CH_2)_{b'}-$ is preferable. In the formula, a' represents an integer in a range of 1 to 10, preferably an integer in a range of 1 to 8, more preferably an integer in a range of 1 to 5, still more preferably 1 or 2, and most preferably 1. b' represents an integer in a range of 1 to 10, preferably an integer in a range of 1 to 8, more preferably an integer in a range of 1 to 5, still more preferably 1 or 2, and most preferably 1.

Among the above, $Ya^{x1}$ is preferably a single bond, an ester bond [$-C(=O)-O-$, $-O-C(=O)-$], an ether bond ($-O-$), a linear or branched alkylene group, or a combination thereof, and more preferably a single bond or an ester bond [$-C(=O)-O-$, $-O-C(=O)-$].

In General Formula (a10-1), $Wa^{x1}$ represents an aromatic hydrocarbon group which may have a substituent.

Examples of the aromatic hydrocarbon group as $Wa^{x1}$ include a group in which ($n_{ax1}+1$) hydrogen atoms have been removed from an aromatic ring which may have a substituent. The aromatic ring is not particularly limited as long as it is a cyclic conjugated system having (4n+2) π electrons, and may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms. Specific examples of the aromatic ring include aromatic hydrocarbon rings such as benzene, naphthalene, anthracene, and phenanthrene; and an aromatic heterocyclic ring in which a part of carbon atoms constituting the above-described aromatic hydrocarbon rings have been substituted with a hetero atom. Examples of the hetero atom in the aromatic heterocyclic rings include an oxygen atom, a sulfur atom, and a nitrogen atom. Specific examples of the aromatic heterocyclic ring include a pyridine ring and a thiophene ring.

Examples of the aromatic hydrocarbon group as $Wa^{x1}$ also include a group in which ($n_{ax1}+1$) hydrogen atoms have been removed from an aromatic compound including an aromatic ring (for example, biphenyl or fluorene) which may have two or more substituents.

Among the above, $Wa^{x1}$ is preferably a group in which ($n_{ax1}+1$) hydrogen atoms have been removed from benzene, naphthalene, anthracene, or biphenyl, more preferably a group in which ($n_{ax1}+1$) hydrogen atoms have been removed from benzene or naphthalene, and still more preferably a group in which ($n_{ax1}+1$) hydrogen atoms have been removed from benzene.

The aromatic hydrocarbon group as $Wa^{x1}$ may have a substituent or may not have a substituent. Examples of the substituent include an alkyl group, an alkoxy group, a halogen atom, and a halogenated alkyl group. Examples of the alkyl group, the alkoxy group, the halogen atom, and the halogenated alkyl group, as the substituent, include the same groups as those described as the above-described substituent of the cyclic aliphatic hydrocarbon group as $Ya^{x1}$. The substituent is preferably a linear or branched alkyl group having 1 to 5 carbon atoms, more preferably a linear or branched alkyl group having 1 to 3 carbon atoms, still more preferably an ethyl group or a methyl group, and particularly preferably a methyl group. The aromatic hydrocarbon group as $Wa^{x1}$ preferably has no substituent.

In General Formula (a10-1), $n_{ax1}$ represents an integer of 1 or greater, preferably an integer in a range of 1 to 10, more preferably an integer in a range of 1 to 5, still more preferably 1, 2, or 3, and particularly preferably 1 or 2.

Specific examples of the constitutional unit (a10) represented by General Formula (a10-1) are shown below.

In the formulae shown below, R" represents a hydrogen atom, a methyl group, or a trifluoromethyl group.

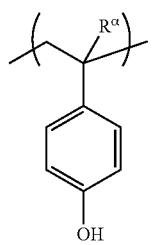

(a10-1-11)

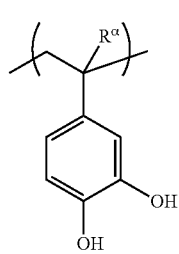

(a10-1-12)

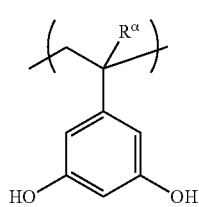

(a10-1-13)

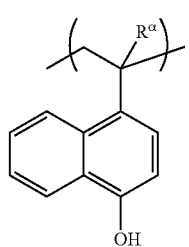

(a10-1-14)

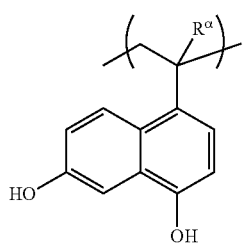

(a10-1-15)

(a10-1-16)
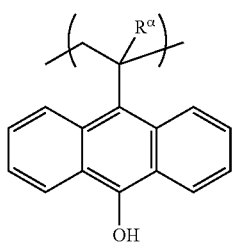
(a10-1-17)
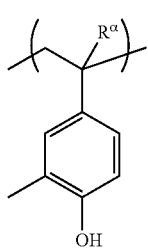
(a10-1-18)
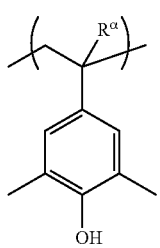
(a10-1-21)
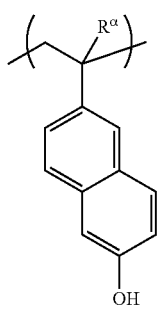
(a10-1-22)
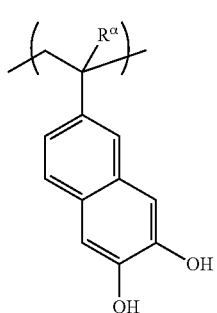
(a10-1-23)
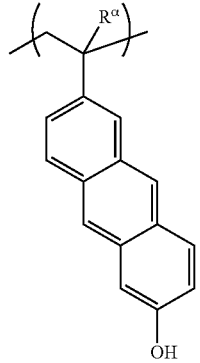
(a10-1-24)
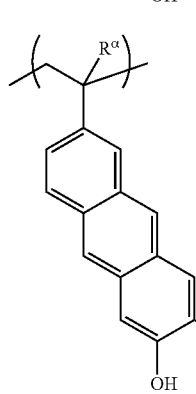
(a10-1-31)
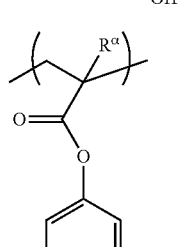
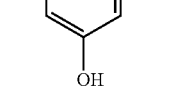
(a10-1-32)
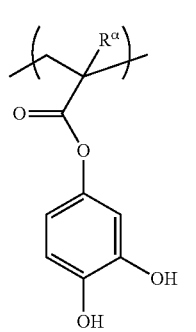
(a10-1-33)
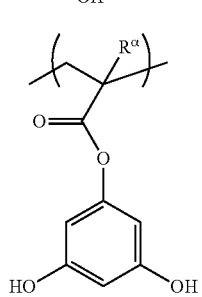

(a10-1-34)

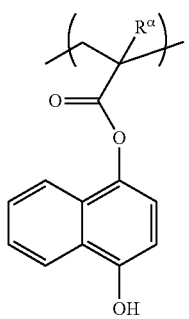

(a10-1-35)

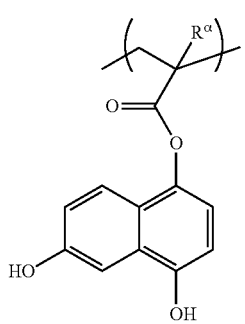

(a10-1-36)

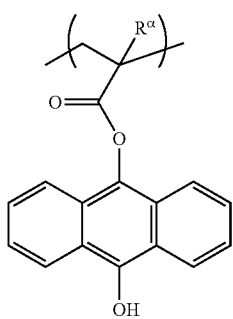

(a10-1-41)

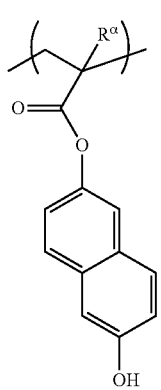

(a10-1-42)

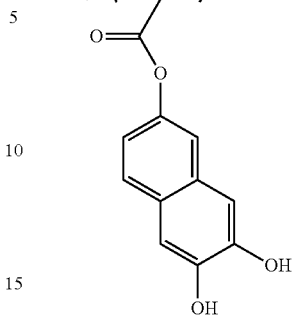

(a10-1-43)

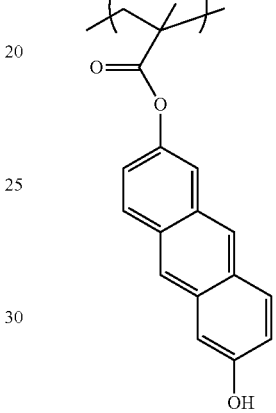

(a10-1-44)

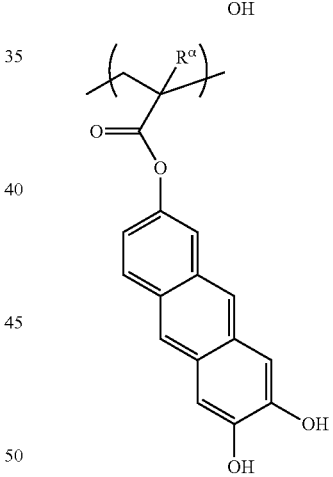

The constitutional unit (a10) which the component (A1) has may be one kind or may be two or more kinds.

In a case where the component (A1) has the constitutional unit (a10), the proportion of the constitutional unit (a10) in the component (A1) is preferably in a range of 5% to 80% by mole, more preferably in a range of 10% to 75% by mole, still more preferably in a range of 30% to 70% by mole, and particularly preferably in a range of 40% to 60% by mole, with respect to the total amount (100% by mole) of all constitutional units constituting the component (A1).

In a case where the proportion of the constitutional unit (a10) is equal to or more than the lower limit value, the sensitivity can be more easily increased. On the other hand, in a case where the proportion of the constitutional unit (a10)

is equal to or lower than the upper limit value, balance with other constitutional units is obtained easily.

In Regard to Constitutional Unit (a2):

The component (A1) may further have, as necessary, a constitutional unit (a2) (provided that a group having the constitutional unit (a1) is excluded) containing a lactone-containing cyclic group, a —SO$_2$—-containing cyclic group, or a carbonate-containing cyclic group, in addition to the constitutional unit (a1).

In a case where the component (A1) is used for forming a resist film, the lactone-containing cyclic group, the —SO$_2$—-containing cyclic group, or the carbonate-containing cyclic group in the constitutional unit (a2) is effective for improving the adhesiveness of the resist film to the substrate. Further, due to having the constitutional unit (a2), lithography characteristics can be improved, for example, by the effects obtained by appropriately adjusting the acid diffusion length, increasing the adhesiveness of the resist film to the substrate, and appropriately adjusting the solubility during development.

The term "lactone-containing cyclic group" indicates a cyclic group that contains a ring (lactone ring) containing a —O—C(=O)— in the ring skeleton. In a case where the lactone ring is counted as the first ring and the group contains only the lactone ring, the group is referred to as a monocyclic group. Further, in a case where the group has other ring structures, the group is referred to as a polycyclic group regardless of the structures. The lactone-containing cyclic group may be a monocyclic group or a polycyclic group.

The lactone-containing cyclic group for the constitutional unit (a2) is not particularly limited, and any lactone-containing cyclic group may be used. Specific examples thereof include groups each represented by General Formulae (a2-r-1) to (a2-r-7) shown below.

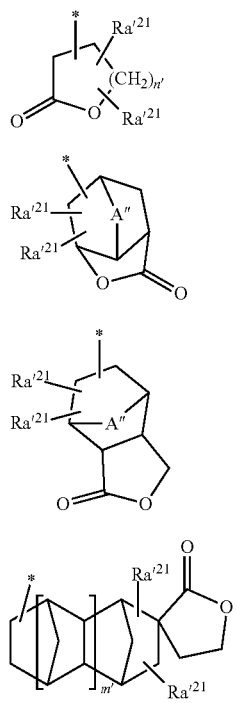

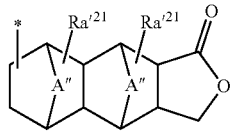

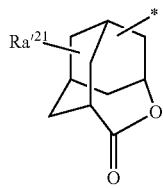

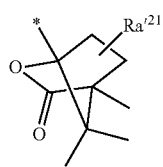

[In the formulae, each Ra'$^{21}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or a —SO$_2$—-containing cyclic group; A" represents an oxygen atom, a sulfur atom, or an alkylene group having 1 to 5 carbon atoms, which may contain an oxygen atom (—O—) or a sulfur atom (—S—); and n' represents an integer in a range of 0 to 2, and m' is 0 or 1.]

In General Formulae (a2-r-1) to (a2-r-7), the alkyl group as Ra'$^{21}$ is preferably an alkyl group having 1 to 6 carbon atoms. The alkyl group is preferably a linear alkyl group or a branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Among these, a methyl group or ethyl group is preferable, and a methyl group is particularly preferable.

The alkoxy group as Ra'$^{21}$ is preferably an alkoxy group having 1 to 6 carbon atoms. Further, the alkoxy group is preferably a linear or branched alkoxy group. Specific examples of the alkoxy groups include a group that is formed by linking the above-described alkyl group mentioned as the alkyl group represented by Ra'$^{21}$ to an oxygen atom (—O—).

The halogen atom as Ra'$^{21}$ is preferably a fluorine atom.

Examples of the halogenated alkyl group as Ra'$^{21}$ include groups in which part or all of hydrogen atoms in the above-described alkyl group as Ra'$^{21}$ have been substituted with the above-described halogen atoms. The halogenated alkyl group is preferably a fluorinated alkyl group and particularly preferably a perfluoroalkyl group.

In —COOR" and —OC(=O)R" as Ra'$^{21}$, R" represents a hydrogen atom, an alkyl group, a lactone-containing cyclic group, a carbonate-containing cyclic group, or a —SO$_2$—-containing cyclic group.

The alkyl group as R" may be linear, branched, or cyclic, and preferably has 1 to carbon atoms.

In a case where R" represents a linear or branched alkyl group, it is preferably an alkyl group having 1 to 10 carbon atoms, more preferably an alkyl group having 1 to 5 carbon atoms, and particularly preferably a methyl group or an ethyl group.

In a case where R" represents a cyclic alkyl group, the cyclic alkyl group preferably has 3 to 15 carbon atoms, more preferably 4 to 12 carbon atoms, and particularly preferably 5 to 10 carbon atoms. Specific examples thereof include a group in which one or more hydrogen atoms have been removed from a monocycloalkane, which may or may not be substituted with a fluorine atom or a fluorinated alkyl group; and a group in which one or more hydrogen atoms have been removed from a polycycloalkane such as bicycloalkane, tricycloalkane, or tetracycloalkane. More specific examples thereof include a group in which one or more hydrogen atoms have been removed from a monocycloalkane such as cyclopentane or cyclohexane; and a group in which one or more hydrogen atoms have been removed from a polycycloalkane such as adamantane, norbornane, isobornane, tricyclodecane, or tetracyclododecane.

Examples of the lactone-containing cyclic group as R" include the same groups as those each represented by General Formulae (a2-r-1) to (a2-r-7).

The carbonate-containing cyclic group as R" has the same definition as that for the carbonate-containing cyclic group described below. Specific examples of the carbonate-containing cyclic group include groups each represented by General Formulae (ax3-r-1) to (ax3-r-3).

The —SO$_2$—-containing cyclic group as R" has the same definition as that for the —SO$_2$—-containing cyclic group described below. Specific examples thereof include groups each represented by General Formulae (a5-r-1) to (a5-r-4).

The hydroxyalkyl group as Ra'$^{21}$ preferably has 1 to 6 carbon atoms, and specific examples thereof include a group in which at least one hydrogen atom in the alkyl group as Ra'$^{21}$ has been substituted with a hydroxyl group.

In General Formulae (a2-r-2), (a2-r-3) and (a2-r-5), as the alkylene group having 1 to 5 carbon atoms as A", a linear or branched alkylene group is preferable, and examples thereof include a methylene group, an ethylene group, an n-propylene group, and an isopropylene group. Specific examples of the alkylene groups that contain an oxygen atom or a sulfur atom include groups in which —O— or —S— is interposed in the terminal of the alkylene group or between the carbon atoms of the alkylene group, and examples thereof include —O—CH$_2$—, —CH$_2$—O—CH$_2$—, —S—CH$_2$—, and —CH$_2$—S—CH$_2$—. A" is preferably an alkylene group having 1 to 5 carbon atoms or —O—, more preferably an alkylene group having 1 to 5 carbon atoms, and most preferably a methylene group.

Specific examples of the groups each represented by General Formulae (a2-r-1) to (a2-r-7) are shown below.

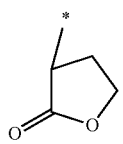

(r-lc-1-1)

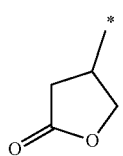

(r-lc-1-2)

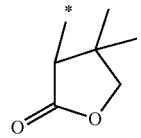

(r-lc-1-3)

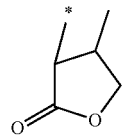

(r-lc-1-4)

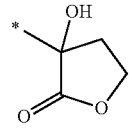

(r-lc-1-5)

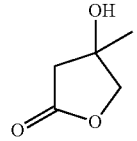

(r-lc-1-6)

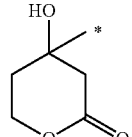

(r-lc-1-7)

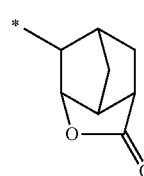

(r-lc-2-1)

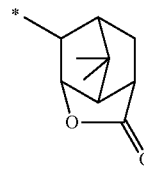

(r-lc-2-2)

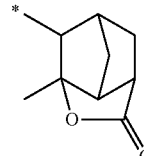

(r-lc-2-3)

(r-lc-2-4)

(r-lc-2-5)
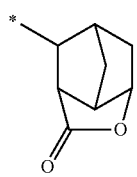
(r-lc-2-6)
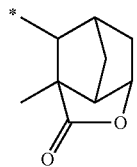
(r-lc-2-7)
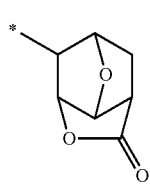
(r-lc-2-8)
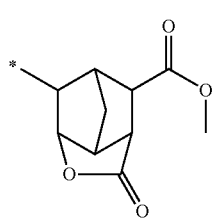
(r-lc-2-9)
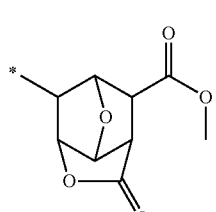
(r-lc-2-10)
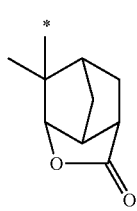
(r-lc-2-11)
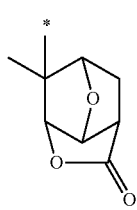
(r-lc-2-12)
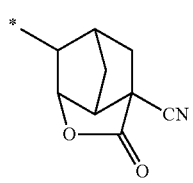
(r-lc-2-13)
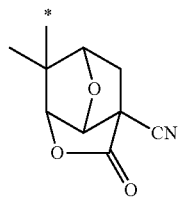
(r-lc-2-14)
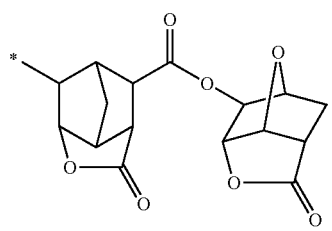
(r-lc-2-15)
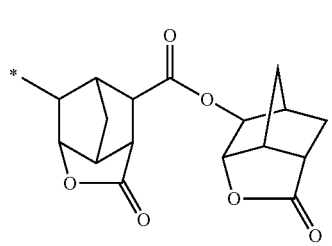
(r-lc-2-16)
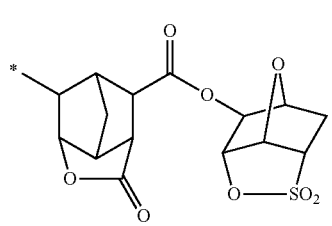
(r-lc-2-17)
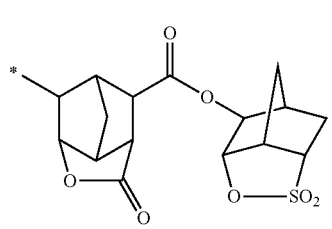
(r-lc-2-18)
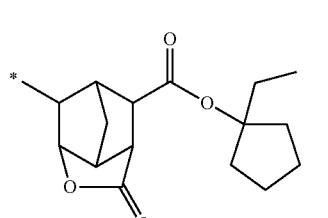
(r-lc-3-1)
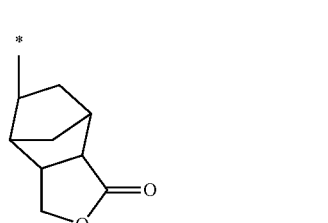

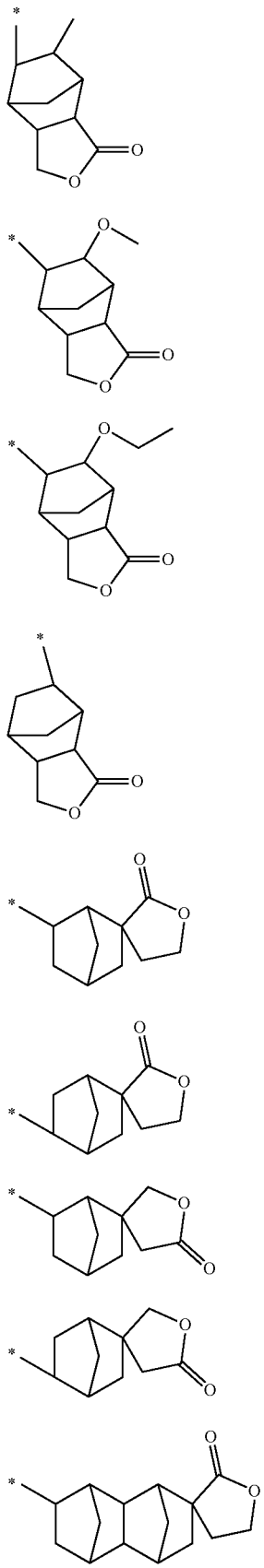
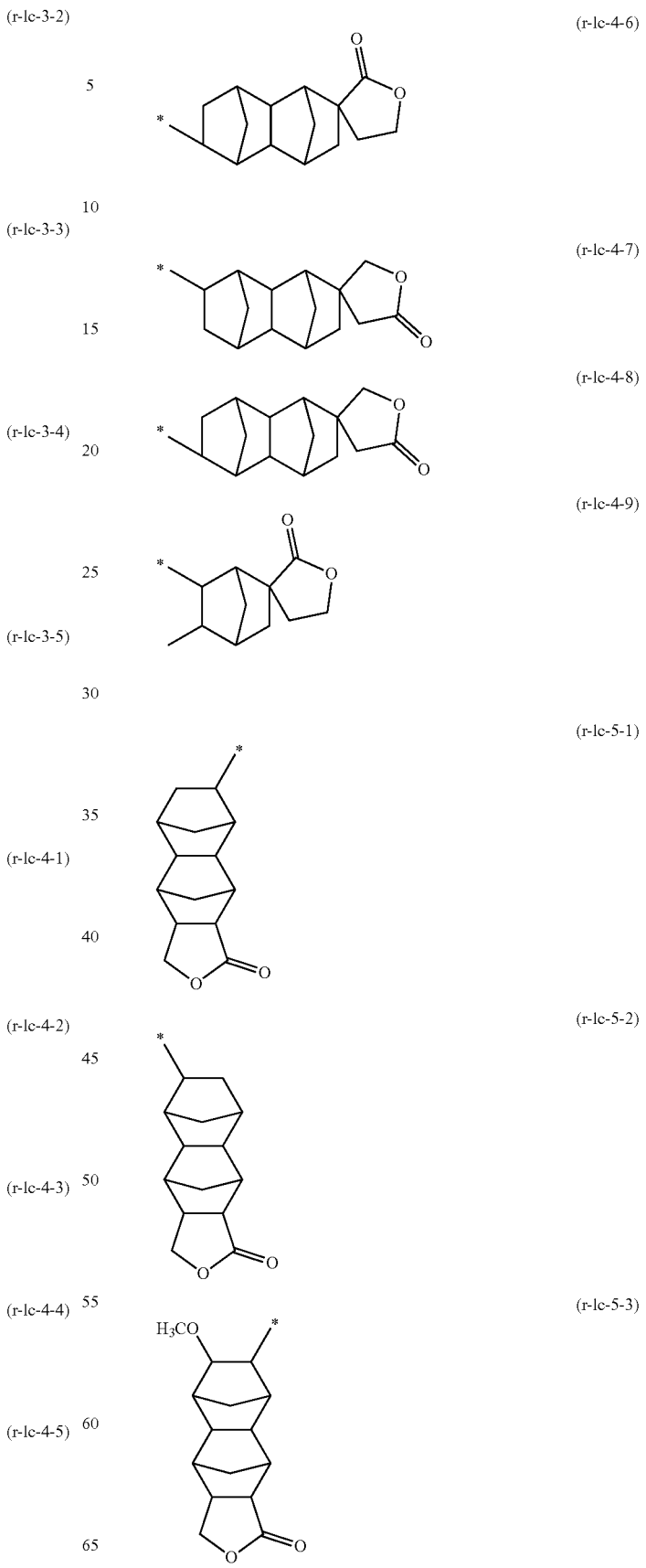

(r-lc-5-4)

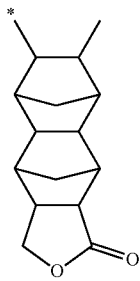

(r-lc-6-1)

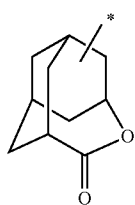

(r-lc-7-1)

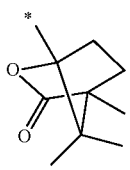

The "—SO$_2$—-containing cyclic group" indicates a cyclic group having a ring containing —SO$_2$— in the ring skeleton thereof. Specifically, the —SO$_2$—-containing cyclic group is a cyclic group in which the sulfur atom (S) in —SO$_2$— forms a part of the ring skeleton of the cyclic group. In a case where the ring containing —SO$_2$— in the ring skeleton thereof is counted as the first ring and the group contains only the ring, the group is referred to as a monocyclic group. Further, in a case where the group has other ring structures, the group is referred to as a polycyclic group regardless of the structures. The —SO$_2$—-containing cyclic group may be a monocyclic group or a polycyclic group. As the —SO$_2$—-containing cyclic group, a cyclic group containing —O—SO$_2$— in the ring skeleton thereof, in other words, a cyclic group containing a sultone ring in which —O—S— in the —O—SO$_2$— group forms a part of the ring skeleton thereof is particularly preferable.

More specific examples of the —SO$_2$—-containing cyclic group include groups each represented by General Formulae (a5-r-1) to (a5-r-4) shown below.

(a5-r-1)

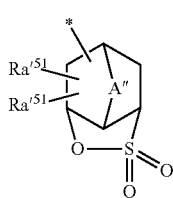

(a5-r-2)

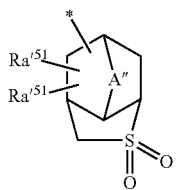

(a5-r-3)

(a5-r-4)

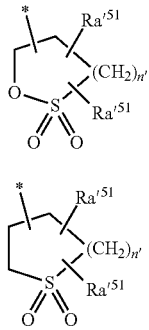

[In the formulae, each Ra'$^{51}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or a —SO$_2$—-containing cyclic group; A" represents an oxygen atom, a sulfur atom, or an alkylene group having 1 to 5 carbon atoms, which may contain an oxygen atom or a sulfur atom; and n' represents an integer in a range of 0 to 2.]

In General Formulae (a5-r-1) and (a5-r-2), A" has the same definition as that for A" in General Formulae (a2-r-2), (a2-r-3) and (a2-r-5).

Examples of the alkyl group, the alkoxy group, the halogen atom, the halogenated alkyl group, —COOR", —OC(=O)R", and the hydroxyalkyl group, as Ra'$^{51}$, include the same groups as those described in the explanation of Ra'$^{21}$ in General Formulae (a2-r-1) to (a2-r-7).

Specific examples of the groups each represented by General Formulae (a5-r-1) to (a5-r-4) are shown below. In the formulae shown below, "Ac" represents an acetyl group.

(r-s1-1-1)

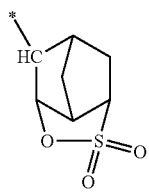

(r-s1-1-2)

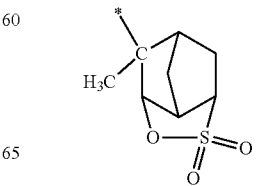

(r-s1-1-3)
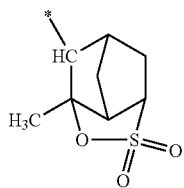
(r-s1-1-4)
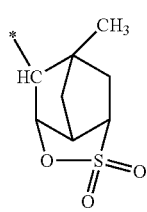
(r-s1-1-5)
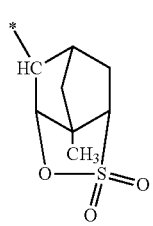
(r-s1-1-6)
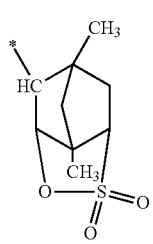
(r-s1-1-7)
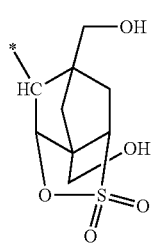
(r-s1-1-8)
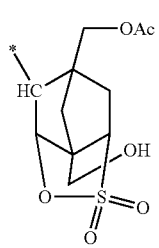
(r-s1-1-9)
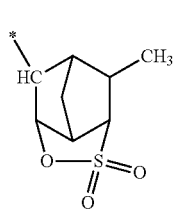
(r-s1-1-10)
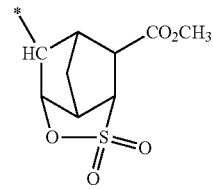
(r-s1-1-11)
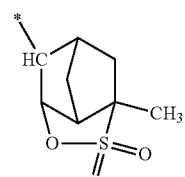
(r-s1-1-12)
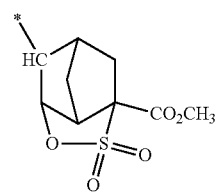
(r-s1-1-13)
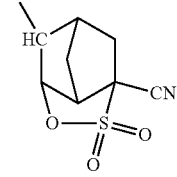
(r-s1-1-14)
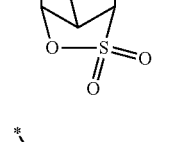
(r-s1-1-15)
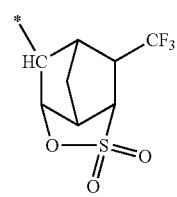
(r-s1-1-16)
(r-s1-1-17)
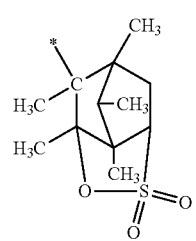

(r-s1-1-18) 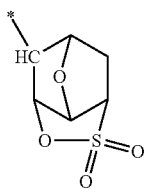
(r-s1-1-19) 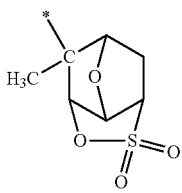
(r-s1-1-20) 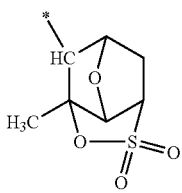
(r-s1-1-21) 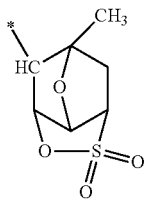
(r-s1-1-22) 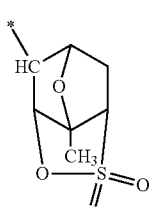
(r-s1-1-23) 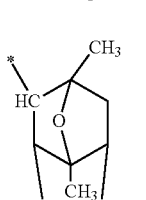
(r-s1-1-24) 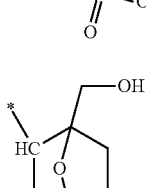
(r-s1-1-25) 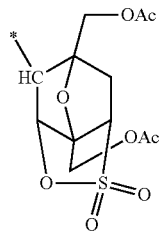
(r-s1-1-26) 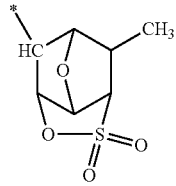
(r-s1-1-27) 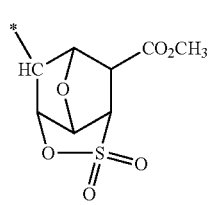
(r-s1-1-28) 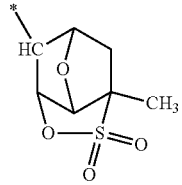
(r-s1-1-29) 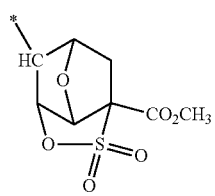
(r-s1-1-30) 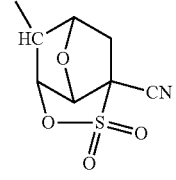
(r-s1-1-31) 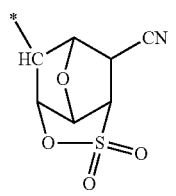

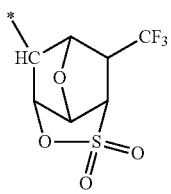
(r-s1-1-32)

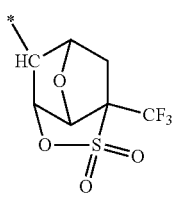
(r-s1-1-33)

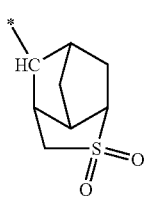
(r-s1-2-1)

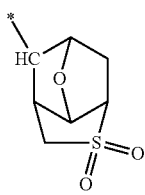
(r-s1-2-2)

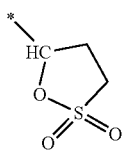
(r-s1-3-1)

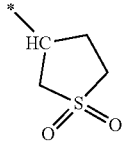
(r-s1-4-1)

The "carbonate-containing cyclic group" indicates a cyclic group having a ring (a carbonate ring) containing —O—C(=O)—O— in the ring skeleton thereof. In a case where the carbonate ring is counted as the first ring and the group contains only the carbonate ring, the group is referred to as a monocyclic group. Further, in a case where the group has other ring structures, the group is referred to as a polycyclic group regardless of the structures. The carbonate-containing cyclic group may be a monocyclic group or a polycyclic group.

The carbonate ring-containing cyclic group is not particularly limited, and any carbonate ring-containing cyclic group may be used. Specific examples thereof include groups each represented by General Formulae (ax3-r-1) to (ax3-r-3) shown below.

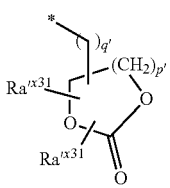
(ax3-r-1)

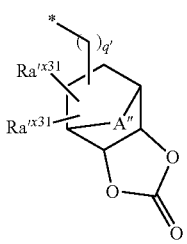
(ax3-r-2)

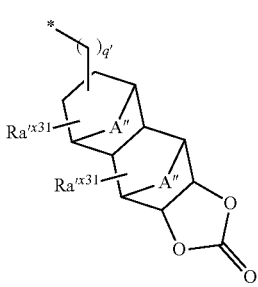
(ax3-r-3)

[In the formulae, each $Ra'^{x31}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or a —SO$_2$—-containing cyclic group; A" represents an oxygen atom, a sulfur atom, or an alkylene group having 1 to 5 carbon atoms, which may contain an oxygen atom or a sulfur atom; and p' represents an integer in a range of 0 to 3, and q' is 0 or 1.]

In General Formulae (ax3-r-2) and (ax3-r-3), A" has the same definition as that for A" in General Formulae (a2-r-2), (a2-r-3) and (a2-r-5).

Examples of the alkyl group, the alkoxy group, the halogen atom, the halogenated alkyl group, —COOR", —OC(=O)R", and the hydroxy alkyl group, as $Ra'^{31}$, include the same groups as those described in the explanation $Ra'^{21}$ in General Formulae (a2-r-1) to (a2-r-7).

Specific examples of the groups each represented by General Formulae (ax3-r-1) to (ax3-r-3) are shown below.

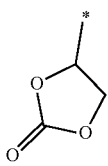
(r-cr-1-1)

-continued
(r-cr-1-2)
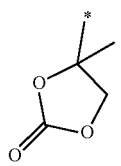
(r-cr-1-3)
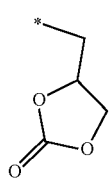
(r-cr-1-4)
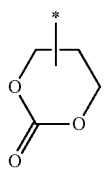
(r-cr-1-5)
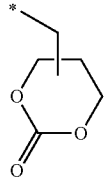
(r-cr-1-6)
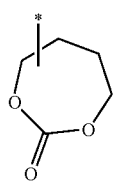
(r-cr-1-7)
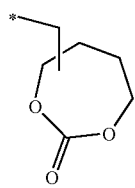
(r-cr-2-1)
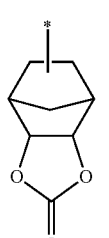
(r-cr-2-2)
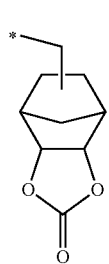
-continued
(r-cr-2-3)
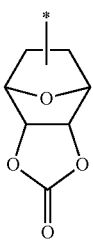
(r-cr-2-4)
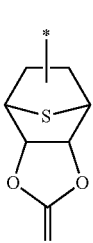
(r-cr-3-1)
(r-cr-3-2)
(r-cr-3-4)

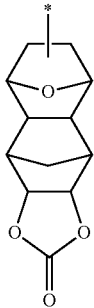
(r-cr-3-4)

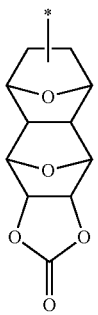
(r-cr-3-5)

Among them, the constitutional unit (a2) is preferably a constitutional unit derived from acrylic acid ester in which the hydrogen atom bonded to the carbon atom at the α-position may be substituted with a substituent.

The constitutional unit (a2) is preferably a constitutional unit represented by General Formula (a2-1).

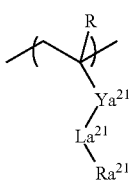
(a2-1)

[In the formula, R represents a hydrogen atom, an alkyl group having 1 to 5 carbon atoms, or a halogenated alkyl group having 1 to 5 carbon atoms. $Ya^{21}$ represents a single bond or a divalent linking group. $La^{21}$ represents —O—, —COO—, —CON(R')—, —OCO—, —CONHCO— or —CONHCS—, and R' represents a hydrogen atom or a methyl group. However, in a case where $La^{21}$ represents —O—, $Ya^{21}$ does not represent —CO—. $Ra^{21}$ represents a lactone-containing cyclic group, a carbonate-containing cyclic group, or a —$SO_2$—-containing cyclic group.]

In General Formula (a2-1), R has the same definition as described above. As R, a hydrogen atom, an alkyl group having 1 to 5 carbon atoms, or a fluorinated alkyl group having 1 to 5 carbon atoms is preferable, and a hydrogen atom or a methyl group is particularly preferable in terms of industrial availability.

In General Formula (a2-1), the divalent linking group as $Ya^{21}$ is not particularly limited, and suitable examples thereof include a divalent hydrocarbon group which may have a substituent and a divalent linking group having a hetero atom.

Divalent Hydrocarbon Group which May have Substituent:

In a case where $Ya^{21}$ represents a divalent hydrocarbon group which may have a substituent, the hydrocarbon group may be an aliphatic hydrocarbon group or an aromatic hydrocarbon group.

Aliphatic Hydrocarbon Group as $Ya^{21}$

The aliphatic hydrocarbon group indicates a hydrocarbon group that has no aromaticity. The aliphatic hydrocarbon group may be saturated or unsaturated. In general, it is preferable that the aliphatic hydrocarbon group be saturated.

Examples of the aliphatic hydrocarbon group include a linear or branched aliphatic hydrocarbon group, and an aliphatic hydrocarbon group containing a ring in the structure thereof.

Linear or Branched Aliphatic Hydrocarbon Group

The linear aliphatic hydrocarbon group described above preferably has 1 to 10 carbon atoms, more preferably 1 to 6 carbon atoms, still more preferably 1 to 4 carbon atoms, and most preferably 1 to 3 carbon atoms.

The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group described above preferably has 2 to carbon atoms, more preferably 3 to 6 carbon atoms, still more preferably 3 or 4 carbon atoms, and most preferably 3 carbon atoms.

The branched aliphatic hydrocarbon group is preferably a branched alkylene group, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$>, —$C(CH_3)(CH_2CH_2CH_3)$>, and —$C(CH_2CH_3)_2$—; alkylethylene groups such as —$CH(CH_3)CH_2$—, —$CH(CH_3)CH(CH_3)$>, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. The alkyl group in the alkylalkylene group is preferably a linear alkyl group having 1 to 5 carbon atoms.

The linear or branched aliphatic hydrocarbon group may a substituent or may not have a substituent. Examples of the substituent include a fluorine atom, a fluorinated alkyl group having 1 to 5 carbon atoms, which has been substituted with a fluorine atom, and a carbonyl group.

Aliphatic Hydrocarbon Group Containing Ring in Structure Thereof

Examples of the aliphatic hydrocarbon group containing a ring in the structure thereof include a cyclic aliphatic hydrocarbon group which may have a substituent containing a hetero atom in the ring structure thereof (a group in which two hydrogen atoms have been removed from an aliphatic hydrocarbon ring), a group in which the cyclic aliphatic hydrocarbon group is bonded to the terminal of a linear or branched aliphatic hydrocarbon group, and a group in which the cyclic aliphatic hydrocarbon group is interposed in a linear or branched aliphatic hydrocarbon group. Examples of the linear or branched aliphatic hydrocarbon group include the same groups as those described above.

The cyclic aliphatic hydrocarbon group preferably has 3 to 20 carbon atoms and more preferably 3 to 12 carbon atoms.

The cyclic aliphatic hydrocarbon group may be a polycyclic group or a monocyclic group. The monocyclic alicyclic hydrocarbon group is preferably a group in which two hydrogen atoms have been removed from a monocycloalkane. The monocycloalkane preferably has 3 to 6 carbon atoms, and specific examples thereof include cyclopentane and cyclohexane. The polycyclic alicyclic hydrocarbon group is preferably a group in which two hydrogen atoms have been removed from a polycycloalkane, and the polycycloalkane is preferably a group having 7 to 12 carbon atoms. Specific examples of the polycycloalkane include adamantane, norbornane, isobornane, tricyclodecane, and tetracyclododecane.

The cyclic aliphatic hydrocarbon group may have or may not have a substituent. Examples of the substituent include an alkyl group, an alkoxy group, a halogen atom, a halogenated alkyl group, a hydroxyl group, and a carbonyl group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and still more preferably a methoxy group or an ethoxy group.

The halogen atom as the substituent is preferably a fluorine atom.

Examples of the halogenated alkyl group as the substituent include groups in which part or all of hydrogen atoms in the above-described alkyl groups have been substituted with the above-described halogen atoms.

In the cyclic aliphatic hydrocarbon group, a part of carbon atoms constituting the ring structure thereof may be substituted with a substituent containing a hetero atom. The substituent containing a hetero atom is preferably —O—, —C(=O)—O—, —S—, —S(=O)$_2$—, or —S(=O)$_2$—O—.

Aromatic Hydrocarbon Group as $Ya^{21}$

The aromatic hydrocarbon group is a hydrocarbon group having at least one aromatic ring.

The aromatic ring is not particularly limited as long as it is a cyclic conjugated system having (4n+2) π electrons, and may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms. Here, the number of carbon atoms in a substituent is not included in the number of carbon atoms.

Specific examples of the aromatic ring include aromatic hydrocarbon rings such as benzene, naphthalene, anthracene, and phenanthrene; and an aromatic heterocyclic ring in which a part of carbon atoms constituting the above-described aromatic hydrocarbon ring have been substituted with a hetero atom. Examples of the hetero atom in the aromatic heterocyclic rings include an oxygen atom, a sulfur atom, and a nitrogen atom. Specific examples of the aromatic heterocyclic ring include a pyridine ring and a thiophene ring.

Specific examples of the aromatic hydrocarbon group include a group in which two hydrogen atoms have been removed from the above-described aromatic hydrocarbon ring or aromatic heterocyclic ring (an arylene group or a heteroarylene group); a group in which two hydrogen atoms have been removed from an aromatic compound having two or more aromatic rings (for example, biphenyl or fluorene); and a group in which one hydrogen atom of a group (an aryl group or a heteroaryl group) obtained by removing one hydrogen atom from the above-described aromatic hydrocarbon ring or aromatic heterocyclic ring has been substituted with an alkylene group (for example, a group in which one hydrogen atom further has been removed from an aryl group in arylalkyl groups such as a benzyl group, a phenethyl group, a 1-naphthylmethyl group, a 2-naphthylmethyl group, a 1-naphthylethyl group, or a 2-naphthylethyl group). The alkylene group bonded to the aryl group or the heteroaryl group preferably has 1 to 4 carbon atoms, more preferably 1 or 2 carbon atoms, and particularly preferably 1 carbon atoms.

With respect to the aromatic hydrocarbon group, the hydrogen atom which the aromatic hydrocarbon group has may be substituted with a substituent. For example, the hydrogen atom bonded to the aromatic ring in the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group having 1 to 5 carbon atoms, and a methyl group, an ethyl group, a propyl group, an n-butyl group, or a tert-butyl group is most preferable.

Examples of the alkoxy group, the halogen atom, and the halogenated alkyl group, as the substituent, include the same groups as those exemplified as the substituent that is substituted for a hydrogen atom which the cyclic aliphatic hydrocarbon group has.

Divalent Linking Group Containing Hetero Atom

In a case where $Ya^{21}$ represents a divalent linking group containing a hetero atom, preferred examples of the linking group include —O—, —C(=O)—O—, —O—C(=O)—, —C(=O)—, —O—C(=O)—O—, —C(=O)—NH—, —NH—, —NH—C(=NH)— (H may be substituted with a substituent such as an alkyl group, an acyl group, or the like), —S—, —S(=O)$_2$—, —S(=O)$_2$—O—, and a group represented by General Formula —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$— or —$Y^{21}$—S(=O)$_2$—O—$Y^{22}$— [in the formulae, $Y^{21}$ and $Y^{22}$ each independently represent a divalent hydrocarbon group which may have a substituent, O represents an oxygen atom, and m" represents an integer in a range of 0 to 3].

In a case where the divalent linking group containing a hetero atom is —C(=O)—NH—, —C(=O)—NH—C(=O)—, —NH—, or —NH—C(=NH)—, H may be substituted with a substituent such as an alkyl group, an acyl group, or the like. The substituent (an alkyl group, an acyl group, or the like) preferably has 1 to 10 carbon atoms, more preferably 1 to 8 carbon atoms, and most preferably 1 to 5 carbon atoms.

In General Formulae —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$—, and —$Y^{21}$—S(=O)$_2$—O—$Y^{22}$—, $Y^{21}$, and $Y^{22}$ each independently represent a divalent hydrocarbon group which may have a substituent. Examples of the divalent hydrocarbon group include the same groups as those (described as the divalent hydrocarbon group which may have a substituent) described in the explanation of the above-described divalent linking group as $Ya^{21}$.

$Y^{21}$ is preferably a linear aliphatic hydrocarbon group, more preferably a linear alkylene group, still more preferably a linear alkylene group having 1 to 5 carbon atoms, and particularly preferably a methylene group or an ethylene group.

$Y^{22}$ is preferably a linear or branched aliphatic hydrocarbon group and more preferably a methylene group, an ethylene group, or an alkylmethylene group. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula —$[Y^{21}$—$C(=O)$—$O]_{m''}$—$Y^{22}$—, m'' represents an integer in a range of 0 to 3, preferably an integer in a range of 0 to 2, more preferably 0 or 1, and particularly preferably 1. In other words, it is particularly preferable that the group represented by Formula —$[Y^{21}$—$C(=O)$—$O]_{m''}$—$Y^{22}$— represent a group represented by Formula —$Y^{21}$—$C(=O)$—$O$—$Y^{22}$—. Among these, a group represented by Formula —$(CH_2)_{a'}$—$C(=O)$—$O$—$(CH_2)_{b'}$— is preferable. In the formula, a' represents an integer in a range of 1 to 10, preferably an integer in a range of 1 to 8, more preferably an integer in a range of 1 to 5, still more preferably 1 or 2, and most preferably 1. b' represents an integer in a range of 1 to 10, preferably an integer in a range of 1 to 8, more preferably an integer in a range of 1 to 5, still more preferably 1 or 2, and most preferably 1.

Among the above, $Ya^{21}$ is preferably a single bond, an ester bond [—$C(=O)$—$O$—], an ether bond (—$O$—), a linear or branched alkylene group, or a combination thereof.

In General Formula (a2-1), $Ra^{21}$ represents a lactone-containing cyclic group, a —$SO_2$—-containing cyclic group, or a carbonate-containing cyclic group.

Suitable examples of the lactone-containing cyclic group, the —$SO_2$—-containing cyclic group, and the carbonate-containing cyclic group as $Ra^{21}$ include groups each represented by General Formulae (a2-r-1) to (a2-r-7), groups each represented by General Formulae (a5-r-1) to (a5-r-4), and groups each represented by General Formulae (ax3-r-1) to (ax3-r-3) described above.

Among them, a lactone-containing cyclic group or a —$SO_2$—-containing cyclic group is preferable, and groups each represented by General Formula (a2-r-1), (a2-r-2), (a2-r-6), or (a5-r-1) are more preferable. Specifically, groups each represented by any of Chemical Formulae (r-lc-1-1) to (r-lc-1-7), (r-lc-2-1) to (r-lc-2-18), (r-lc-6-1), (r-sl-1-1), and (r-sl-1-18) are more preferable.

The constitutional unit (a2) which the component (A1) has may be one kind or may be two or more kinds.

In a case where the component (A1) has the constitutional unit (a2), the proportion of the constitutional unit (a2) in the component (A1) is preferably in a range of 5% to 60% by mole, more preferably in a range of 10% to 60% by mole, still more preferably in a range of 20% to 55% by mole, and particularly preferably in a range of 30% to 50% by mole with respect to the total amount (100% by mole) of all constitutional units constituting the component (A1).

In a case where the proportion of the constitutional unit (a2) is equal to or greater than the lower limit value of the above-described preferred range, the effect obtained by allowing the component (A1) to contain the constitutional unit (a2) can be sufficiently achieved by the effect described above. In a case where the proportion of the constitutional unit (a2) is equal to or lower than the upper limit value of the above-described preferred range, balance with other constitutional units can be obtained, and various lithography characteristics are improved.

In Regard to Constitutional Unit (a3):

The component (A1) may further have, as necessary, a constitutional unit (a3) (provided that a constitutional unit corresponding to the constitutional unit (a1) or the constitutional unit (a2) is excluded) containing a polar group-containing aliphatic hydrocarbon group, in addition to the constitutional unit (a1). In a case where the component (A1) has the constitutional unit (a3), the hydrophilicity of the component (A) is increased, which contributes to an improvement in resolution. Further, acid diffusion length can be appropriately adjusted.

Examples of the polar group include a hydroxyl group, a cyano group, a carboxy group, or a hydroxyalkyl group in which a part of hydrogen atoms of the alkyl group have been substituted with a fluorine atom, and the polar group is particularly preferably a hydroxyl group.

Examples of the aliphatic hydrocarbon group include a linear or branched hydrocarbon group (preferably an alkylene group) having 1 to 10 carbon atoms, and a cyclic aliphatic hydrocarbon group (a cyclic group). The cyclic group may be a monocyclic group or a polycyclic group. For example, these cyclic groups can be suitably selected from a large number of groups that have been proposed in resins for a resist composition for an ArF excimer laser.

In a case where the cyclic group is a monocyclic group, the monocyclic group preferably has 3 to 10 carbon atoms. Among them, a constitutional unit derived from an acrylic acid ester that includes an aliphatic monocyclic group containing a hydroxyl group, cyano group, carboxy group, or a hydroxyalkyl group in which a part of hydrogen atoms of the alkyl group have been substituted with a fluorine atom are particularly preferable. Examples of the monocyclic group include a group in which two or more hydrogen atoms have been removed from a monocycloalkane. Specific examples of the monocyclic group a include group in which two or more hydrogen atoms have been removed from a monocycloalkane such as cyclopentane, cyclohexane, or cyclooctane. Among these monocyclic groups, a group in which two or more hydrogen atoms have been removed from cyclopentane or a group in which two or more hydrogen atoms have been removed from cyclohexane are industrially preferable.

In a case where the cyclic group is a polycyclic group, the polycyclic group preferably has 7 to 30 carbon atoms. Among them, a constitutional unit derived from an acrylic acid ester that includes an aliphatic polycyclic group containing a hydroxyl group, cyano group, carboxy group, or a hydroxyalkyl group in which a part of hydrogen atoms of the alkyl group have been substituted with a fluorine atom is particularly preferable. Examples of the polycyclic group include groups in which two or more hydrogen atoms have been removed from a bicycloalkane, tricycloalkane, tetracycloalkane, or the like. Specific examples thereof include a group in which two or more hydrogen atoms have been removed from a polycycloalkane such as adamantane, norbornane, isobornane, tricyclodecane, or tetracyclododecane. Among these polycyclic groups, a group in which two or more hydrogen atoms have been removed from adamantane, a group in which two or more hydrogen atoms have been removed from norbornane, or a group in which two or more hydrogen atoms have been removed from tetracyclododecane are industrially preferable.

The constitutional unit (a3) is not particularly limited, and any constitutional unit may be used as long as the constitutional unit contains a polar group-containing aliphatic hydrocarbon group.

The constitutional unit (a3) is a constitutional unit derived from acrylic acid ester in which the hydrogen atom bonded to the carbon atom at the α-position may be substituted with a substituent, and a constitutional unit containing a polar group-containing aliphatic hydrocarbon group is preferable.

In a case where the hydrocarbon group in the polar group-containing aliphatic hydrocarbon group is a linear or branched hydrocarbon group having 1 to 10 carbon atoms, the constitutional unit (a3) is preferably a constitutional unit derived from a hydroxyethyl ester of acrylic acid.

Further, as the constitutional unit (a3), in a case where the hydrocarbon group in the polar group-containing aliphatic hydrocarbon group is a polycyclic group, a constitutional unit represented by General Formula (a3-1), a constitutional unit represented by General Formula (a3-2), and a constitutional unit represented by General Formula (a3-3) are preferable, and in a case where the hydrocarbon group is a monocyclic group, a constitutional unit represented by General Formula (a3-4) is preferable.

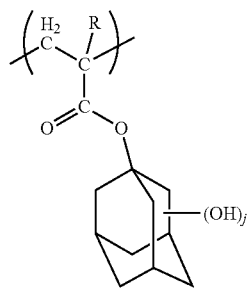

(a3-1)

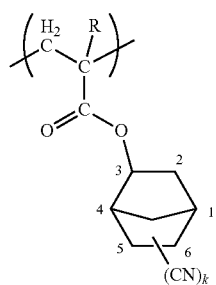

(a3-2)

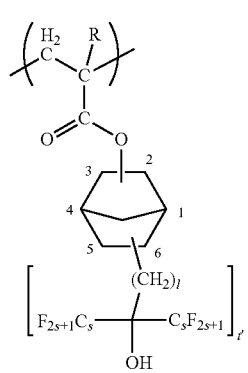

(a3-3)

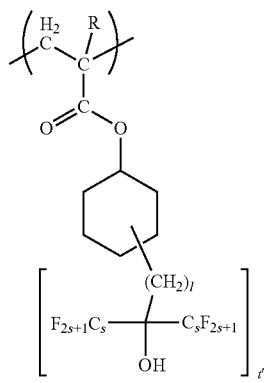

(a3-4)

[In the formulae, R has the same definition as described above, j represents an integer in a range of 1 to 3, k represents an integer in a range of 1 to 3, t' represents an integer in a range of 1 to 3, l represents an integer in a range of 0 to 5, and s represents an integer in a range of 1 to 3.]

In General Formula (a3-1), j preferably represents 1 or 2 and more preferably 1. In a case where j represents 2, it is preferable that the hydroxyl groups be bonded to the 3- and 5-positions of the adamantyl group. In a case where j represents 1, it is preferable that the hydroxyl group be bonded to the 3-position of the adamantyl group.

It is preferable that j represent 1, and it is particularly preferable that the hydroxyl group be bonded to the 3-position of the adamantyl group.

In General Formula (a3-2), k preferably represents 1. The cyano group is preferably bonded to the 5- or 6-position of the norbornyl group.

In General Formula (a3-3), it is preferable that t' represent 1. It is preferable that l represent 1. It is preferable that s represent 1. Further, it is preferable that a 2-norbornyl group or 3-norbornyl group be bonded to the terminal of the carboxy group of the acrylic acid. It is preferable that the fluorinated alkyl alcohol be bonded to the 5- or 6-position of the norbornyl group.

In General Formula (a3-4), it is preferable that t' represent 1 or 2. It is preferable that l represent 0 or 1. It is preferable that s represent 1. It is preferable that the fluorinated alkyl alcohol be bonded to the 3- or 5-position of the cyclohexyl group.

The constitutional unit (a3) which the component (A1) has may be one kind or may be two or more kinds.

In a case where the component (A1) has the constitutional unit (a3), the proportion of the constitutional unit (a3) is preferably in a range of 1% to 30% by mole, more preferably in a range of 2% to 25% by mole, and still more preferably in a range of 5% to 20% by mole, with respect to the total amount (100% by mole) of all constitutional units constituting the component (A1).

In a case where the proportion of the constitutional unit (a3) is equal to or greater than the lower limit value of the above-described preferred range, the effect obtained by allowing the component (A1) to contain the constitutional unit (a3) can be sufficiently achieved by the effect described above. In a case where the proportion of the constitutional unit (a3) is equal to or lower than the upper limit value of the above-described preferred range, balance with other constitutional units can be obtained, and various lithography characteristics are improved.

In Regard to Constitutional Unit (a4):

The component (A1) may further have, in addition to the constitutional unit (a1), a constitutional unit (a4) containing an acid non-dissociable aliphatic cyclic group.

In a case where the component (A1) has the constitutional unit (a4), the dry etching resistance of the formed resist pattern is improved. Further, the hydrophobicity of the component (A) increases. The improvement in hydrophobicity contributes to the improvement in resolution, a resist pattern shape, and the like, particularly in the case of a solvent developing process.

The "acid non-dissociable cyclic group" in the constitutional unit (a4) is a cyclic group that remains in the constitutional unit without being dissociated even when an acid acts in a case where the acid is generated in the resist composition by exposure (for example, in a case where an acid is generated from the constitutional unit or the component (B), which generates an acid upon exposure).

Examples of the constitutional unit (a4) preferably include a constitutional unit derived from an acrylic acid ester including an acid non-dissociable aliphatic cyclic group. As the cyclic group, many cyclic groups conventionally known as cyclic groups used as a resin component of a resist composition for ArF excimer laser, KrF excimer laser (preferably ArF excimer laser), or the like can be used.

The cyclic group is particularly preferably at least one selected from a tricyclodecyl group, an adamantyl group, a tetracyclododecyl group, an isobornyl group, and a norbornyl group, from the viewpoint of industrial availability. These polycyclic groups may have, as a substituent, a linear or branched alkyl group having 1 to 5 carbon atoms.

Specific examples of the constitutional unit (a4) include constitutional units each represented by General Formulae (a4-1) to (a4-7).

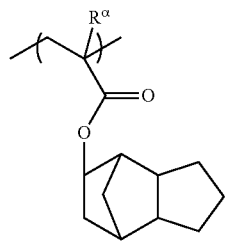
(a4-1)

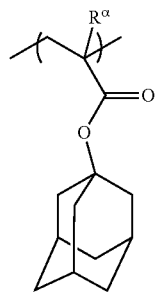
(a4-2)

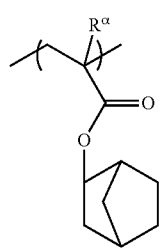
(a4-3)

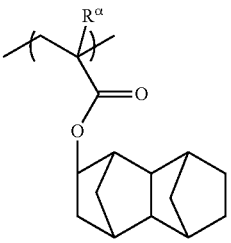
(a4-4)

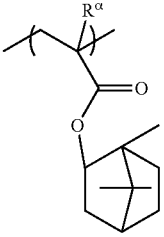
(a4-5)

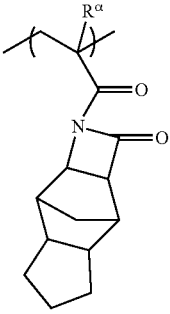
(a4-6)

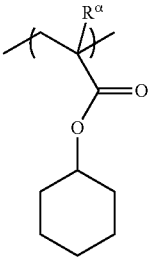
(a4-7)

[In the formula, R" is the same as above.]

The constitutional unit (a4) which the component (A1) has may be one kind or may be two or more kinds.

In a case where the component (A1) has the constitutional unit (a4), the proportion of the constitutional unit (a4) is preferably in a range of 1% to 40% by mole and more preferably in a range of 5% to 20% by mole, with respect to the total (100% by mole) of all constitutional units constituting the component (A1).

In a case where the proportion of the constitutional unit (a4) is equal to or greater than the lower limit value of the preferred range, the effect that is obtained by allowing the component (A1) to contain the constitutional unit (a4) can be sufficiently achieved. In a case where the proportion of the constitutional unit (a4) is equal to or lower than the upper limit value of the preferred range, the balance with other constitutional units is obtained easily.

In Regard to Constitutional Unit (st):

The constitutional unit (st) is a constitutional unit derived from styrene or a styrene derivative. A "constitutional unit derived from styrene" means a constitutional unit that is formed by the cleavage of an ethylenic double bond of styrene. A "constitutional unit derived from a styrene derivative" means a constitutional unit (provided that a constitutional unit corresponding to the constitutional unit (a10) is excluded) formed by the cleavage of an ethylenic double bond of a styrene derivative.

The "styrene derivative" means a compound in which at least a part of hydrogen atoms of styrene are substituted with a substituent. Examples of the styrene derivative include a derivative in which the hydrogen atom at the α-position of styrene is substituted with a substituent, a derivative in which one or more hydrogen atoms of the benzene ring of styrene are substituted with a substituent, and a derivative in which the hydrogen atom at the α-position of styrene and one or more hydrogen atoms of the benzene ring are substituted with a substituent.

Examples of the substituent that is substituted for the hydrogen atom at the α-position of styrene include an alkyl group having 1 to 5 carbon atoms or a halogenated alkyl group having 1 to 5 carbon atoms.

The alkyl group having 1 to 5 carbon atoms is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group.

The halogenated alkyl group having 1 to 5 carbon atoms is a group in which part or all of hydrogen atoms in the alkyl group having 1 to 5 carbon atoms have been substituted with a halogen atom. The halogen atom is particularly preferably a fluorine atom.

The substituent that is substituted for the hydrogen atom at the α-position of styrene is preferably an alkyl group having 1 to 5 carbon atoms or a fluorinated alkyl group having 1 to 5 carbon atoms, more preferably an alkyl group having 1 to 3 carbon atoms or a fluorinated alkyl group having 1 to 3 carbon atoms, and still more preferably a methyl group from the viewpoint of industrial availability.

Examples of the substituent that is substituted for the hydrogen atom of the benzene ring of styrene include an alkyl group, an alkoxy group, a halogen atom, and a halogenated alkyl group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and still more preferably a methoxy group or an ethoxy group.

The halogen atom as the substituent is preferably a fluorine atom.

Examples of the halogenated alkyl group as the substituent include groups in which part or all of hydrogen atoms in the above-described alkyl groups have been substituted with the above-described halogen atoms.

The substituent that is substituted for the hydrogen atom of the benzene ring of styrene is preferably an alkyl group having 1 to 5 carbon atoms, more preferably a methyl group or an ethyl group, and still more preferably a methyl group.

The constitutional unit (st) is preferably a constitutional unit derived from styrene or a constitutional unit derived from a styrene derivative in which the hydrogen atom at the α-position of styrene is substituted with an alkyl group having 1 to 5 carbon atoms or a halogenated alkyl group having 1 to 5 carbon atoms, more preferably a constitutional unit derived from styrene, or a constitutional unit derived from a styrene derivative in which the hydrogen atom at the α-position of styrene is substituted with a methyl group, and still more preferably a constitutional unit derived from styrene.

The constitutional unit (st) which the component (A1) has may be one kind or may be two or more kinds.

In a case where the component (A1) has the constitutional unit (st), the proportion of the constitutional unit (st) is preferably in a range of 1% to 30% by mole and more preferably in a range of 3% to 20% by mole with respect to the total amount (100% by mole) of all constitutional units constituting the component (A1).

The component (A1) contained in the resist composition may be used alone or in a combination of two or more kinds thereof.

In the resist composition according to the present embodiment, examples of the component (A1) include a polymer compound having a repeated structure of the constitutional unit (a1).

Examples of the preferred component (A1) include a polymer compound having a repeated structure of the constitutional unit (a1) and the constitutional unit (a10).

In this case, the proportion of the constitutional unit (a1) in each of the polymer compounds described above is preferably in a range of 5% to 80% by mole, more preferably in a range of 10% to 90% by mole, still more preferably in a range of 30% to 70% by mole, and particularly preferably in a range of 40% to 60% by mole, with respect to the total amount (100% by mole) of all constitutional units constituting the polymer compound.

In addition, the proportion of the constitutional unit (a10) in each of the polymer compounds described above is preferably in a range of 5% to 80% by mole, more preferably in a range of 10% to 90% by mole, still more preferably in a range of 30% to 70% by mole, and particularly preferably in a range of 40% to 60% by mole, with respect to the total amount (100% by mole) of all constitutional units constituting the polymer compound.

The molar ratio of the constitutional unit (a1) to the constitutional unit (a 10) in the polymer compound (the constitutional unit (a1):the constitutional unit (a10)) is preferably in a range of 2:8 to 8:2, more preferably in a range of 3:7 to 7:3, and still more preferably in a range of 4:6 to 6:4.

The component (A1) can be produced by dissolving, in a polymerization solvent, each monomer from which the constitutional unit is derived, adding thereto a radical polymerization initiator such as azobisisobutyronitrile (AIBN) or dimethyl azobisisobutyrate (for example, V-601) to perform polymerization.

Alternatively, the component (A1) can be produced by dissolving, in a polymerization solvent, a monomer from which the constitutional unit (a1) is derived and, as necessary, a monomer from which a constitutional unit other than the constitutional unit (a1) is derived, and adding thereto a radical polymerization initiator such as described above to perform polymerization and then performing a deprotection reaction.

Further, a —$C(CF_3)_2$—OH group may be introduced into the terminal of the component (A1) during the polymerization using a chain transfer agent such as HS—$CH_2$—$CH_2$—$CH_2$—$C(CF_3)_2$—OH in combination. As described above, a copolymer into which a hydroxyalkyl group, formed by substitution of a part of hydrogen atoms in the alkyl group with fluorine atoms, has been introduced is effective for reducing development defects and reducing line edge roughness (LER: uneven irregularities of a line side wall).

The weight-average molecular weight (Mw) (based on the polystyrene-equivalent value determined by gel permeation chromatography (GPC)) of the component (A1), which is not particularly limited, is preferably in a range of 1,000 to 50,000, more preferably in a range of 2,000 to 30,000, and still more preferably in a range of 3,000 to 20,000.

In a case where Mw of the component (A1) is equal to or lower than the upper limit value of this preferred range, the resist composition exhibits sufficient solubility in a solvent for a resist such that the resist composition can be used as a resist. On the other hand, in a case where Mw of the component (A1) is equal to or greater than the lower limit value of this preferred range, dry etching resistance and the cross-sectional shape of the resist pattern become excellent.

Further, the dispersity (Mw/Mn) of the component (A1) is not particularly limited; however, it is preferably in a range of 1.0 to 4.0, more preferably in a range of 1.0 to 3.0, and particularly preferably in a range of 1.0 to 2.0. Mn represents the number-average molecular weight.

In Regard to Component (A2)

In the resist composition according to the present embodiment, a base material component (hereinafter, referred to as a "component (A2)") exhibiting changed solubility in a developing solution under action of acid, which does not correspond to the component (A1), may be used in combination as the component (A).

The component (A2) is not particularly limited and may be freely selected and used from a large number of conventionally known base material components for the chemical amplification-type resist composition.

As the component (A2), a polymer compound or a low-molecular-weight compound may be used alone or in a combination of two or more kinds thereof.

The proportion of the component (A1) in the component (A) is preferably 25% by mass or greater, more preferably 50% by mass or greater, still more preferably 75% by mass or greater, and may be 100% by mass with respect to the total mass of the component (A). In a case where the proportion is 25% by mass or more, a resist pattern having various excellent lithography characteristics such as high sensitivity, resolution, and roughness amelioration can be easily formed.

The content of the component (A) in the resist composition according to the present embodiment may be adjusted depending on the resist film thickness to be formed and the like.

<Acid Generator Component (B)>

The resist composition according to the present embodiment contains an acid generator component (B) (hereinafter, referred to as a "component (B)") generating an acid upon exposure.

The component (B) contains a first acid generator and a second acid generator. The first acid generator is a compound (B1) (hereinafter, also referred to as a "component (B1)") represented by General Formula (b1), and the second acid generator is a compound (B2) (hereinafter, also referred to as a "component (B2)") composed of a cation moiety and an anion moiety having a molar volume of 250 cm$^3$/mol or less.

The molar volume of the anion moiety of the component (B2) is 250 cm$^3$/mol or less, preferably 245 cm$^3$/mol or less, and more preferably 240 cm$^3$/mol or less.

In a case where the molar volume of the anion moiety of the component (B2) is equal to or lower than the above upper limit value, the density of the acid in the resist film can be increased, and thus the resolution and the roughness reduction property can be further improved.

The lower limit value of the molar volume of the anion moiety of the component (B2) is, for example, 80 cm$^3$/mol.

The molar volume of the anion moiety of the component (B1) is not particularly limited as long as it is larger than the molar volume of the anion moiety of the component (B2), and it is preferably 260 cm$^3$/mol or more, more preferably 265 cm$^3$/mol or more, and still more preferably 270 cm$^3$/mol or more.

In a case where the molar volume of the anion moiety of the component (B1) is equal to or greater than the above lower limit value, the acid diffusivity in the resist film is suitably controlled, and thus the roughness reduction property can be further improved.

The upper limit value of the molar volume of the anion moiety of the component (B1) is, for example, 500 cm$^3$/mol.

In the present specification, the molar volume means a value calculated based on the database registration value and the estimated value of HSPiP 4th Edition version 4.0.04.

The difference (the molar volume of the anion moiety of the (B1) component—the molar volume of the anion moiety of the (B2) component) between the molar volume of the anion moiety of the component (B1) and the molar volume of the anion moiety of the (B2) component is preferably in a range of 20 to 300, more preferably in a range of 30 to 250, and still more preferably in a range of 40 to 230.

<<First Acid Generator>>

The first acid generator is a compound (B1) (hereinafter, also referred to as a "component (B1)") represented by General Formula (b1), and the molar volume of the anion moiety of the component (B1) described later is larger than the molar volume of the anion moiety of the compound (B2).

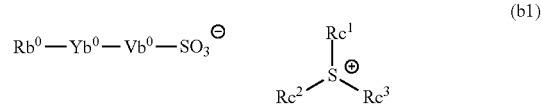

(b1)

[In the formula, Rb$^0$ represents a condensed cyclic group containing a condensed ring having at least one aromatic ring. Yb$^0$ represents a divalent linking group or a single bond. Vb$^0$ represents a single bond, an alkylene group, or a fluorinated alkylene group.

Rc$^1$ represents an aryl group having an electron-withdrawing group. Rc$^2$ and Rc$^3$ each independently represents an aryl group which may have a substituent or are bonded to each other to form a ring together with a sulfur atom in the formula.]

{Anion Moiety of Component (B1)}

In General Formula (b1), Rb$^0$ represents a condensed cyclic group containing a condensed ring having at least one aromatic ring. Specific examples of the aromatic ring include aromatic hydrocarbon rings such as benzene, naphthalene, anthracene, and phenanthrene; and an aromatic heterocyclic ring in which a part of carbon atoms constituting the above-described aromatic hydrocarbon rings have been substituted with a hetero atom. Examples of the hetero atom in the aromatic heterocyclic rings include an oxygen atom, a sulfur atom, and a nitrogen atom. Specific examples of the aromatic heterocyclic ring include a pyridine ring and a thiophene ring.

The condensed cyclic group as Rb$^0$ may a polycyclic aromatic cyclic group in which a plurality of aromatic rings are condensed with each other or may be an aromatic ring-aliphatic hydrocarbon ring condensed cyclic group in which the above aromatic ring and aliphatic hydrocarbon ring are condensed.

Specific examples of the polycyclic aromatic cyclic group include naphthalene, anthracene, phenanthrene, biphenyl, and an aromatic heterocyclic ring in which a part of carbon atoms constituting these aromatic rings are substituted with a hetero atom. Examples of the hetero atom in the aromatic heterocyclic rings include an oxygen atom, a sulfur atom, and a nitrogen atom.

Specific examples of the polycyclic aromatic cyclic group as $Rb^0$ include a group in which one hydrogen atom has been removed from the above-described aromatic ring (an aryl group; for example a naphthyl group) and a group in which one hydrogen atom in the aromatic ring has been substituted with an alkylene group (for example, an arylalkyl group such as a phenethyl group, a 1-naphthylmethyl group, a 2-naphthylmethyl group, 1-naphthylethyl group, or a 2-naphthylethyl group). The alkylene group (an alkyl chain in the arylalkyl group) preferably has 1 to 4 carbon atoms, more preferably 1 or 2 carbon atoms, and particularly preferably 1 carbon atom.

The polycyclic aromatic cyclic group as $Rb^0$ may have a substituent. Examples of the above substituent include an alkyl group, an alkoxy group, a halogen atom, a halogenated alkyl group, a hydroxyl group, a nitro group, and a carbonyl group as a substituent.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

The halogen atom as the substituent is preferably a fluorine atom.

Examples of the above-described halogenated alkyl group as the substituent include a group in which part or all of hydrogen atoms in an alkyl group having 1 to 5 carbon atoms such as a methyl group, an ethyl group, a propyl group, an n-butyl group, or a tert-butyl group have been substituted with the above-described halogen atom.

The carbonyl group as the substituent is a group that substitutes a methylene group (—CH$_2$—) constituting the cyclic hydrocarbon group.

Examples of the aromatic ring-aliphatic hydrocarbon ring condensed cyclic group as $Rb^0$ include fluorene; and a group in which one or more aromatic rings are condensed with a polycycloalkane having a bridged ring-based polycyclic skeleton. Specific examples of the bridged ring-based poly cycloalkane include bicycloalkanes such as bicyclo[2.2.1]heptane (norbornane) and bicyclo[2.2.2]octane.

The aromatic ring-aliphatic hydrocarbon ring condensed cyclic group is preferably a group containing a condensed ring, in which two or three aromatic rings are condensed with a bicycloalkane, and more preferably a group containing a condensed ring, in which two or three aromatic rings are condensed with bicyclo[2.2.2]octane. Specific examples of the condensed cyclic group as $Rb^0$ include groups represented by General Formulae (r-br-1) and (r-br-2). In the formulae, * represents a bonding site that is bonded to $Yb^0$ in General Formula (b1).

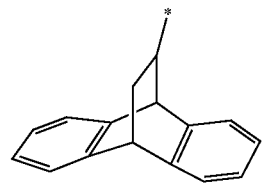

(r-br-1)

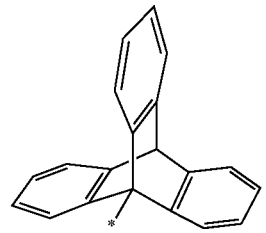

(r-br-2)

Examples of the substituent which the condensed cyclic group as $Rb^0$ may have include an alkyl group, an alkoxy group, a halogen atom, a halogenated alkyl group, a hydroxyl group, a carbonyl group, a nitro group, an aromatic hydrocarbon group, and an alicyclic hydrocarbon group.

Examples of the alkyl group, the alkoxy group, the halogen atom, and the halogenated alkyl group, as the substituent of the condensed cyclic group, include the same groups as those described as the substituent of the polycyclic aromatic cyclic group as $Rb^0$.

Examples of the aromatic hydrocarbon group as the substituent of the condensed cyclic group include a group in which one hydrogen atom has been removed from the above-described aromatic ring (an aryl group; for example, a phenyl group or a naphthyl group), a group in which one hydrogen atom in the aromatic ring has been substituted with an alkylene group (for example, an arylalkyl group such as a benzyl group, a phenethyl group, a 1-naphthylmethyl group, a 2-naphthylmethyl group, 1-naphthylethyl group, or a 2-naphthylethyl group), and heterocyclic groups each represented by General Formulae (r-hr-1) to (r-hr-6).

Examples of the alicyclic hydrocarbon group as the substituent of the condensed cyclic group include a group in which one hydrogen atom has been removed from a monocycloalkane such as cyclopentane or cyclohexane; a group in which one hydrogen atom has been removed from a polycycloalkane such as adamantane, norbornane, isobornane, tricyclodecane, or tetracyclododecane; lactone-containing cyclic groups each represented by General Formulae (a2-r-1) to (a2-r-7); —SO$_2$—-containing cyclic groups each represented by General Formulae (a5-r-1) to (a5-r-4); and heterocyclic groups each represented by General Formulae (r-hr-7) to (r-hr-16).

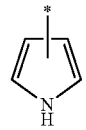

(r-hr-1)

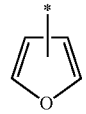

(r-hr-2)

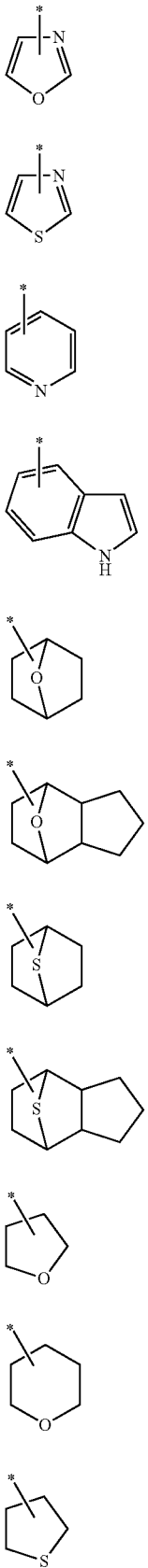
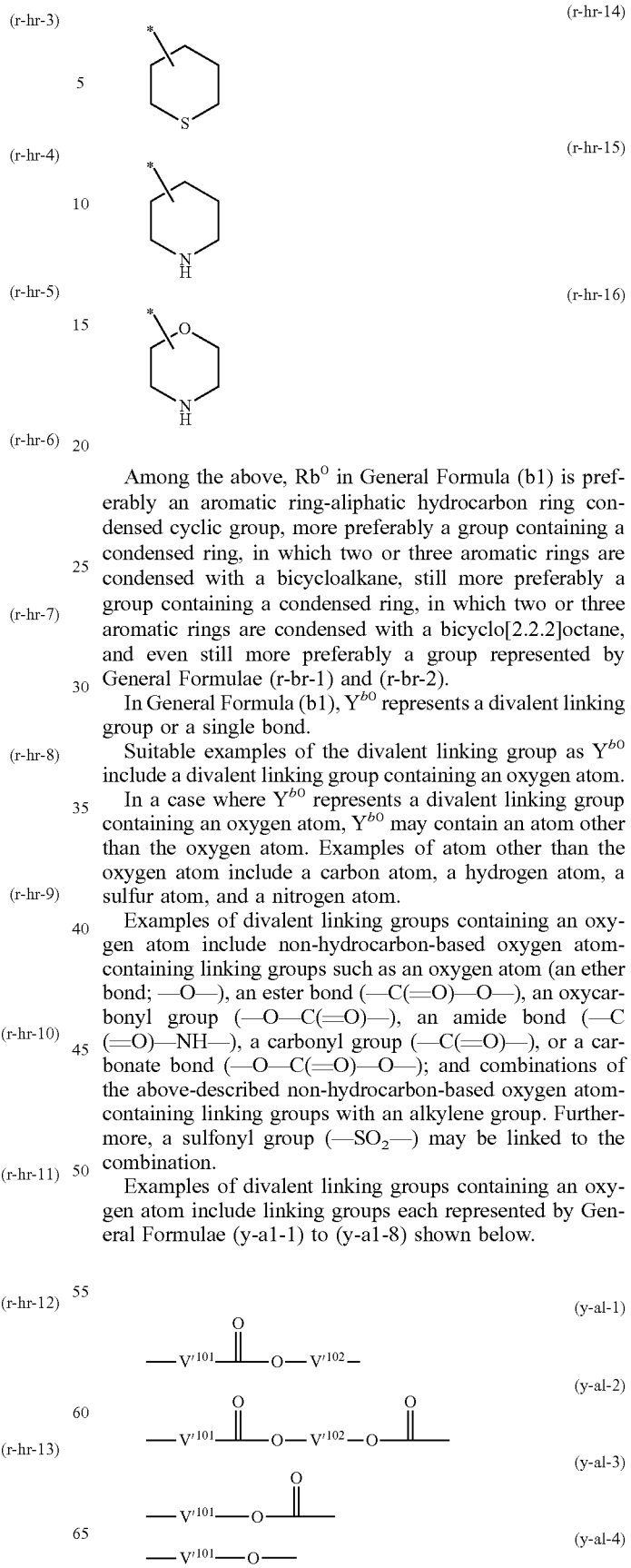

Among the above, $Rb^0$ in General Formula (b1) is preferably an aromatic ring-aliphatic hydrocarbon ring condensed cyclic group, more preferably a group containing a condensed ring, in which two or three aromatic rings are condensed with a bicycloalkane, still more preferably a group containing a condensed ring, in which two or three aromatic rings are condensed with a bicyclo[2.2.2]octane, and even still more preferably a group represented by General Formulae (r-br-1) and (r-br-2).

In General Formula (b1), $Y^{b0}$ represents a divalent linking group or a single bond.

Suitable examples of the divalent linking group as $Y^{b0}$ include a divalent linking group containing an oxygen atom.

In a case where $Y^{b0}$ represents a divalent linking group containing an oxygen atom, $Y^{b0}$ may contain an atom other than the oxygen atom. Examples of atom other than the oxygen atom include a carbon atom, a hydrogen atom, a sulfur atom, and a nitrogen atom.

Examples of divalent linking groups containing an oxygen atom include non-hydrocarbon-based oxygen atom-containing linking groups such as an oxygen atom (an ether bond; —O—), an ester bond (—C(=O)—O—), an oxycarbonyl group (—O—C(=O)—), an amide bond (—C(=O)—NH—), a carbonyl group (—C(=O)—), or a carbonate bond (—O—C(=O)—O—); and combinations of the above-described non-hydrocarbon-based oxygen atom-containing linking groups with an alkylene group. Furthermore, a sulfonyl group (—SO₂—) may be linked to the combination.

Examples of divalent linking groups containing an oxygen atom include linking groups each represented by General Formulae (y-a1-1) to (y-a1-8) shown below.

-continued

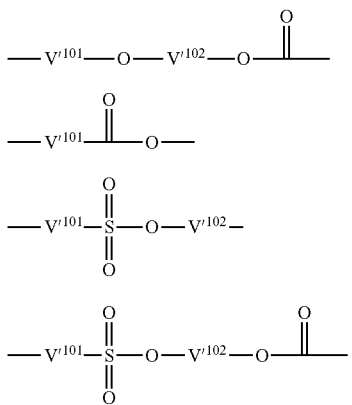

(y-al-5)

(y-al-6)

(y-al-7)

(y-al-8)

[In the formulae, $V'^{101}$ represents a single bond or an alkylene group having 1 to 5 carbon atoms, and $V'^{102}$ represents a divalent saturated hydrocarbon group having 1 to carbon atoms.]

The divalent saturated hydrocarbon group as $V'^{102}$ is preferably an alkylene group having 1 to 30 carbon atoms, more preferably an alkylene group having 1 to 10 carbon atoms, and still more preferably an alkylene group having 1 to 5 carbon atoms.

The alkylene group as $V'^{101}$ and $V'^{102}$ may be a linear alkylene group or a branched alkylene group, and a linear alkylene group is preferable.

Specific examples of the alkylene group as $V'^{101}$ and $V'^{102}$ include a methylene group [—$CH_2$—]; an alkylmethylene group such as —$CH(CH_3)$—, —$CH(CH_2CH_3)$—, —$C(CH_3)_2$—, —$C(CH_3)(CH_2CH_3)$>, —$C(CH_3)(CH_2CH_2CH_3)$—, or —$C(CH_2CH_3)_2$—; an ethylene group [—$CH_2CH_2$—]; an alkylethylene group such as —$CH(CH_3)CH_2$—, —$CH(CH_3)CH(CH_3)$—, —$C(CH_3)_2CH_2$—, or —$CH(CH_2CH_3)CH_2$—; a trimethylene group (n-propylene group) [—$CH_2CH_2CH_2$—]; an alkyltrimethylene group such as —$CH(CH_3)CH_2CH_2$— or —$CH_2CH(CH_3)CH_2$—; a tetramethylene group [—$CH_2CH_2CH_2CH_2$—]; an alkyltetramethylene group such as —$CH(CH_3)CH_2CH_2CH_2$—, or —$CH_2CH(CH_3)CH_2CH_2$—; and a pentamethylene group [—$CH_2CH_2CH_2CH_2CH_2$—].

Further, a part of methylene groups in the alkylene group as $V'^{101}$ and $V'^{102}$ may be substituted with a divalent aliphatic cyclic group having 5 to 10 carbon atoms. The aliphatic cyclic group is preferably a cyclohexylene group, a 1,5-adamantylene group, or a 2,6-adamantylene group.

$Y^{b0}$ preferably represents a divalent linking group containing an ester bond or a divalent linking group containing an ether bond and more preferably linking groups each represented by General Formulae (y-a1-1) to (y-a1-6).

In General Formula (b-1), $Vb^0$ represents an alkylene group, a fluorinated alkylene group, or a single bond.

The alkylene group and the fluorinated alkylene group as $Vb^0$ each preferably have 1 to 4 carbon atoms and more preferably 1 to 3 carbon atoms. Examples of the fluorinated alkylene group as $Vb^0$ include a group in which part or all of hydrogen atoms in the alkylene group have been substituted with a fluorine atom. Among them, $Vb^0$ is preferably an alkylene group having 1 to 4 carbon atoms, a fluorinated alkylene group having 1 to 4 carbon atoms, or a single bond.

In the present embodiment, the anion moiety of the component (B1) is preferably an anion represented by General Formula (b1-an0) from the viewpoint of the roughness reduction property and the resolution improvement.

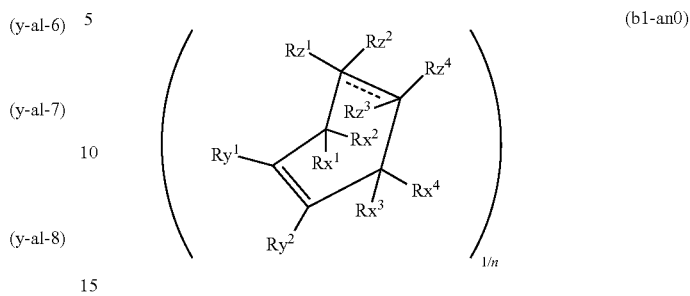

(b1-an0)

[In the formula, $Rx^1$ to $Rx^4$ each independently represents a hydrocarbon group which may have a substituent or a hydrogen atom, or two or more thereof may be bonded to each other to form a ring structure. $Ry^1$ and $Ry^2$ each independently represent a hydrocarbon group which may have a substituent or a hydrogen atom, or may be bonded to each other to form a ring structure.

 is a double bond or a single bond. In a case of being allowed in terms of valence, $Rz^1$ to $Rz^4$ each independently represents a hydrocarbon group which may have a substituent or a hydrogen atom, or two or more thereof may be bonded to each other to form a ring structure. However, two or more of $Rx^1$ to $Rx^4$, $Ry^1$ and $Ry^2$, or two or more of $Rz^1$ to $Rz^4$ are bonded to each other to form an aromatic ring. Further, at least one of $Rx^1$ to $Rx^4$, $Ry^1$ and $Ry^2$, and $Rz^1$ to $Rz^4$ has an anion group represented by General Formula (b0-r-an1), and an entire anion moiety is an n-valent anion, n represents an integer of 1 or greater.

$$*-Yb^0-Vb^0-SO_3^{\ominus} \qquad (b0\text{-}r\text{-}an1)$$

[In the formula, $Yb^0$ represents a divalent linking group or a single bond. $Vb^0$ represents a single bond, an alkylene group, or a fluorinated alkylene group. * represents a bonding site.]

In General Formula (b1-an0), $Rx^1$ to $Rx^4$ each independently represents a hydrocarbon group which may have a substituent or a hydrogen atom, or two or more thereof may be bonded to each other to form a ring structure.

$Ry^1$ and $Ry^2$ each independently represent a hydrocarbon group which may have a substituent or a hydrogen atom, or may be bonded to each other to form a ring structure.

In a case of being allowed in terms of valence, $Rz^1$ to $Rz^4$ each independently represents a hydrocarbon group which may have a substituent or a hydrogen atom, or two or more thereof may be bonded to each other to form a ring structure.

The hydrocarbon groups as $Rx^1$ to $Rx^4$, $Ry^1$ and $Ry^2$, and $Rz^1$ to $Rz^4$ may be each an aliphatic hydrocarbon group or an aromatic hydrocarbon group and may be each a cyclic hydrocarbon group or a chain-like hydrocarbon group.

Examples of the hydrocarbon group which may have a substituent, as $Rx^1$ to $Rx^4$, $Ry^1$ and $Ry^2$, and $Rz^1$ to $Rz^4$, include a cyclic group which may have a substituent, a chain-like alkyl group which may have a substituent, and a chain-like alkenyl group which may have a substituent.

Cyclic Group which May have Substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. The aliphatic hydrocarbon group may be saturated or unsaturated. In general, it is preferable that the aliphatic hydrocarbon group be saturated. In addition, the cyclic hydrocarbon group as $Rx^1$ to $Rx^4$, $Ry^1$ and $Ry^2$, and $Rz^1$ to $Rz^4$ may contain a hetero atom such as a heterocyclic ring.

The aromatic hydrocarbon group as $Rx^1$ to $Rx^4$, $Ry^1$ and $Ry^2$, and $Rz^1$ to $Rz^4$ is a hydrocarbon group having an aromatic ring. The aromatic hydrocarbon group preferably has 3 to 30 carbon atoms, more preferably has 5 to 30 carbon atoms, still more preferably 5 to 20 carbon atoms, particularly preferably 6 to 15 carbon atoms, and most preferably 6 to 12 carbon atoms. However, the number of carbon atoms in a substituent is not included in the number of carbon atoms.

Specific examples of the aromatic ring which the aromatic hydrocarbon group has as $Rx^1$ to $Rx^4$, $Ry^1$ and $Ry^2$, and $Rz^1$ to $Rz^4$ include benzene, fluorene, naphthalene, anthracene, phenanthrene, biphenyl, and an aromatic heterocyclic ring obtained by substituting part of carbon atoms constituting any one of these aromatic rings with a hetero atom. Examples of the hetero atom in the aromatic heterocyclic rings include an oxygen atom, a sulfur atom, and a nitrogen atom. The aromatic ring which the aromatic hydrocarbon group has as $Rx^1$ to $Rx^4$, $Ry^1$ and $Ry^2$, and $Rz^1$ to $Rz^4$ preferably does not contain a heteroatom and is more preferably an aromatic ring such as benzene, fluorene, naphthalene, anthracene, phenanthrene, or biphenyl from the viewpoint of the compatibility with the component (A).

Specific examples of the aromatic hydrocarbon group as $Rx^1$ to $Rx^4$, $Ry^1$ and $Ry^2$, and $Rz^1$ to $Rz^4$ include a group in which one hydrogen atom has been removed from the above-described aromatic ring (an aryl group such as a phenyl group or a naphthyl group) and a group in which one hydrogen atom in the aromatic ring has been substituted with an alkylene group (an arylalkyl group such as a benzyl group, a phenethyl group, a 1-naphthylmethyl group, a 2-naphthylmethyl group, 1-naphthylethyl group, or a 2-naphthylethyl group). The alkylene group (an alkyl chain in the arylalkyl group) preferably has 1 to 4 carbon atoms, more preferably 1 or 2 carbon atoms, and particularly preferably 1 carbon atom.

Examples of the cyclic aliphatic hydrocarbon group as $Rx^1$ to $Rx^4$, $Ry^1$ and $Ry^2$, and $Rz^1$ to $Rz^4$ include an aliphatic hydrocarbon group containing a ring in the structure thereof.

Examples of the aliphatic hydrocarbon group containing a ring in the structure thereof include an alicyclic hydrocarbon group (a group in which one hydrogen atom has been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed in a linear or branched aliphatic hydrocarbon group.

The alicyclic hydrocarbon group preferably has 3 to 20 carbon atoms and more preferably 3 to 12 carbon atoms.

The alicyclic hydrocarbon group may be a polycyclic group or a monocyclic group. The monocyclic alicyclic hydrocarbon group is preferably a group in which one or more hydrogen atoms have been removed from a monocycloalkane. The monocycloalkane preferably has 3 to 6 carbon atoms, and specific examples thereof include cyclopentane and cyclohexane. The polycyclic alicyclic hydrocarbon group is preferably a group in which one or more hydrogen atoms have been removed from a poly cycloalkane, and the polycycloalkane preferably has 7 to 30 carbon atoms.

The linear aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and most preferably 1 to 3 carbon atoms. The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group which may be bonded to the alicyclic hydrocarbon group preferably has 2 to 10 carbon atoms, more preferably 3 to 6 carbon atoms, still more preferably 3 or 4 carbon atoms, and most preferably 3 carbon atoms. The branched aliphatic hydrocarbon group is preferably a branched alkylene group, and specific examples thereof include alkylalkylene groups, for example, alkylmethylene groups such as —CH($CH_3$>, —CH($CH_2CH_3$>, —C($CH_3$)$_2$—, —C($CH_3$)($CH_2CH_3$>, —C($CH_3$)($CH_2CH_2CH_3$)—, and —C($CH_2CH_3$)$_2$—; alkylethylene groups such as —CH($CH_3$)$CH_2$—, —CH($CH_3$)CH($CH_3$>, —C($CH_3$)$_2CH_2$—, —CH($CH_2CH_3$)$CH_2$—, and —C($CH_2CH_3$)$_2$—$CH_2$—; alkyltrimethylene groups such as —CH($CH_3$)$CH_2CH_2$—, and —$CH_2$CH($CH_3$)$CH_2$—; and alkyltetramethylene groups such as —CH($CH_3$)$CH_2CH_2CH_2$—, and —$CH_2$CH($CH_3$)$CH_2CH_2$—. The alkyl group in the alkylalkylene group is preferably a linear alkyl group having 1 to 5 carbon atoms.

In addition, examples of the cyclic groups of $Rx^1$ to $Rx^4$, $Ry^1$ and $Ry^2$, and $Rz^1$ to $Rz^4$ include —$COOR^{xyz}$ and —$OC(=O)R^{xyz}$, where $R^{xyz}$ is a lactone-containing cyclic group, a carbonate-containing cyclic group, or —$SO_2$—-containing cyclic group.

Examples of the substituent in the cyclic group of $Rx^1$ to $Rx^4$, $Ry^1$ and $Ry^2$, and $Rz^1$ to $Rz^4$ include the same substituent as the substituent that the polycyclic aromatic cyclic group as $Rb^0$ may have.

Among the above, the substituent in the cyclic groups of $Rx^1$ to $Rx^4$, $Ry^1$ and $Ry^2$, and $Rz^1$ to $Rz^4$ is preferably an alkyl group, a halogen atom, or a halogenated alkyl group from the viewpoint of the compatibility with the component (A).

Chain-Like Alkyl Group which May have Substituent:

The chain-like alkyl group as $Rx^1$ to $Rx^4$, $Ry^1$ and $Ry^2$, and $Rz^1$ to $Rz^4$ may be either linear or branched.

The linear alkyl group preferably has 1 to 20 carbon atoms, more preferably 1 to carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecil group, an icosyl group, a henicosyl group, and a docosyl group.

The branched alkyl group preferably has 3 to 20 carbon atoms, more preferably 3 to 15 carbon atoms, and most preferably 3 to 10 carbon atoms. Specific examples thereof include a 1-methylethyl group, a 1,1-dimethylethyl group, 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-Like Alkenyl Group which May have Substituent:

The chain-like alkenyl group as $Rx^1$ to $Rx^4$, $Ry^1$ and $Ry^2$, and $Rz^1$ to $Rz^4$ may be linear or branched, preferably has 2 to 10 carbon atoms, more preferably 2 to 5 carbon atoms, still more preferably 2 to 4 carbon atoms, and particularly preferably 3 carbon atoms. Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group.

Examples of the substituent in the chain-like alkyl group or alkenyl group as $Rx^1$ to $Rx^4$, $Ry^1$ and $Ry^2$, and $Rz^1$ to $Rz^4$ include an alkoxy group, a halogen atom, a halogenated alkyl group, a hydroxyl group, a carbonyl group, a nitro group, an amino group, and the above-described cyclic group as $Rx^1$ to $Rx^4$, $Ry^1$ and $Ry^2$, and $Rz^1$ to $Rz^4$. Among them, the substituent in the chain-like alkyl group or alkenyl group as $Rx^1$ to $Rx^4$, $Ry^1$ and $Ry^2$, and $Rz^1$ to $Rz^4$ is preferably a halogen atom, a halogenated alkyl group, or the group mentioned as the above-described cyclic group as $Rx^1$ to $Rx^4$, $Ry^1$ and $Ry^2$, and $Rz^1$ to $Rz^4$ from the viewpoint of the compatibility with the component (A).

In General Formula (b1-an0), $Ry^1$ and $Ry^2$ may be bonded to each other to form a ring structure.

The ring structure formed by $Ry^1$ and $Ry^2$ shares one side (the bond between carbon atoms to which $Ry^1$ and $Ry^2$ are each bonded) of the six-membered ring in General Formula (b1-an0), and this ring structure may be an alicyclic hydrocarbon or may be an aromatic hydrocarbon. Further, this ring structure may be a polycyclic structure composed of other ring structures.

The alicyclic hydrocarbons formed by $Ry^1$ and $Ry^2$ may be polycyclic or monocyclic. The monocyclic alicyclic hydrocarbon is preferably a monocycloalkane. The monocycloalkane preferably has 3 to 6 carbon atoms, and specific examples thereof include cyclopentane and cyclohexane. The polycyclic alicyclic hydrocarbon is preferably a polycycloalkane. The polycycloalkane preferably has 7 to 30 carbon atoms.

Specific examples of the aromatic hydrocarbon ring that are formed by $Ry^1$ and $Ry^2$ include benzene, fluorene, naphthalene, anthracene, phenanthrene, biphenyl, or an aromatic heterocyclic ring in which some carbon atoms constituting any of these aromatic rings have been substituted with a hetero atom. The aromatic hydrocarbon ring formed by $Ry^1$ and $Ry^2$ preferably does not contain a heteroatom and is more preferably an aromatic ring such as benzene, fluorene, naphthalene, anthracene, phenanthrene, or biphenyl from the viewpoint of the compatibility with the component (A).

The ring structure (the alicyclic hydrocarbon or the aromatic hydrocarbon) formed by $Ry^1$ and $Ry^2$ may have a substituent. Examples of the substituent here include the same substituents (for example, an alkyl group, an alkoxy group, a halogen atom, a halogenated alkyl group, a hydroxyl group, a nitro group, and a carbonyl group) as those in the above-described cyclic group as $Rx^1$ to $Rx^4$, $Ry^1$ and $Ry^2$, and $Rz^1$ to $Rz^4$. Among them, the substituent in the ring structure formed by $Ry^1$ and $Ry^2$ is preferably an alkyl group, a halogen atom, or a halogenated alkyl group from the viewpoint of the compatibility with the component (A).

Among the above, the ring structure formed by $Ry^1$ and $Ry^2$ is more preferably an aromatic hydrocarbon which may have a substituent from the viewpoint of shortening the diffusion of the acid generated upon exposure and the acid diffusion controllability.

In General Formula (b1-an0), two or more $Rz^1$ to $Rz^4$ may be bonded to each other to form a ring structure. For example, $Rz^1$ may form a ring structure together with any one of $Rz^2$ to $Rz^4$. Specific examples thereof include a ring structure that shares one side (the bond between a carbon atom to which $Rz^1$ and $Rz^2$ are bonded and a carbon atom to which $Rz^3$ and $Rz^4$ are bonded) of the six-membered ring in General Formula (b1-an0), a ring structure formed by bonding $Rz^1$ and $Rz^2$, and a ring structure formed by bonding $Rz^3$ and $Rz^4$.

The ring structure formed by two or more of $Rz^1$ to $Rz^4$ may be an alicyclic hydrocarbon or an aromatic hydrocarbon and is preferably an aromatic hydrocarbon. Further, this ring structure may be a polycyclic structure composed of other ring structures.

The alicyclic hydrocarbon formed by two or more of $Rz^1$ to $Rz^4$ may be polycyclic or monocyclic. The monocyclic alicyclic hydrocarbon is preferably a monocycloalkane. The monocycloalkane preferably has 3 to 6 carbon atoms, and specific examples thereof include cyclopentane and cyclohexane. The polycyclic alicyclic hydrocarbon is preferably a polycycloalkane. The polycycloalkane is preferably a polycycloalkane having 7 to 30 carbon atoms and specifically, the polycycloalkane is more preferably a polycycloalkane having a bridged ring-based polycyclic skeleton, such as adamantane, norbornane, isobornane, tricyclodecane, or tetracyclododecane; or a poly cycloalkane having a condensed ring-based polycyclic skeleton, such as a cyclic group having a steroid skeleton.

The polycyclic structure may be a heterocyclic structure in which a part of carbon atoms are substituted with a hetero atom and particularly preferably a nitrogen-containing heterocyclic ring, and specific examples thereof include a cyclic imide.

Specific examples of the aromatic hydrocarbon ring that are formed by two or more of $Rz^1$ to $Rz^4$ include benzene, fluorene, naphthalene, anthracene, phenanthrene, biphenyl, or an aromatic heterocyclic ring in which some carbon atoms constituting any of these aromatic rings have been substituted with a hetero atom. The aromatic hydrocarbon rings formed by two or more of $Rz^1$ to $Rz^4$ preferably do not contain a heteroatom and is more preferably an aromatic ring such as benzene, fluorene, naphthalene, anthracene, phenanthrene, or biphenyl from the viewpoint of the compatibility with the component (A).

The ring structure (the alicyclic hydrocarbon or the aromatic hydrocarbon) formed by $Rz^1$ to $Rz^4$ may have a substituent. Examples of the substituent here include the same substituents (for example, an alkyl group, an alkoxy group, a halogen atom, a halogenated alkyl group, a hydroxyl group, a nitro group, and a carbonyl group) as those in the above-described cyclic group as $Rx^1$ to $Rx^4$, $Ry^1$ and $Ry^2$, and $Rz^1$ to $Rz^4$. Among them, the substituent in the ring structure formed by $Rz^1$ to $Rz^4$ is preferably an alkyl group, a halogen atom, or a halogenated alkyl group from the viewpoint of the compatibility with the component (A).

Among the above, the ring structure formed by two or more of $Rz^1$ to $Rz^4$ is preferably a ring structure that shares one side (the bond between a carbon atom to which $Rz^1$ and $Rz^2$ are bonded and a carbon atom to which $Rz^3$ and $Rz^4$ are bonded) of the six-membered ring in General Formula (b1-an0) and more preferably an aromatic ring structure from the viewpoint of the diffusion controllability of the acid generated upon exposure.

In General Formula (b1-an0), "in a case of being allowed in terms of valence" is as follows.

That is, in a case where the bond between the carbon atom to which $Rz^1$ and $Rz^2$ are bonded and the carbon atom to which $Rz^3$ and $Rz^4$ are bonded is a single bond, all of $Rz^1$, $Rz^2$, $Rz^3$, and $Rz^4$ are present. In a case where the bond between the carbon atom to which $Rz^1$ and $Rz^2$ are bonded and the carbon atom to which $Rz^3$ and $Rz^4$ are bonded is a double bond, only one of $Rz^1$ and $Rz^2$ is present, and only one of $Rz^3$ and $Rz^4$ is present. Further, for example, in a case where $Rz^1$ and $Rz^3$ are bonded to form an aromatic ring structure, $Rz^2$ and $Rz^4$ are not present.

In General Formula (b1-an0), two or more $Rx^1$ to $Rx^4$ may be bonded to each other to form a ring structure. For example, $Rx^1$ may form a ring structure together with any one of $Rx^2$ to $Rx^4$.

The ring structure formed by two or more of $Rx^1$ to $Rx^4$ may be an alicyclic hydrocarbon or an aromatic hydrocarbon. Further, this ring structure may be a polycyclic structure composed of other ring structures.

The alicyclic hydrocarbon formed by two or more of $Rx^1$ to $Rx^4$ may be polycyclic or monocyclic. The monocyclic alicyclic hydrocarbon is preferably a monocycloalkane. The monocycloalkane preferably has 3 to 6 carbon atoms, and specific examples thereof include cyclopentane and cyclohexane. The polycyclic alicyclic hydrocarbon is preferably a polycycloalkane. The polycycloalkane is preferably a polycycloalkane having 7 to 30 carbon atoms and specifically, the polycycloalkane is more preferably a polycycloalkane having a bridged ring-based polycyclic skeleton, such as adamantane, norbornane, isobornane, tricyclodecane, or tetracyclododecane; or a polycycloalkane having a condensed ring-based polycyclic skeleton, such as a cyclic group having a steroid skeleton.

Specific examples of the aromatic hydrocarbon ring that are formed by two or more of $Rx^1$ to $Rx^4$ include benzene, fluorene, naphthalene, anthracene, phenanthrene, biphenyl, or an aromatic heterocyclic ring in which some carbon atoms constituting any of these aromatic rings have been substituted with a hetero atom. The aromatic hydrocarbon rings formed by two or more of $Rx^1$ to $Rx^4$ preferably do not contain a heteroatom and is more preferably an aromatic ring such as benzene, fluorene, naphthalene, anthracene, phenanthrene, or biphenyl from the viewpoint of the compatibility with the component (A).

The ring structure (the alicyclic hydrocarbon or the aromatic hydrocarbon) formed by $Rx^1$ to $Rx^4$ may have a substituent. Examples of the substituent here include the same substituents (for example, an alkyl group, an alkoxy group, a halogen atom, a halogenated alkyl group, a hydroxyl group, a nitro group, and a carbonyl group) as those in the above-described cyclic group as $Rx^1$ to $Rx^4$, $Ry^1$ and $Ry^2$, and $Rz^1$ to $Rz^4$. Among them, the substituent in the ring structure formed by $Rx^1$ to $Rx^4$ is preferably an alkyl group, a halogen atom, or a halogenated alkyl group from the viewpoint of the compatibility with the component (A).

The ring structure formed by two or more of $Rx^1$ to $Rx^4$ is preferably an alicyclic hydrocarbon from the viewpoint of acid diffusion controllability.

Further, among the above, it is preferable that the ring structure formed by two or more of $Rx^1$ to $Rx^4$ be a ring structure in which at least one of $Rx^1$ and $Rx^2$ and at least one of $Rx^3$ to $Rx^4$ are bonded to each other to form a bridged ring structure, and it is more preferable that this ring structure be an alicyclic hydrocarbon, from the viewpoint of acid diffusion controllability.

In a case where at least one of $Rx^1$ and $Rx^2$ and at least one of $Rx^3$ and $Rx^4$ are bonded to each other to form a ring structure, the number of carbon atoms constituting the bicyclic structure (the ring structure which also contains carbon atoms each bonded to $Ry^1$, $Ry^2$, $Rz^1$ and $Rz^2$, and $Rz^3$ and $Rz4$) is preferably 7 to 16.

In General Formula (b1-an0), two or more of $Rx^1$ to $Rx^4$, $Ry^1$ and $Ry^2$, or two or more of $Rz^1$ to $Rz^4$ are bonded to each other to form an aromatic ring. The aromatic ring is the same as the aromatic ring described in the explanation in General Formula (b1).

In General Formula (b1-an0), at least one of $Rx^1$ to $Rx^4$, $Ry^1$ and $Ry^2$, and $Rz^1$ to $Rz^4$ has an anion group represented by General Formula (b0-r-an1), and an entire anion moiety is an n-valent anion, n represents an integer of 1 or greater. $Rx^1$ to $Rx^4$, $Ry^1$ and $Ry^2$, and $Rz^1$ to $Rz^4$ may be each the above anion group. In a case where two or more of $Rx^1$ to $Rx^4$ are bonded to each other to form a ring structure, a carbon atom that forms the ring structure or a hydrogen atom bonded to the carbon atom may be substituted with the above anion group. In a case where two or more of $Ry^1$ and $Ry^2$ are bonded to each other to form a ring structure, a carbon atom that forms the ring structure or a hydrogen atom bonded to the carbon atom may be substituted with the above anion group. In a case where two or more of $Rz^1$ to $Rz^4$ are bonded to each other to form a ring structure, a carbon atom that forms the ring structure or a hydrogen atom bonded to the carbon atom may be substituted with the above anion group.

In General Formula (b0-r-an1), the divalent linking group as $Y^{b0}$ is the same as the divalent linking group as $Y^{b0}$ in General Formula (b1).

In General Formula (b0-r-an1), the alkylene group or the fluorinated alkylene group as $Vb^0$ is the same as the alkylene group or the fluorinated alkylene group as $Vb^0$ in General Formula (b1).

In a case where $Y^{b0}$ represents a single bond, specific examples of the anion group represented by General Formula (b0-r-an1) include fluorinated alkyl sulfonate anions such as a trifluoromethanesulfonate anion and a perfluorobutanesulfonate anion.

In a case where $Y^{b0}$ represents a divalent linking group containing an oxygen atom, examples of the anion group include an anion represented by any one of General Formulae (b1-r-an11) to (b1-r-an13).

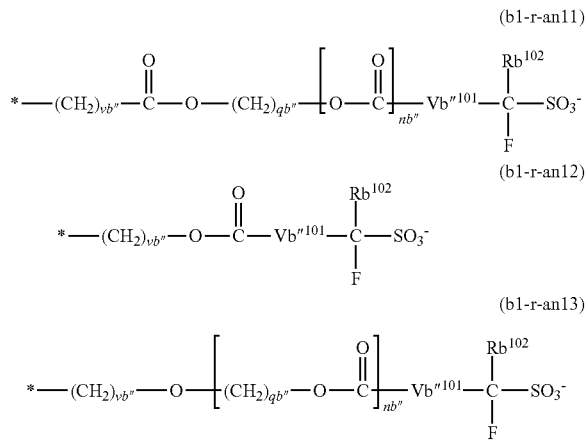

[In the formula, $Vb''^{101}$ represents a single bond, an alkylene group having 1 to 4 carbon atoms, or a fluorinated alkylene group having 1 to 4 carbon atoms. $Rb^{102}$ represents a fluorine atom or a fluorinated alkyl group having 1 to 5 carbon atoms. Each vb" independently represents an integer of 0 to 3. Each qb" independently represents an integer of 1 to 20. nb" represents 0 or 1.]

In General Formulae (b1-r-an11) to (b1-r-an13), $Vb''^{101}$ represents a single bond, an alkylene group having 1 to 4 carbon atoms, or a fluorinated alkylene group having 1 to 4 carbon atoms. $Vb''^{101}$ is preferably a single bond, an alkylene group (a methylene group) having 1 carbon atom, or a fluorinated alkylene group having 1 to 3 carbon atoms.

In General Formulae (b1-r-an11) to (b1-r-an13), $Rb^{102}$ represents a fluorine atom or a fluorinated alkyl group having 1 to 5 carbon atoms. $Rb^{102}$ more preferably represents a perfluoroalkyl group having 1 to 5 carbon atoms or a fluorine atom and more preferably a fluorine atom.

In General Formulae (b1-r-an11) to (b1-r-an13), vb" represents an integer of 0 to 3 and preferably represents 0 or 1.

qb" represents an integer of 1 to 20, preferably represents an integer of 1 to 10, more preferably an integer of 1 to 5, still more preferably 1, 2, or 3, and particularly preferably 1 or 2.

nb" represents 0 or 1 and preferably represents 0.

The number of anion groups in the component (B1) may be one or two or more.

In the component (B1), the entire anion moiety is an n-valent anion, n represents an integer of 1 or more, preferably represents 1 or 2, and more preferably 1.

The anion moiety in the component (B1) is more preferably an anion represented by General Formula (b1-an1) from the viewpoint of acid diffusion controllability.

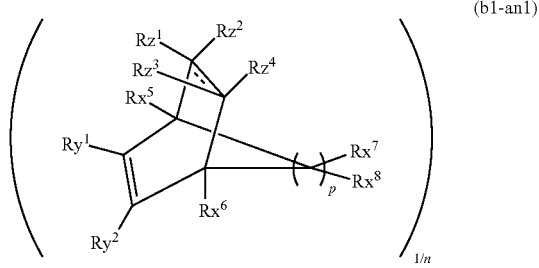

(b1-an1)

[In the formula, $Rx^5$ and $Rx^6$ each independently represent a hydrocarbon group which may have a substituent or a hydrogen atom. $Rx^7$ and $Rx^8$ each independently represent a hydrocarbon group which may have a substituent or a hydrogen atom, or may be bonded to each other to form a ring structure, p is 1 or 2, and in a case where p=2, a plurality of $Rx^7$'s and $Rx^8$'s may be each different from each other. $Ry^1$ and $Ry^2$ each independently represent a hydrocarbon group which may have a substituent or a hydrogen atom, or may be bonded to each other to form a ring structure.

----- is a double bond or a single bond. In a case of being allowed in terms of valence, $Rz^1$ to $Rz^4$ each independently represents a hydrocarbon group which may have a substituent or a hydrogen atom, or two or more thereof may be bonded to each other to form a ring structure. However, $Rx^5$ and $Rx^6$, $Rx^7$ and $Rx^8$, $Ry^1$ and $Ry^2$, or two or more of $Rz^1$ to $Rz^4$ are bonded to each other to form an aromatic ring. Further, at least one of $Rx^5$ to $Rx^8$, $Ry^1$ and $Ry^2$, and $Rz^1$ to $Rz^4$ has an anion group represented by General Formula (b0-r-an1), and an entire anion moiety is an n-valent anion, n represents an integer of 1 or greater.]

$$*-Yb^0-Vb^0-SO_3^{\ominus} \qquad (b0\text{-r-an1})$$

[In the formula, $Yb^0$ represents a divalent linking group or a single bond. $Vb^0$ represents a single bond, an alkylene group, or a fluorinated alkylene group. * represents a bonding site.]

In General Formula (b1-an1), $Rx^5$ and $Rx^6$ each independently represent a hydrocarbon group which may have a substituent or a hydrogen atom. The hydrocarbon group which may have a substituent, as $Rx^5$ and $Rx^6$, is the same as those described in the explanation of the hydrocarbon group which may have a substituent, as $Rx^1$ to $Rx^4$ in General Formula (b1-an0).

In General Formula (b1-an1), $Rx^7$ and $Rx^8$ each independently represent a hydrocarbon group which may have a substituent or a hydrogen atom or may be bonded to each other to form a ring structure. $Rx^7$ and $Rx^8$ are the same as those described in the explanation of $Rx^1$ to $Rx^4$ in General Formula (b1-an0).

In General Formula (b1-an1), p is 1 or 2, and in a case where p=2, a plurality of $Rx^7$'S and $Rx^8$'s may be each different from each other. In a case of p=1, the anion represented by General Formula (b1-an1) has a bicycloheptane ring structure, and in a case of p=2, the anion has a bicyclooctane ring structure.

In General Formula (b1-an1), $Ry^1$ and $Ry^2$ each independently represent a hydrocarbon group which may have a substituent or a hydrogen atom or may be bonded to each other to form a ring structure. $Ry^1$ and $Ry^2$ are the same as $Ry^1$ and $Ry^2$ in General Formula (b1-an0)

In a case of being allowed in terms of valence, $Rz^1$ to $Rz^4$ each independently represents a hydrocarbon group which may have a substituent or a hydrogen atom, or two or more thereof may be bonded to each other to form a ring structure. $Rz^1$ to $Rz^4$ are the same as $Rz^1$ to $Rz^4$ in General Formula (b1-an0) described above.

In General Formula (b1-an1), $Rx^5$ and $Rx^6$, $Rx^7$ and $Rx^8$, $Ry^1$ and $Ry^2$, or two or more of $Rz^1$ to $Rz^4$ are bonded to each other to form an aromatic ring. The details of the aromatic ring are as described in the explanation in General Formula (b1).

In General Formula (b1-an1), at least one of $Rx^5$ to $Rx^8$, $Ry^1$ and $Ry^2$, and $Rz^1$ to $Rz^4$ has an anion group represented by General Formula (b0-r-an1), and an entire anion moiety is an n-valent anion, n represents an integer of 1 or more, preferably represents 1 or 2, and more preferably 1.

Among the above, the anion moiety in the component (B1) is still more preferably an anion represented by General Formula (b1-an1) in a case of p=2, that is, an anion represented by General Formula (b1-an2) from the viewpoint of acid diffusion controllability.

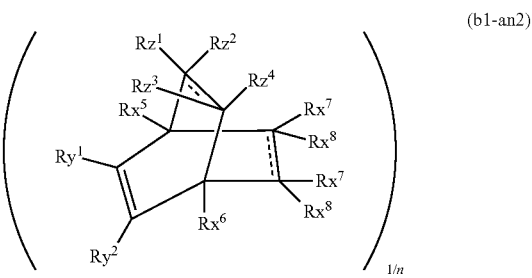

(b1-an2)

[In the formula, $Rx^5$ and $Rx^6$ each independently represent a hydrocarbon group which may have a substituent or a hydrogen atom. The plurality of $Rx^7$'s and $Rx^8$'s each independently represent a hydrocarbon group which may have a substituent or a hydrogen atom, or two or more thereof may be bonded to each other to form a ring structure. $Ry^1$ and $Ry^2$ each independently represent a hydrocarbon group which may have a substituent or a hydrogen atom, or may be bonded to each other to form a ring structure.

is a double bond or a single bond. In a case of being allowed in terms of valence, $Rz^1$ to $Rz^4$ each independently represents a hydrocarbon group which may have a substituent or a hydrogen atom, or two or more thereof may be bonded to each other to form a ring structure. However, $Rx^5$ and $Rx^6$, two or more of $Rx^7$'s and $Rx^8$'s, $Ry^1$ and $Ry^2$, or two or more of $Rz^1$ to $Rz^4$ are bonded to each other to form an aromatic ring. Further, at least one of $Rx^5$ to $Rx^8$, $Ry^1$ and $Ry^2$, and $Rz^1$ to $Rz^4$ has an anion group represented by General Formula (b0-r-an1), and an entire anion moiety is an n-valent anion, n represents an integer of 1 or greater.]

$$*-Yb^0-Vb^0-SO_3^{\ominus} \quad \text{(b0-r-an1)}$$

In the formula, $Yb^0$ represents a divalent linking group or a single bond. $Vb^0$ represents a single bond, an alkylene group, or a fluorinated alkylene group. * represents a bonding site.]

In General Formula (b1-an2), $Rx^5$ and $Rx^6$, $Rx^7$ and $Rx^8$, $Ry^1$ and $Ry^2$, and $Rz^1$ to $Rz^4$ are each the same as $Rx^5$ and $Rx^6$, $Rx^7$ and $Rx^8$, $Ry^1$ and $Ry^2$, and $Rz^1$ to $Rz^4$ in General Formula (b1-an1).

In General Formula (b1-an2), $Rx^5$ and $Rx^6$, two or more of $Rx^7$'s and $Rx^8$'s, $Ry^1$ and $Ry^2$, or two or more of $Rz^1$ to $Rz^4$ are bonded to each other to form an aromatic ring. The details of the aromatic ring are as described in the explanation in General Formula (b1).

In General Formula (b1-an2), at least one of $Rx^5$ to $Rx^8$, $Ry^1$ and $Ry^2$, and $Rz^1$ to $Rz^4$ has an anion group represented by General Formula (b0-r-an1), and an entire anion moiety is an n-valent anion, n represents an integer of 1 or more, preferably represents 1 or 2, and more preferably 1.

In General Formula (b1-an0), General Formula (b1-an1), and General Formula (b1-an2), it is preferable that $Ry^1$ and $Ry^2$ be bonded to each other to form a ring structure, and it is more preferable that the ring structure to be formed be an aromatic hydrocarbon (an aromatic ring or an aromatic heterocyclic ring) which may have a substituent, from the viewpoint of shortening the diffusion of the acid generated upon exposure and the acid diffusion controllability.

In General Formula (b1-an0), General Formula (b1-an1), and General Formula (b1-an2), it is preferable that $Rz^1$ to $Rz^4$ be bonded to each other to form a ring structure, where the ring structure to be formed is preferably a ring structure that shares one side (the bond between a carbon atom to which $Rz^1$ and $Rz^2$ are bonded and a carbon atom to which $Rz^3$ and $Rz^4$ are bonded) of the six-membered ring in the formula and more preferably an aromatic hydrocarbon (an aromatic ring or an aromatic heterocyclic ring) which may have a substituent, from the viewpoint of the diffusion controllability of the acid generated upon exposure.

In General Formulae (b1-an1) and (b1-an2), it is preferable that $Rx^7$ and $Rx^8$ be bonded to each other to form a ring structure, and it is more preferable that the ring structure to be formed be an aromatic hydrocarbon (an aromatic ring or an aromatic heterocyclic ring) which may have a substituent, from the viewpoint of shortening the diffusion of the acid generated upon exposure and the acid diffusion controllability.

In General Formula (b1-an2), the ring structure formed in $Rx^7$ and $Rx^8$ is preferably a ring structure that shares one side (the bond between the same carbon atoms to which $Rx^7$ and $Rx^8$ are bonded) of the six-membered ring in the formula and more preferably an aromatic hydrocarbon (an aromatic ring or an aromatic heterocyclic ring) which may have a substituent.

In the entire anion represented by General Formula (b1-an2), the number of ring structures each formed by bonding $Rx^7$ and $Rx^8$, $Ry^1$ and $Ry^2$, and $Rz^1$ to $Rz^4$ to each other may be one or two or more and is preferably two or three.

In the present embodiment, the anion moiety of the component (B1) is particularly preferably an anion represented by General Formula (b1-an3) from the viewpoint of the roughness reduction and the resolution improvement.

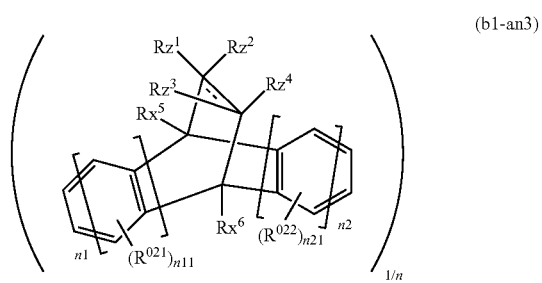

[In the formula, $Rx^5$ and $Rx^6$ each independently represent a hydrocarbon group which may have a substituent or a hydrogen atom.

is a double bond or a single bond. In a case of being allowed in terms of valence, $Rz^1$ to $Rz^4$ each independently represents a hydrocarbon group which may have a substituent or a hydrogen atom, or two or more thereof may be bonded to each other to form a ring structure. However, at least one of $Rx^5$ and $Rx^6$ and $Rz^1$ to $Rz^4$ has an anion group represented by General Formula (b0-r-an1), and an entire anion moiety is an n-valent anion, n represents an integer of 1 or greater. $R^{021}$ represents an alkyl group, an alkoxy group, a halogen atom, a halogenated alkyl group, a hydroxyl group, a carbonyl group, or a nitro group, n1 represents an integer in a range of 1 to 3. n11 represents an integer in a range of 0 to 8. $R^{022}$ represents an alkyl group, an alkoxy group, a halogen atom, a halogenated alkyl group, a hydroxyl group, a carbonyl group, or a nitro group. n2 represents an integer in a range of 1 to 3. n21 represents an integer in a range of 0 to 8.]

$$*-Yb^0-Vb^0-SO_3^{\ominus} \quad \text{(b0-r-an1)}$$

[In the formula, $Yb^0$ represents a divalent linking group or a single bond. $Vb^0$ represents a single bond, an alkylene group, or a fluorinated alkylene group. * represents a bonding site.]

In General Formula (b1-an3), $Rx^5$ and $Rx^6$ and $Rz^1$ to $Rz^4$ are each the same as $Rx^5$ and $Rx^6$ and $Rz^1$ to $Rz^4$ in General Formula (b1-an1).

In General Formula (b1-an3), $R^{021}$ represents an alkyl group, an alkoxy group, a halogen atom, a halogenated alkyl group, a hydroxy group, a carbonyl group, or a nitro group.

The alkyl group as $R^{021}$ is preferably an alkyl group having 1 to 5 carbon atoms, and a methyl group, an ethyl group, a propyl group, an n-butyl group, or a tert-butyl group is more preferable.

The alkoxy group as $R^{021}$ is preferably an alkoxy group having 1 to 5 carbon atoms, more preferably a methoxy group, an ethoxy group, an n-propoxy group, an iso-propoxy group, an n-butoxy group, or a tert-butoxy group, and still more preferably a methoxy group or an ethoxy group.

The halogen atom as $R^{021}$ is preferably a fluorine atom.

Examples of the halogenated alkyl group as $R^{021}$ include a group in which part or all of hydrogen atoms in an alkyl group having 1 to 5 carbon atoms such as a methyl group, an ethyl group, a propyl group, an n-butyl group, or a tert-butyl group have been substituted with the above-described halogen atom.

Among them, $R^{021}$ is preferably an alkyl group, a halogen atom, or a halogenated alkyl group from the viewpoint of the compatibility with the component (A).

In General Formula (b1-an3), n1 represents an integer in a range of 1 to 3, preferably 1 or 2, and more preferably 1.

In General Formula (b1-an3), ni1 represents an integer in a range of 0 to 8, preferably an integer in a range of 0 to 4, more preferably 0, 1, or 2, and still more preferably 0 or 1.

In General Formula (b1-an3), $R^{022}$ represents an alkyl group, an alkoxy group, a halogen atom, a halogenated alkyl group, a hydroxy group, a carbonyl group, or a nitro group, and examples thereof include those that are the same as $R^{021}$ described above. Among them, $R^{022}$ is preferably an alkyl group, a halogen atom, or a halogenated alkyl group from the viewpoint of the compatibility with the component (A).

In General Formula (b1-an3), n2 represents an integer in a range of 1 to 3, preferably 1 or 2, and particularly preferably 1.

In General Formula (b1-an3), n21 represents an integer in a range of 0 to 8, preferably an integer in a range of 0 to 4, more preferably 0, 1, or 2, and particularly preferably 0 or 1.

However, in General Formula (b1-an3), at least one of $Rx^5$ and $Rx^6$ and $Rz^1$ to $Rz^4$ has an anion group represented by General Formula (b0-r-an1), and an entire anion moiety is an n-valent anion, n represents an integer of 1 or more, preferably represents 1 or 2, and more preferably 1.

In General Formula (b1-an0), General Formula (b1-an1), General Formula (b1-an2), and General Formula (b1-an3), at least one of $Rz^1$ to $Rz^4$ preferably has an anion group from the viewpoint of the excellent effect of the present invention. In a case where two or more of $Rz^1$ to $Rz^4$ are bonded to each other to form a ring structure, a carbon atom that forms the ring structure or a hydrogen atom bonded to the carbon atom may be substituted with the above anion group.

Specific examples of the anion moiety of the component (B1) are shown below.

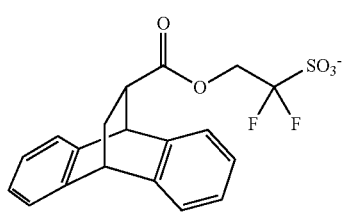
(an-b1-1)

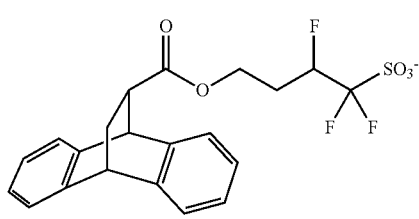
(an-b1-2)

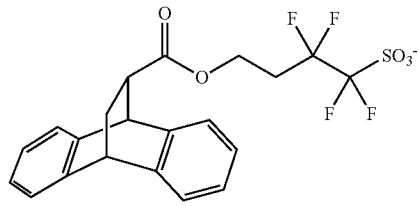
(an-b1-3)

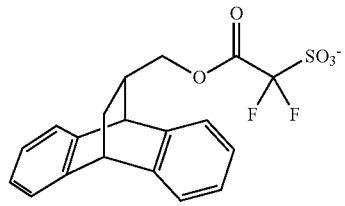
(an-b1-4)

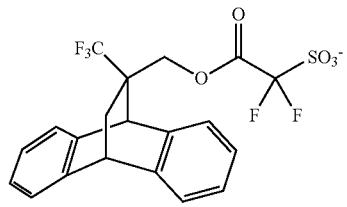
(an-b1-5)

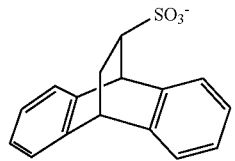
(an-b1-6)

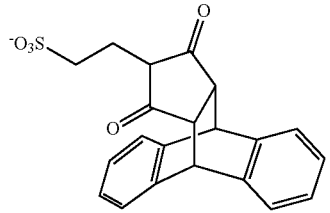
(an-b1-7)

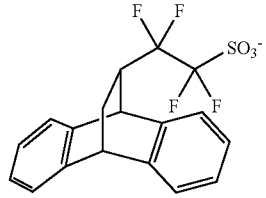
(an-b1-8)

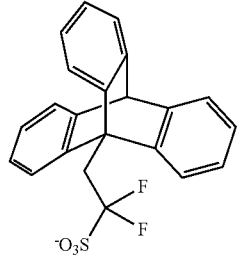
(an-b1-9)

(an-b1-10)
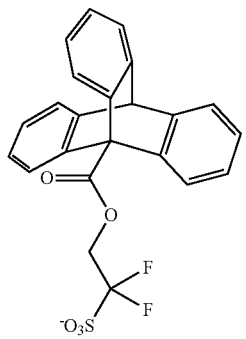

(an-b1-11)
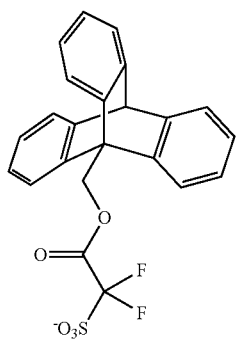

(an-b1-12)
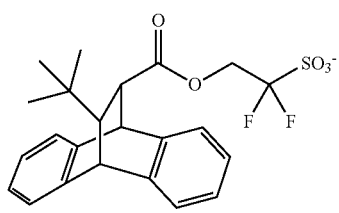

(an-b1-13)
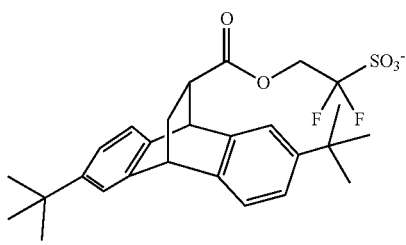

(an-b1-14)
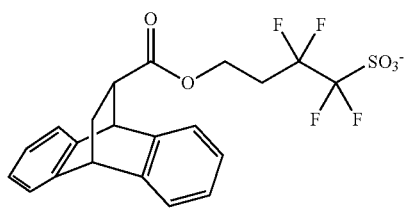

(an-b1-15)
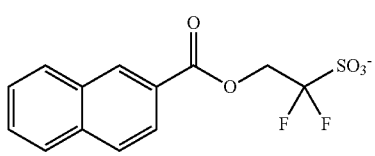

(an-b1-16)
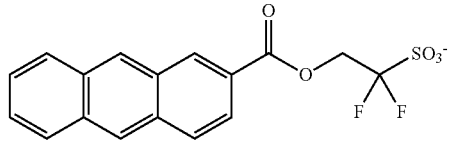

(an-b1-17)
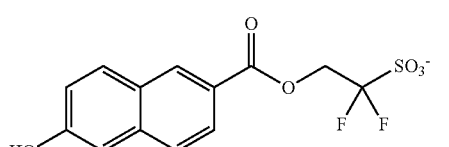

(an-b1-18)
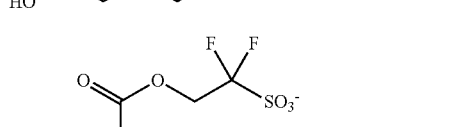

Among the above, the anion moiety of the component (B1) is preferably an anion represented by any one of General Formulae (an-b1-1) to (an-b1-14), more preferably an anion represented by any one of General Formulae (an-b1-1) to (an-b1-8), and still more preferably an anion represented by General Formula (an-b1-1) or (an-b1-2).

{Cation Moiety of Component (B1)}

In General Formula (b1), $Rc^1$ represents an aryl group having an electron-withdrawing group. $Rc^2$ and $Rc^3$ each independently represents an aryl group which may have a substituent or are bonded to each other to form a ring together with a sulfur atom in the formula.

The aryl group as $Rc^1$ to $Rc^3$ preferably has 5 to 30 carbon atoms, more preferably 5 to 20 carbon atoms, particularly preferably 6 to 15 carbon atoms, and most preferably 6 to 10 carbon atoms. However, the number of carbon atoms in a substituent is not included in the number of carbon atoms.

Specifically, the aryl group as $Rc^1$ to $Rc^3$ is preferably a phenyl group, a naphthyl group, an anthryl group, a phenanthryl group, or a biphenyl group, more preferably a phenyl group or a naphthyl group, and still more preferably a phenyl group.

The electron-withdrawing group as $Rc^1$ may be one kind or two or more kinds.

Further, the electron-withdrawing group may be a monovalent electron-withdrawing group or a divalent electron-withdrawing group.

Specific examples of the electron-withdrawing group as $Rc^1$ include an acyl group, a methanesulfonyl group (a mesyl group), a halogen atom, a halogenated alkyl group, a halogenated alkoxy group, a halogenated aryloxy group, a halogenated alkylamino group, a halogenated alkylthio group, a cyano group, a nitro group, a dialkylphosphono group, a diarylphosphono group, an alkylsulfonyl group, an arylsulfonyl group, a sulfonyloxy group, an acylthio group, a sulfamoyl group, a thiocyanate group, and a thiocarbonyl group.

Among the above, the electron-withdrawing group as $Rc^1$ is preferably a fluorine atom, a fluorinated alkyl group, or a sulfonyl group, and more preferably a fluorine atom or a fluorinated alkyl group from the viewpoint of increasing sensitivity.

The fluorinated alkyl group is preferably a fluorinated alkyl group having 1 to 5 carbon atoms, more preferably a fluorinated alkyl group having 1 to 3 carbon atoms, and still more preferably a trifluoromethyl group.

In a case where the electron-withdrawing group is a fluorine atom or a fluorinated alkyl group, the number of fluorine atoms in the cation moiety of the component (B1) is preferably in a range of 1 to 9, more preferably in a range of 1 to 6, and still more preferably in a range of 1 to 4.

The more fluorine atoms there exist, the better the sensitivity; however, in a case where the number of fluorine atoms is equal to or lower than the upper limit value of the preferred range, the solubility in the developing solution with each of the components of the resist composition is maintained, and the deterioration of roughness is easily suppressed.

The aryl group as $Rc^1$ may have a substituent other than the above-described electron-withdrawing group, and examples of the substituent include an alkyl group (a methyl group, an ethyl group, or the like) and an alkoxy group (a methoxy group, an ethoxy group, a propoxy group, a butoxy group, or the like), and an amino group.

Among the above, the aryl group as $Rc^1$ preferably does not have a substituent other than the above electron-withdrawing group.

Examples of the aryl group as $Rc^2$ and $Rc^3$ include the same aryl group as that described in $Rc^1$ above.

Examples of the substituent which the aryl group as $Rc^2$ and $Rc^3$ may have include those that are the same as the electron-withdrawing group which the aryl group as $Rc^1$ may have and the substituent other than the electron-withdrawing group, and specific examples thereof include an alkyl group, a halogen atom, a halogenated alkyl group, a carbonyl group, a cyano group, an amino group, an aryl group, and groups each represented by General Formulae (ca-r-1) to (ca-r-7).

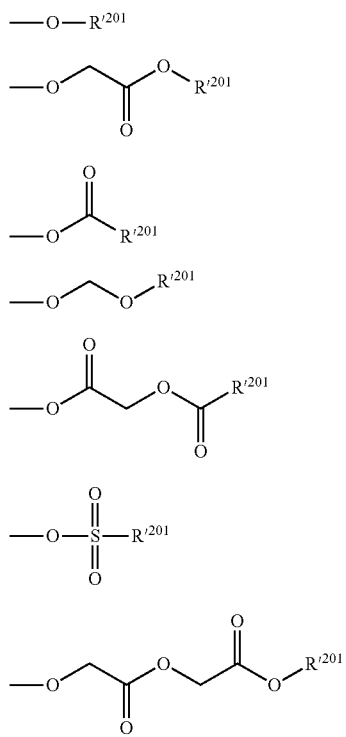

[In the formulae, each $R'^{201}$ independently represent a hydrogen atom, a cyclic group which may have a substituent, a chain-like alkyl group which may have a substituent, or a chain-like alkenyl group which may have a substituent.]

Cyclic Group which May have Substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. The aliphatic hydrocarbon group may be saturated or unsaturated. In general, it is preferable that the aliphatic hydrocarbon group be saturated.

The aromatic hydrocarbon group as $R'^{201}$ is a hydrocarbon group having an aromatic ring. The aromatic hydrocarbon group preferably has 3 to 30 carbon atoms, more preferably 5 to 30 carbon atoms, still more preferably 5 to 20 carbon atoms, particularly preferably 6 to 15 carbon atoms, and most preferably 6 to 10 carbon atoms. Here, the number of carbon atoms in a substituent is not included in the number of carbon atoms.

Specific examples of the aromatic ring which the aromatic hydrocarbon group has as $R'^{201}$ include benzene, fluorene, naphthalene, anthracene, phenanthrene, biphenyl, or an aromatic heterocyclic ring in which some carbon atoms constituting any of these aromatic rings have been substituted with a hetero atom. Examples of the hetero atom in the aromatic heterocyclic rings include an oxygen atom, a sulfur atom, and a nitrogen atom.

Specific examples of the aromatic hydrocarbon group as $R'^{201}$ include a group in which one hydrogen atom has been removed from the above-described aromatic ring (an aryl group; for example, a phenyl group or a naphthyl group) and a group in which one hydrogen atom in the aromatic ring has been substituted with an alkylene group (for example, an arylalkyl group such as a benzyl group, a phenethyl group, a 1-naphthylmethyl group, a 2-naphthylmethyl group, 1-naphthylethyl group, or a 2-naphthylethyl group). The alkylene group (an alkyl chain in the arylalkyl group) preferably has 1 to 4 carbon atoms, more preferably 1 or 2 carbon atoms, and particularly preferably 1 carbon atom.

Examples of the cyclic aliphatic hydrocarbon group as $R'^{201}$ include aliphatic hydrocarbon groups containing a ring in the structure thereof.

Examples of the aliphatic hydrocarbon group containing a ring in the structure thereof include an alicyclic hydrocarbon group (a group in which one hydrogen atom has been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed in a linear or branched aliphatic hydrocarbon group.

The alicyclic hydrocarbon group preferably has 3 to 20 carbon atoms and more preferably 3 to 12 carbon atoms.

The alicyclic hydrocarbon group may be a polycyclic group or a monocyclic group. The monocyclic alicyclic hydrocarbon group is preferably a group in which one or more hydrogen atoms have been removed from a monocycloalkane. The monocycloalkane preferably has 3 to 6 carbon atoms, and specific examples thereof include cyclopentane and cyclohexane. The polycyclic alicyclic hydrocarbon group is preferably a group in which one or more hydrogen atoms have been removed from a poly cycloalkane, and the polycycloalkane preferably has 7 to 30 carbon atoms. Among the above, the polycycloalkane is more preferably a polycycloalkane having a bridged ring-based polycyclic skeleton, such as adamantane, norbornane, isobornane, tricyclodecane, or tetracyclododecane; or a polycycloalkane having a condensed ring-based polycyclic skeleton, such as a cyclic group having a steroid skeleton.

Among them, the cyclic aliphatic hydrocarbon group as $R'^{201}$ is preferably a group in which one or more hydrogen atoms have been removed from a monocycloalkane or a polycycloalkane, more preferably a group in which one hydrogen atom has been removed from a polycycloalkane, particularly preferably an adamantyl group or a norbornyl group, and most preferably an adamantyl group.

The linear or branched aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and particularly preferably 1 to 3 carbon atoms.

The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group is preferably a branched alkylene group, and specific examples thereof include alkylmethylene groups, for example, alkylmethylene groups such as —$CH(CH_3)$—, —$CH(CH_2CH_3)$—, —$C(CH_3)_2$—, —$C(CH_3)(CH_2CH_3)$>, —$C(CH_3)(CH_2CH_2CH_3)$>, and —$C(CH_2CH_3)_2$—; alkylethylene groups such as —$CH(CH_3)CH_2$—, —$CH(CH_3)CH(CH_3)$>, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. The alkyl group in the alkylalkylene group is preferably a linear alkyl group having 1 to 5 carbon atoms.

The cyclic hydrocarbon group as $R'^{201}$ may contain a hetero atom such as a heterocyclic ring. Specific examples thereof include lactone-containing cyclic groups each represented by General Formulae (a2-r-1) to (a2-r-7), —$SO_2$—containing cyclic groups each represented by General Formulae (a5-r-1) to (a5-r-4), and other heterocyclic groups each represented by Chemical Formulae (r-hr-1) to (r-hr-16).

Examples of the substituent of the cyclic group as $R'^{201}$ include an alkyl group, an alkoxy group, a halogen atom, a halogenated alkyl group, a hydroxyl group, a carbonyl group, and a nitro group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

The halogen atom as the substituent is preferably a fluorine atom.

Examples of the above-described halogenated alkyl group as the substituent include a group in which part or all of hydrogen atoms in an alkyl group having 1 to 5 carbon atoms such as a methyl group, an ethyl group, a propyl group, an n-butyl group, or a tert-butyl group have been substituted with the above-described halogen atom.

The carbonyl group as the substituent is a group that substitutes a methylene group (—$CH_2$—) constituting the cyclic hydrocarbon group.

Chain-like alkyl group which may have substituent:

The chain-like alkyl group as $R'^{201}$ may be linear or branched.

The linear alkyl group preferably has 1 to 20 carbon atoms, more preferably 1 to carbon atoms, and most preferably 1 to 10 carbon atoms.

The branched alkyl group preferably has 3 to 20 carbon atoms, more preferably 3 to 15 carbon atoms, and most preferably 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-Like Alkenyl Group which May have Substituent:

Such a chain-like alkenyl group as $R'^{201}$ may be linear or branched, preferably has 2 to 10 carbon atoms, more preferably 2 to 5 carbon atoms, still more preferably 2 to 4 carbon atoms, and particularly preferably 3 carbon atoms. Examples of the linear alkenyl group include a vinyl group, a 1-propenyl group, a 2-propenyl group (an allyl group), and a butynyl group. Examples of the branched alkenyl group include a 1-methylvinyl group, a 1-methylpropenyl group, and a 2-methylpropenyl group.

Among the above, the chain-like alkenyl group is preferably a linear alkenyl group, more preferably a vinyl group or a propenyl group, and particularly preferably a vinyl group.

Examples of the substituent in the chain-like alkyl group or alkenyl group as $R'^{201}$, an alkoxy group, a halogen atom, a halogenated alkyl group, a hydroxyl group, a carbonyl group, a nitro group, an amino group, a cyclic group as $R'^{201}$ or the like may be used.

As the cyclic group which may have a substituent, the chain-like alkyl group which may have a substituent, or the chain-like alkenyl group which may have a substituent, as $R'^{201}$, a group that is the same as the acid-dissociable group represented by above-described General Formula (a1-r-2) can be mentioned as the cyclic group which may have a substituent or the chain-like alkyl group which may have a substituent, in addition to the groups described above.

Among them, $R'^{201}$ is preferably a cyclic group which may have a substituent and more preferably a cyclic hydrocarbon group which may have a substituent. More specific examples thereof preferably include a phenyl group, a naphthyl group, a group in which one or more hydrogen atoms have been removed from a polycycloalkane, lactone-containing cyclic groups each represented by any one of General Formulae (a2-r-1) to (a2-r-7), and —$SO_2$—containing cyclic groups each represented by any one of General Formulae (a5-r-1) to (a5-r-4).

Among the above, $Rc^2$ and $Rc^3$ are each independently preferably an aryl group having an electron-withdrawing group or an aryl group having no substituent and are each independently more preferably an aryl group having a fluorine atom or a fluorinated alkyl group or an aryl group having no substituent.

In a case of forming a ring together with a sulfur atom in the formula, $Rd^2$ and $Rd^3$ may be bonded to each other via a hetero atom such as a sulfur atom, an oxygen atom or a nitrogen atom, or a functional group such as —SO—, —$SO_2$—, —$SO_3$—, —COO—, —CONH—, or —$N(R_N)$— (here, $R_N$ represents an alkyl group having 1 to 5 carbon atoms). As the ring to be formed, a ring containing the sulfur atom in the formula in the ring skeleton thereof is preferably a 3- to 10-membered ring and particularly preferably a 5- to 7-membered ring including the sulfur atom. Specific examples of the ring to be formed include a dibenzothiophene ring, a 9H-thioxanthene ring, a thianthrene ring, and a phenoxathiin ring. Among them, the ring in which Rd² and Rd³ are bonded to each other to form a ring together with the sulfur atom in the formula is preferably a ring containing no heteroatom other than the sulfur atom in the formula, more preferably a dibenzothiophene ring or a 9H-thioxanthene ring, and still more preferably a dibenzothiophene ring.

Specific examples of the cation moiety of the component (b1) are shown below.

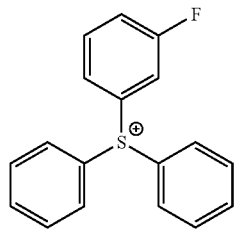
(ca-b1-1)

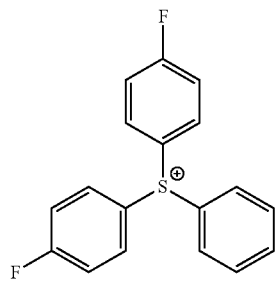
(ca-b1-2)

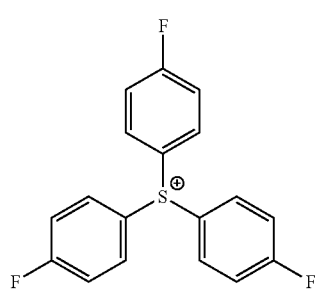
(ca-b1-3)

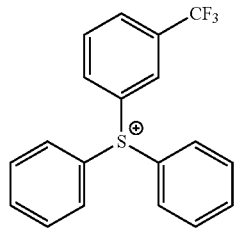
(ca-b1-4)

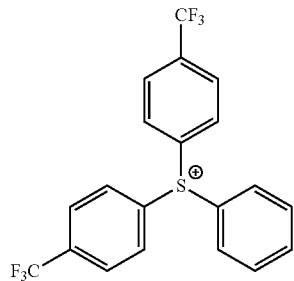
(ca-b1-5)

-continued

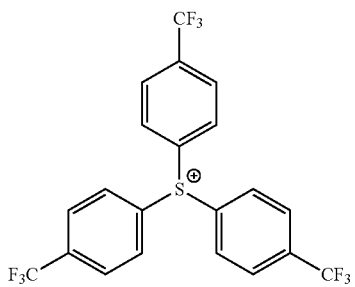
(ca-b1-6)

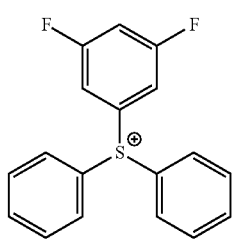
(ca-b1-7)

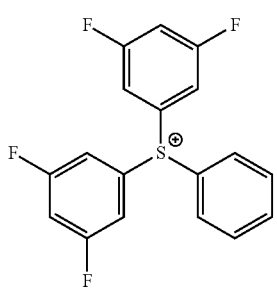
(ca-b1-8)

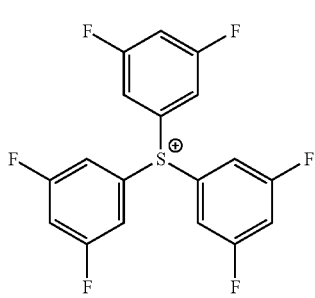
(ca-b1-9)

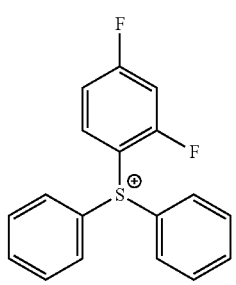
(ca-b1-10)

-continued

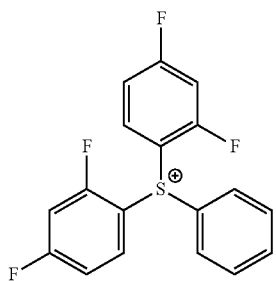
(ca-b1-11)

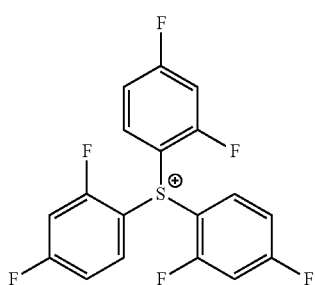
(ca-b1-12)

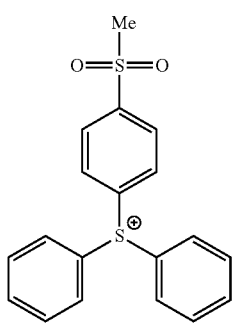
(ca-b1-13)

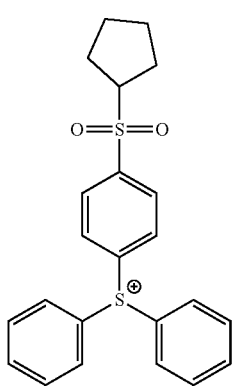
(ca-b1-14)

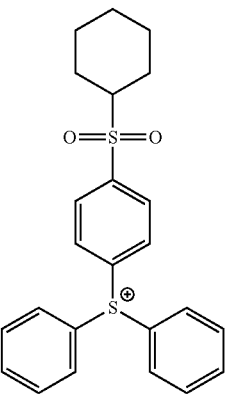
(ca-b1-15)

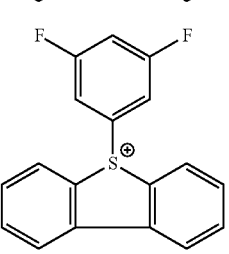
(ca-b1-16)

Among the above, the cation moiety of the component (B1) is preferably an anion represented by any one of General Formulae (ca-b1-1) to (ca-b1-12) and (ca-b1-16) and more preferably any one of General Formulae (ca-b1-1) to (ca-b1-4), (ca-b1-7), (ca-b1-8), (ca-b1-10), (ca-b1-11), and (ca-b1-16).

In the resist composition according to the present embodiment, among the above, the component (B1) is preferably a compound represented by General Formula (b1-1).

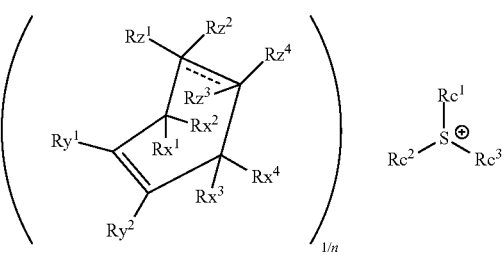
(b1-1)

[In the formula, $Rx^1$ to $Rx^4$ each independently represents a hydrocarbon group which may have a substituent or a hydrogen atom, or two or more thereof may be bonded to each other to form a ring structure. $Ry^1$ and $Ry^2$ each independently represent a hydrocarbon group which may have a substituent or a hydrogen atom, or may be bonded to each other to form a ring structure.

⋯⋯ is a double bond or a single bond. In a case of being allowed in terms of valence, $Rz^1$ to $Rz^4$ each independently represents a hydrocarbon group which may have a substituent or a hydrogen atom, or two or more thereof may be bonded to each other to form a ring structure. However, two or more of $Rx^1$ to $Rx^4$, $Ry^1$ and $Ry^2$, or two or more of $Rz^1$ to $Rz^4$ are bonded to each other to form an aromatic ring. Further, at least one of $Rx^1$ to $Rx^4$, $Ry^1$ and $Ry^2$, and $Rz^1$ to $Rz^4$ has an anion group represented by General Formula (b0-r-an1), and an entire anion moiety is an n-valent anion, n represents an integer of 1 or greater.

$Rc^1$ represents an aryl group having an electron-withdrawing group. Rc2 and Rc3 each independently represents an aryl group which may have a substituent or are bonded to each other to form a ring together with a sulfur atom in the formula.]

(b0-r-an1)

[In the formula, $Yb^0$ represents a divalent linking group or a single bond. $Vb^0$ represents a single bond, an alkylene group, or a fluorinated alkylene group. * represents a bonding site.]

The anion moiety of the compound represented by General Formula (b1-1) is the same as the anion represented by General Formula (b1-an0).

The cation moiety of the compound represented by General Formula (b1-1) is the same as the cation of the compound represented by General Formula (b1).

In the resist composition according to the present embodiment, among the above, the component (B1) is more preferably a compound represented by General Formula (b1-2).

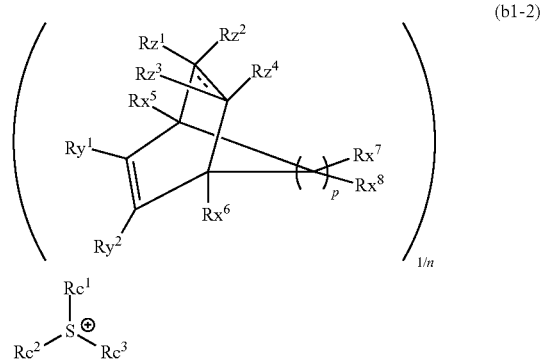

(b1-2)

[In the formula, $Rx^5$ and $Rx^6$ each independently represent a hydrocarbon group which may have a substituent or a hydrogen atom. $Rx^7$ and $Rx^8$ each independently represent a hydrocarbon group which may have a substituent or a hydrogen atom, or may be bonded to each other to form a ring structure, p is 1 or 2, and in a case where p=2, a plurality of $Rx^7$'s and $Rx^8$'s may be each different from each other. $Ry^1$ and $Ry^2$ each independently represent a hydrocarbon group which may have a substituent or a hydrogen atom, or may be bonded to each other to form a ring structure.

⋯⋯ is a double bond or a single bond. In a case of being allowed in terms of valence, $Rz^1$ to $Rz^4$ each independently represents a hydrocarbon group which may have a substituent or a hydrogen atom, or two or more thereof may be bonded to each other to form a ring structure. However, $Rx^5$ and $Rx^6$, $Rx^7$ and $Rx^8$, $Ry^1$ and $Ry^2$, or two or more of $Rz^1$ to $Rz^4$ are bonded to each other to form an aromatic ring. Further, at least one of $Rx^5$ to $Rx^8$, $Ry^1$ and $Ry^2$, and $Rz^1$ to $Rz^4$ has an anion group represented by General Formula (b0-r-an1), and an entire anion moiety is an n-valent anion, n represents an integer of 1 or greater.

$Rc^1$ represents an aryl group having an electron-withdrawing group. Rc2 and Rc3 each independently represents an aryl group which may have a substituent or are bonded to each other to form a ring together with a sulfur atom in the formula.]

(b0-r-an1)

[In the formula, $Yb^0$ represents a divalent linking group or a single bond. $Vb^0$ represents a single bond, an alkylene group, or a fluorinated alkylene group. * represents a bonding site.]

The anion moiety of the compound represented by General Formula (b1-2) is the same as the anion represented by General Formula (b1-an1).

The cation moiety of the compound represented by General Formula (b1-2) is the same as the cation of the compound represented by General Formula (b1).

In the resist composition according to the present embodiment, among the above, the component (B1) is still more preferably a compound represented by General Formula (b1-3).

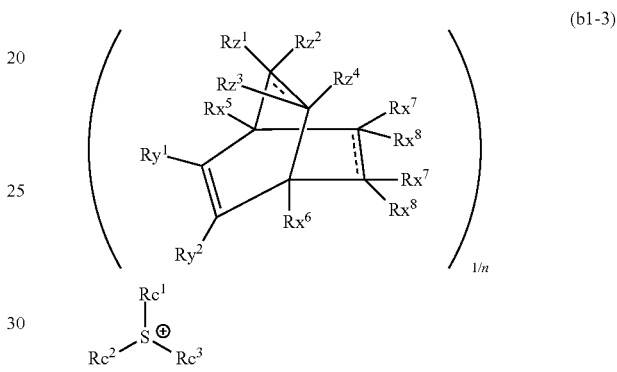

(b1-3)

[In the formula, $Rx^5$ and $Rx^6$ each independently represent a hydrocarbon group which may have a substituent or a hydrogen atom. The plurality of $Rx^7$'s and $Rx^8$'s each independently represent a hydrocarbon group which may have a substituent or a hydrogen atom, or two or more thereof may be bonded to each other to form a ring structure. $Ry^1$ and $Ry^2$ each independently represent a hydrocarbon group which may have a substituent or a hydrogen atom, or may be bonded to each other to form a ring structure.

⋯⋯ is a double bond or a single bond. In a case of being allowed in terms of valence, $Rz^1$ to $Rz^4$ each independently represents a hydrocarbon group which may have a substituent or a hydrogen atom, or two or more thereof may be bonded to each other to form a ring structure. However, $Rx^5$ and $Rx^6$, two or more of $Rx^7$'s and $Rx^8$'s, $Ry^1$ and $Ry^2$, or two or more of $Rz^1$ to $Rz^4$ are bonded to each other to form an aromatic ring. Further, at least one of $Rx^5$ to $Rx^8$, $Ry^1$ and $Ry^2$, and $Rz^1$ to $Rz^4$ has an anion group represented by General Formula (b0-r-an1), and an entire anion moiety is an n-valent anion, n represents an integer of 1 or greater.

$Rc^1$ represents an aryl group having an electron-withdrawing group. Rc2 and Rc3 each independently represents an aryl group which may have a substituent or are bonded to each other to form a ring together with a sulfur atom in the formula.]

(b0-r-an1)

[In the formula, $Yb^0$ represents a divalent linking group or a single bond. $Vb^0$ represents a single bond, an alkylene group, or a fluorinated alkylene group.

* represents a bonding site.]

The anion moiety of the compound represented by General Formula (b1-3) is the same as the anion represented by General Formula (b1-an2).

The cation moiety of the compound represented by General Formula (b1-3) is the same as the cation of the compound represented by General Formula (b1).

In the resist composition according to the present embodiment, among the above, the component (B1) is particularly more preferably a compound represented by General Formula (b1-4).

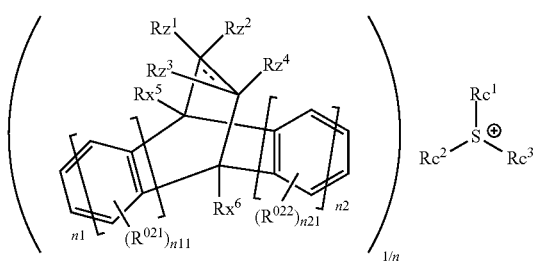

(b1-4)

[In the formula, $Rx^5$ and $Rx^6$ each independently represent a hydrocarbon group which may have a substituent or a hydrogen atom.

----- is a double bond or a single bond. In a case of being allowed in terms of valence, $Rz^1$ to $Rz^4$ each independently represents a hydrocarbon group which may have a substituent or a hydrogen atom, or two or more thereof may be bonded to each other to form a ring structure. However, at least one of $Rx^5$ and $Rx^6$ and $Rz^1$ to $Rz^4$ has an anion group represented by General Formula (b0-r-an1), and an entire anion moiety is an n-valent anion, n represents an integer of 1 or greater. $R^{021}$ represents an alkyl group, an alkoxy group, a halogen atom, a halogenated alkyl group, a hydroxyl group, a carbonyl group, or a nitro group, n1 represents an integer in a range of 1 to 3. n11 represents an integer in a range of 0 to 8. $R^{022}$ represents an alkyl group, an alkoxy group, a halogen atom, a halogenated alkyl group, a hydroxyl group, a carbonyl group, or a nitro group. n2 represents an integer in a range of 1 to 3. n21 represents an integer in a range of 0 to 8.

$Rc^1$ represents an aryl group having an electron-withdrawing group. Rc2 and Rc3 each independently represents an aryl group which may have a substituent or are bonded to each other to form a ring together with a sulfur atom in the formula.]

$$*—Yb^0-Vb^0-SO_3^\ominus \quad (b0\text{-}r\text{-}an1)$$

[In the formula, $Yb^0$ represents a divalent linking group or a single bond. $Vb^0$ represents a single bond, an alkylene group, or a fluorinated alkylene group.
* represents a bonding site.]

The anion moiety of the compound represented by General Formula (b1-4) is the same as the anion represented by General Formula (b1-an3).

The cation moiety of the compound represented by General Formula (b1-4) is the same as the cation of the compound represented by General Formula (b1).

Suitable specific examples of the component (B1) in the present embodiment are shown below.

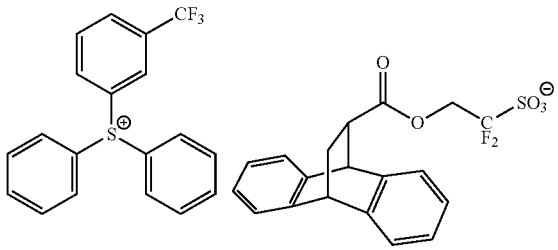

(B1-1)

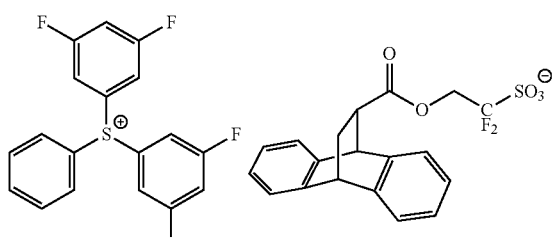

(B1-2)

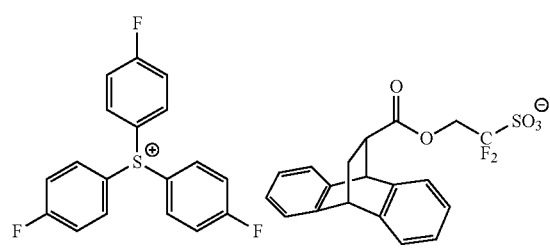

(B1-3)

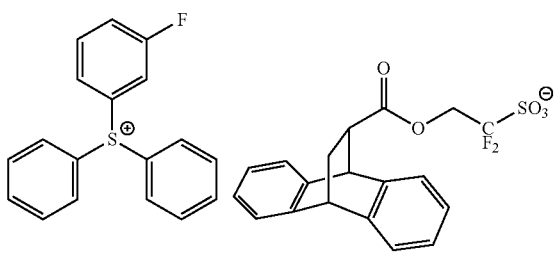

(B1-4)

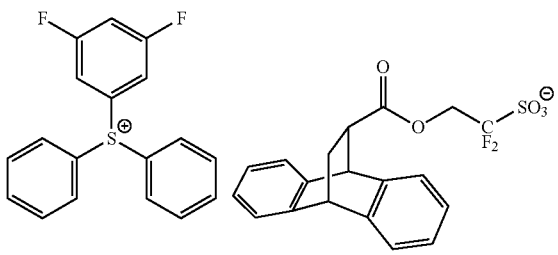

(B1-5)

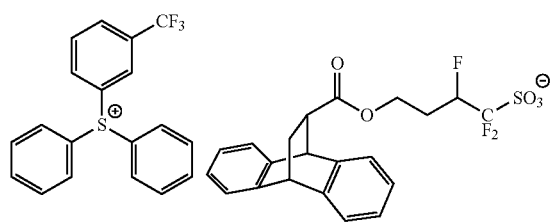

(B1-6)

In the resist composition according to the present embodiment, the component (B1) may be used alone or in a combination of two or more kinds thereof.

In the resist composition according to the present embodiment, the content of the component (B1) is preferably in a range of 1 to 50 parts by mass, more preferably in a range of 3 to 30 parts by mass, and still more preferably in a range of 5 to 25 parts by mass with respect to 100 parts by mass of the component (A).

In a case where the content of the component (B1) is equal to or greater than the lower limit value of the above preferred range, the lithography characteristics such as sensitivity, resolution performance, roughness reduction property, and pattern rectangularity are further improved in resist pattern formation. On the other hand, in a case where the content thereof is equal to or lower than the upper limit value of the preferred range, a uniform solution is easily obtained when each of the components of the resist composition is dissolved in an organic solvent, and the storage stability as a resist composition is further improved.

<<Second Acid Generator>>

The second acid generator is the compound (B2) composed of a cation moiety and an anion moiety having a molar volume of 250 cm$^3$/mol or less, and the molar volume of the anion moiety of the component (B2) is smaller than that of the above-described component (B1).

Specific examples of the second acid generator include onium salt-based acid generators such as an iodonium salt and a sulfonium salt.

Examples of the onium salt-based acid generator as the component (B2) include a compound represented by General Formula (b2-1) (hereinafter, also referred to as a "component (b2-1)"), a compound represented by General Formula (b2-2) (hereinafter, also referred to as a "component (b2-2)"), and a compound represented by General Formula (b2-3) (hereinafter, also referred to as a "component (b2-3)"). However, the molar volumes of the anion moiety of the components (b2-1) to (b2-3) are each 250 cm$^3$/mol or less.

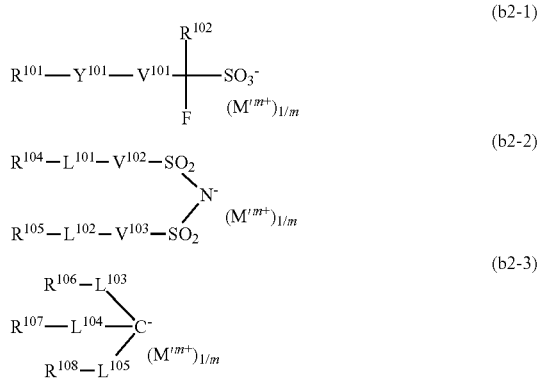

[In the formulae, $R^{101}$ and $R^{104}$ to $R^{108}$ each independently represent a cyclic group which may have a substituent, a chain-like alkyl group which may have a substituent, or a chain-like alkenyl group which may have a substituent. $R^{104}$ and $R^{105}$ may be bonded to each other to form a ring structure. $R^{102}$ represents a fluorinated alkyl group having 1 to 5 carbon atoms or a fluorine atom. $Y^{101}$ represents a divalent linking group containing an oxygen atom or a single bond. $V^{101}$ to $V^{103}$ each independently represents a single bond, an alkylene group, or a fluorinated alkylene group. $L^{101}$ and $L^{102}$ each independently represent a single bond or an oxygen atom. $L^{103}$ to $L^{105}$ each independently represents a single bond, —CO—, or —SO$_2$—. m represents an integer of 1 or greater, and $M'^{m+}$ represents an m-valent onium cation.]

{Anion Moiety}

Anion in Component (b2-1)

In General Formula (b2-1), $R^{101}$ represents a cyclic group which may have a substituent, a chain-like alkyl group which may have a substituent, or a chain-like alkenyl group which may have a substituent.

Cyclic Group which May have Substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. The aliphatic hydrocarbon group may be saturated or unsaturated. In general, it is preferable that the aliphatic hydrocarbon group be saturated.

The aromatic hydrocarbon group as $R^{101}$ is a hydrocarbon group having an aromatic ring. The aromatic hydrocarbon group preferably has 3 to 30 carbon atoms, more preferably 5 to 30, still more preferably 5 to 20, particularly preferably 6 to 15, and most preferably 6 to 10. However, the number of carbon atoms in a substituent is not included in the number of carbon atoms.

Specific examples of the aromatic ring the aromatic hydrocarbon group has as $R^{101}$ include benzene, fluorene, naphthalene, anthracene, phenanthrene, biphenyl, or an aromatic heterocyclic ring in which some carbon atoms constituting any of these aromatic rings have been substituted with a hetero atom. Examples of the hetero atom in the aromatic heterocyclic rings include an oxygen atom, a sulfur atom, and a nitrogen atom.

Specific examples of the aromatic hydrocarbon group as $R^{101}$ include a group in which one hydrogen atom has been removed from the above-described aromatic ring (an aryl group; for example, a phenyl group or a naphthyl group) and a group in which one hydrogen atom in the aromatic ring has been substituted with an alkylene group (an arylalkyl group such as a benzyl group, a phenethyl group, a 1-naphthylmethyl group, a 2-naphthylmethyl group, 1-naphthylethyl group, or a 2-naphthylethyl group). The alkylene group (an alkyl chain in the arylalkyl group) preferably has 1 to 4 carbon atoms, more preferably 1 or 2 carbon atoms, and particularly preferably 1 carbon atom.

Examples of the cyclic aliphatic hydrocarbon group as $R^{101}$ include aliphatic hydrocarbon groups containing a ring in the structure thereof.

Examples of the aliphatic hydrocarbon group containing a ring in the structure thereof include an alicyclic hydrocarbon group (a group in which one hydrogen atom has been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed in a linear or branched aliphatic hydrocarbon group.

The alicyclic hydrocarbon group preferably has 3 to 20 carbon atoms and more preferably 3 to 12 carbon atoms.

The alicyclic hydrocarbon group may be a polycyclic group or a monocyclic group. The monocyclic alicyclic hydrocarbon group is preferably a group in which one or more hydrogen atoms have been removed from a monocycloalkane. The monocycloalkane preferably has 3 to 6 carbon atoms, and specific examples thereof include cyclopentane and cyclohexane. The polycyclic alicyclic hydrocarbon group is preferably a group in which one or more hydrogen atoms have been removed from a polycycloalkane, and the polycycloalkane preferably has 7 to 30 carbon atoms. Among the above, the polycycloalkane is preferably a polycycloalkane having a bridged ring-based polycyclic skeleton such as adamantane, norbornane, or isobornane.

Among them, the cyclic aliphatic hydrocarbon group as $R^{101}$ is preferably a group in which one or more hydrogen atoms have been removed from a monocycloalkane or a polycycloalkane, more preferably a group in which one hydrogen atom has been removed from a polycycloalkane, particularly preferably an adamantyl group or a norbornyl group, and most preferably an adamantyl group.

The linear aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and most preferably 1 to 3 carbon atoms. The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group which may be bonded to the alicyclic hydrocarbon group preferably has 2 to 10 carbon atoms, more preferably 3 to 6 carbon atoms, still more preferably 3 or 4 carbon atoms, and most preferably 3 carbon atoms. The branched aliphatic hydrocarbon group is preferably a branched alkylene group, and specific examples thereof include alkylalkylene groups, for example, alkylmethylene groups such as —$CH(CH_3)$>, —$CH(CH_2CH_3)$>, —$C(CH_3)_2$—, —$C(CH_3)(CH_2CH_3)$>, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$>, —$C(CH_3)_2CH_2$—, —$CH(CH_2CH_3)CH_2$—, and —$C(CH_2CH_3)_2$—$CH_2$—; alkyltrimethylene groups such as —$CH(CH_3)_2CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. The alkyl group in the alkylalkylene group is preferably a linear alkyl group having 1 to 5 carbon atoms.

The cyclic hydrocarbon group as $R^{101}$ may contain a hetero atom such as a heterocyclic ring. Specific examples thereof include lactone-containing cyclic groups each represented by General Formulae (a2-r-1) to (a2-r-7), —$SO_2$— containing cyclic groups each represented by General Formulae (a5-r-1) to (a5-r-4), and other heterocyclic groups each represented by Chemical Formulae (r-hr-1) to (r-hr-16).

Examples of the substituent of the cyclic group as $R^{101}$ include an alkyl group, an alkoxy group, a halogen atom, a halogenated alkyl group, a hydroxyl group, a carbonyl group, and a nitro group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

The halogen atom as the substituent is preferably a fluorine atom.

Examples of the above-described halogenated alkyl group as the substituent include a group in which part or all of hydrogen atoms in an alkyl group having 1 to 5 carbon atoms such as a methyl group, an ethyl group, a propyl group, an n-butyl group, or a tert-butyl group have been substituted with the above-described halogen atom.

The carbonyl group as the substituent is a group that substitutes a methylene group (—$CH_2$—) constituting the cyclic hydrocarbon group.

Chain-Like Alkyl Group which May have Substituent:

The chain-like alkyl group as $R^{101}$ may be linear or branched.

The linear alkyl group preferably has 1 to 20 carbon atoms, more preferably 1 to carbon atoms, still more preferably 1 to 5 carbon atoms, and particularly preferably 1 carbon atom.

The branched alkyl group preferably has 3 to 20 carbon atoms, more preferably 3 to 15, and most preferably 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-Like Alkenyl Group which May have Substituent:

A chain-like alkenyl group as $R^{101}$ may be linear or branched, and the chain-like alkenyl group preferably has 2 to 10 carbon atoms, more preferably 2 to 5 carbon atoms, still more preferably 2 to 4 carbon atoms, and particularly preferably 3 carbon atoms. Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group.

Among the above, the chain-like alkenyl group is preferably a linear alkenyl group, more preferably a vinyl group or a propenyl group, and particularly preferably a vinyl group.

Examples of the substituent in the chain-like alkyl group or alkenyl group as $R^{101}$, include an alkoxy group, a halogen atom, a halogenated alkyl group, a hydroxyl group, a carbonyl group, a nitro group, an amino group, and a cyclic group as $R^{101}$.

Among the above, $R^{101}$ is preferably a cyclic group which may have a substituent or a chain-like alkyl group which may have a substituent and more preferably a polycyclic alicyclic hydrocarbon group, a monocyclic alicyclic hydrocarbon group, or a chain-like alkyl group which may have a substituent.

In General Formula (b2-1), $Y^{101}$ represents a single bond or a divalent linking group containing an oxygen atom.

In a case where $Y^{101}$ represents a divalent linking group containing an oxygen atom, $Y^{101}$ may contain an atom other than the oxygen atom. Examples of atom other than the oxygen atom include a carbon atom, a hydrogen atom, a sulfur atom, and a nitrogen atom.

Examples of divalent linking groups containing an oxygen atom include non-hydrocarbon-based oxygen atom-containing linking groups such as an oxygen atom (an ether bond; —O—), an ester bond (—C(=O)—O—), an oxycarbonyl group (—O—C(=O)—), an amide bond (—C(=O)—NH—), a carbonyl group (—C(=O)—), or a carbonate bond (—O—C(=O)—O—); and combinations of the above-described non-hydrocarbon-based oxygen atom-containing linking groups with an alkylene group. Furthermore, a sulfonyl group (—$SO_2$—) may be linked to the combination. Examples of divalent linking groups containing an oxygen atom include linking groups each represented by General Formulae (y-a1-1) to (y-a1-7) described above.

$Y^{101}$ preferably represents a divalent linking group containing an ester bond or a divalent linking group containing an ether bond and more preferably linking groups each represented by General Formulae (y-a1-1) to (y-a1-5).

In General Formula (b2-1), $V^{101}$ represents a single bond, an alkylene group, or a fluorinated alkylene group. The alkylene group and the fluorinated alkylene group as $V^{101}$ preferably have 1 to 4 carbon atoms. Examples of the fluorinated alkylene group as $V^{101}$ include a group in which part or all of hydrogen atoms in the alkylene group as $V^{101}$ have been substituted with a fluorine atom. Among these examples, as $V^{101}$, a single bond or a fluorinated alkylene group having 1 to 4 carbon atoms is preferable.

In General Formula (b2-1), $R^{102}$ represents a fluorine atom or a fluorinated alkyl group having 1 to 5 carbon atoms. $R^{102}$ preferably represents a fluorine atom or a perfluoroalkyl group having 1 to 5 carbon atoms and more preferably a fluorine atom.

As a specific example of the anion moiety represented by Formula (b2-1), in a case where $Y^{101}$ represents a single bond, a fluorinated alkyl sulfonate anion such as a trifluoromethanesulfonate anion or a perfluorobutanesulfonate anion can be mentioned; and in a case where $Y^{101}$ represents a divalent linking group containing an oxygen atom, anions represented by any one of Formulae (an-1) to (an-3) shown below can be mentioned.

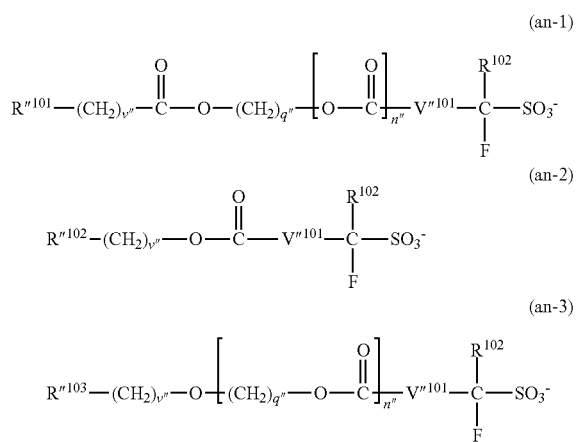

[In the formula, $R'''^{101}$ represents an aliphatic cyclic group which may have a substituent or a chain-like alkyl group which may have a substituent. $R'''^{102}$ represents an aliphatic cyclic group which may have a substituent or a chain-like alkyl group which may have a substituent. $R'''^{103}$ represents an aliphatic cyclic group which may have a substituent or a chain-like alkyl group which may have a substituent. $V'''^{101}$ represents a single bond, an alkylene group having 1 to 4 carbon atoms, or a fluorinated alkylene group having 1 to 4 carbon atoms. $R^{102}$ represents a fluorine atom or a fluorinated alkyl group having 1 to 5 carbon atoms. Each v'' independently represents an integer in a range of 0 to 3, each q'' independently represent an integer in a range of 0 to 20, and n'' represents 0 or 1.]

The aliphatic cyclic group as $R'''^{101}$, $R'''^{102}$, and $R'''^{103}$ which may have a substituent is preferably the group exemplified as the cyclic aliphatic hydrocarbon group as $R^{101}$ in General Formula (b2-1). Examples of the substituent include the same group as the substituent with which the cyclic aliphatic hydrocarbon group as $R^{101}$ in General Formula (b2-1) may be substituted.

The chain-like alkyl group which may have a substituent, as $R'''^{101}$ to $R'''^{103}$, is preferably the group exemplified as the chain-like alkyl group as $R^{101}$ in General Formula (b2-1).

$V'''^{101}$ and $R^{102}$ are the same as $V'''^{101}$ and $R^{102}$ in Formulae (b2-1).

Each v'' independently represents an integer in a range of 0 to 3 and preferably represent 0 or 1.

Each q'' independently represents an integer in a range of 0 to 20, preferably represents an integer in a range of 1 to 10, more preferably an integer in a range of 1 to 5, still more preferably 1, 2, or 3, and particularly preferably 1 or 2.

n'' represents 0 or 1 and preferably represents 0.

Anion in Component (b2-2)

In General Formula (b2-2), $R^{104}$ and $R^{105}$ each independently represent a cyclic group which may have a substituent, a chain-like alkyl group which may have a substituent, or a chain-like alkenyl group which may have a substituent, and examples thereof include the same group as $R^{101}$ in General Formula (b2-1). However, $R^{104}$ and $R^{105}$ may be bonded to each other to form a ring.

$R^{104}$ and $R^{105}$ are preferably a chain-like alkyl group which may have a substituent and more preferably a linear or branched alkyl group or a linear or branched fluorinated alkyl group.

The chain-like alkyl group preferably has 1 to 10 carbon atoms, more preferably 1 to 7 carbon atoms, and still more preferably 1 to 3 carbon atoms. It is preferable that the number of carbon atoms in the chain-like alkyl group as $R^{104}$ and $R^{105}$ be small since the solubility in a solvent for a resist is also excellent in this range of the number of carbon atoms. Further, in the chain-like alkyl group as $R^{104}$ and $R^{105}$, it is preferable that the number of hydrogen atoms substituted with a fluorine atom be large since the acid strength increases and the transparency to high energy radiation of 250 nm or less or electron beams is improved. The proportion of fluorine atoms in the chain-like alkyl group, that is, the fluorination ratio is preferably in a range of 70% to 100% and more preferably in a range of 90% to 100%, and it is most preferable that the chain-like alkyl group be a perfluoroalkyl group in which all hydrogen atoms be substituted with a fluorine atom.

In General Formula (b2-2), $V^{102}$ and $V^{103}$ each independently represent a single bond, an alkylene group, or a fluorinated alkylene group, and examples thereof include those that are the same as $V^{101}$ in General Formula (b2-1).

In General Formula (b2-2), $L^{101}$ and $L^{102}$ each independently represent a single bond or an oxygen atom.

Anion in Component (b2-3)

In General Formula (b2-3), $R^{106}$ to $R^{108}$ each independently represents a cyclic group which may have a substituent, a chain-like alkyl group which may have a substituent, or a chain-like alkenyl group which may have a substituent, and examples thereof include the same group as $R^{101}$ in General Formula (b2-1).

In General Formula (b2-3), $L^{103}$ to $L^{105}$ each independently represents a single bond, —CO—, or —SO$_2$—.

Among the above, the anion moiety of the component (B2) is preferably an anion moiety of the component (b2-1) and more preferably a fluorinated alkyl sulfonate anion or an anion represented by General Formulae (an-1).

Suitable specific examples of the anion moiety of the component (B2) are shown below.

(b2-an-1)

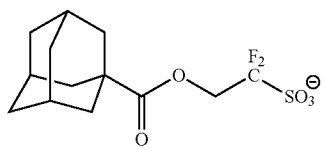

(b2-an-2)

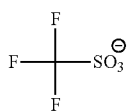

(b2-an-3)

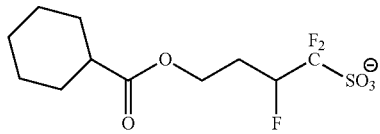

{Cation Moiety}

In Formulae (b-1), (b-2), and (b-3), $M'^{m+}$ represents an m-valent onium cation. Among them, a sulfonium cation and an iodonium cation are preferable, m represents an integer of 1 or greater.]

Preferred examples of the cation moiety $((M'^{m+})_{1/m})$ include organic cations each represented by General Formulae (ca-1) to (ca-5).

(ca-1)

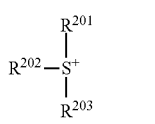

(ca-2)

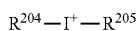

(ca-3)

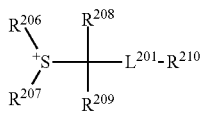

(ca-4)

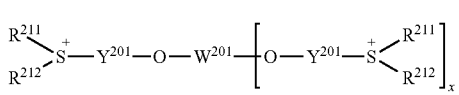

(ca-5)

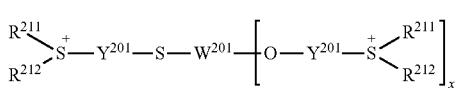

[In the formula, $R^{201}$ to $R^{207}$, $R^{211}$, and $R^{212}$ each independently represent an aryl group, an alkyl group, or an alkenyl group, each of which may have a substituent. $R^{201}$ to $R^{203}$, $R^{206}$ and $R^{207}$, or $R^{211}$ and $R^{212}$ may be bonded to each other to form a ring together with the sulfur atoms in the formulae. $R^{208}$ and $R^{209}$ each independently represent a hydrogen atom or an alkyl group having 1 to 5 carbon atoms. $R^{210}$ represents an aryl group which may have a substituent, an alkyl group which may have a substituent, an alkenyl group which may have a substituent, or a —SO₂—-containing cyclic group which may have a substituent. $L^{201}$ represents —C(=O)— or —C(=O)—O—. Each $Y^{201}$ independently represent an arylene group, an alkylene group, or an alkenylene group, x represents 1 or 2. $W^{201}$ represents an (x+1)-valent linking group.]

In General Formulae (ca-1) to (ca-5), examples of the aryl group as $R^{201}$ to $R^{207}$, $R^{211}$, and $R^{212}$ include an unsubstituted aryl group having 6 to 20 carbon atoms, and a phenyl group or a naphthyl group is preferable.

The alkyl group as $R^{201}$ to $R^{207}$, $R^{211}$, and $R^{212}$ is a chain-like or cyclic alkyl group and preferably has 1 to 30 carbon atoms.

The alkenyl group as $R^{201}$ to $R^{207}$, $R^{211}$, and $R^{212}$ preferably has 2 to 10 carbon atoms.

Examples of the substituent which may be included in $R^{201}$ to $R^{207}$ and $R^{210}$ to $R^{212}$ include an alkyl group, a halogen atom, a halogenated alkyl group, a carbonyl group, a cyano group, an amino group, an aryl group, and groups each represented by General Formulae (ca-r-1) to (ca-r-7) shown below.

(ca-r-1)

(ca-r-2)

(ca-r-3)

(ca-r-4)

(ca-r-5)

(ca-r-6)

(ca-r-7)

[In the formulae, each $R'^{201}$ independently represent a hydrogen atom, a cyclic group which may have a substituent, a chain-like alkyl group which may have a substituent, or a chain-like alkenyl group which may have a substituent.]

Cyclic Group which May have Substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. The aliphatic hydrocarbon group may be saturated or unsaturated. In general, it is preferable that the aliphatic hydrocarbon group be saturated.

The aromatic hydrocarbon group as $R'^{201}$ is a hydrocarbon group having an aromatic ring. The aromatic hydrocarbon group preferably has 3 to 30 carbon atoms, more preferably 5 to 30 carbon atoms, still more preferably 5 to 20 carbon atoms, particularly preferably 6 to 15 carbon atoms, and most preferably 6 to 10 carbon atoms. Here, the number of carbon atoms in a substituent is not included in the number of carbon atoms.

Specific examples of the aromatic ring which the aromatic hydrocarbon group has as $R'^{201}$ include benzene, fluorene, naphthalene, anthracene, phenanthrene, biphenyl, or an aromatic heterocyclic ring in which some carbon atoms constituting any of these aromatic rings have been substituted with a hetero atom. Examples of the hetero atom in the aromatic heterocyclic rings include an oxygen atom, a sulfur atom, and a nitrogen atom.

Specific examples of the aromatic hydrocarbon group as $R'^{201}$ include a group in which one hydrogen atom has been removed from the above-described aromatic ring (an aryl group; for example, a phenyl group or a naphthyl group) and a group in which one hydrogen atom in the aromatic ring has been substituted with an alkylene group (for example, an arylalkyl group such as a benzyl group, a phenethyl group, a 1-naphthylmethyl group, a 2-naphthylmethyl group, 1-naphthylethyl group, or a 2-naphthylethyl group). The alkylene group (an alkyl chain in the arylalkyl group) preferably has 1 to 4 carbon atoms, more preferably 1 or 2 carbon atoms, and particularly preferably 1 carbon atom.

Examples of the cyclic aliphatic hydrocarbon group as $R'^{201}$ include aliphatic hydrocarbon groups containing a ring in the structure thereof.

Examples of the aliphatic hydrocarbon group containing a ring in the structure thereof include an alicyclic hydrocarbon group (a group in which one hydrogen atom has been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed in a linear or branched aliphatic hydrocarbon group.

The alicyclic hydrocarbon group preferably has 3 to 20 carbon atoms and more preferably 3 to 12 carbon atoms.

The alicyclic hydrocarbon group may be a polycyclic group or a monocyclic group. The monocyclic alicyclic hydrocarbon group is preferably a group in which one or more hydrogen atoms have been removed from a monocycloalkane. The monocycloalkane preferably has 3 to 6 carbon atoms, and specific examples thereof include cyclopentane and cyclohexane. The polycyclic alicyclic hydrocarbon group is preferably a group in which one or more hydrogen atoms have been removed from a poly cycloalkane, and the polycycloalkane preferably has 7 to 30 carbon atoms. Among the above, the polycycloalkane is more preferably a polycycloalkane having a bridged ring-based polycyclic skeleton, such as adamantane, norbornane, isobornane, tri cyclodecane, or tetracyclododecane; or a poly cycloalkane having a condensed ring-based polycyclic skeleton, such as a cyclic group having a steroid skeleton.

Among them, the cyclic aliphatic hydrocarbon group as $R'^{201}$ is preferably a group in which one or more hydrogen atoms have been removed from a monocycloalkane or a polycycloalkane, more preferably a group in which one hydrogen atom has been removed from a polycycloalkane, particularly preferably an adamantyl group or a norbornyl group, and most preferably an adamantyl group.

The linear or branched aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and particularly preferably 1 to 3 carbon atoms.

The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group is preferably a branched alkylene group, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$>, —$C(CH_3)(CH_2CH_2CH_3)$>, and —$C(CH_2CH_3)_2$—; alkylethylene groups such as —$CH(CH_3)CH_2$—, —$CH(CH_3)CH(CH_3)$>, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. The alkyl group in the alkylalkylene group is preferably a linear alkyl group having 1 to 5 carbon atoms.

The cyclic hydrocarbon group as $R'^{201}$ may contain a hetero atom such as a heterocyclic ring. Specific examples thereof include lactone-containing cyclic groups each represented by General Formulae (a2-r-1) to (a2-r-7), —$SO_2$— containing cyclic groups each represented by General Formulae (a5-r-1) to (a5-r-4), and other heterocyclic groups each represented by Chemical Formulae (r-hr-1) to (r-hr-16).

Examples of the substituent of the cyclic group as $R'^{201}$ include an alkyl group, an alkoxy group, a halogen atom, a halogenated alkyl group, a hydroxyl group, a carbonyl group, and a nitro group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

The halogen atom as the substituent is preferably a fluorine atom.

Examples of the above-described halogenated alkyl group as the substituent include a group in which part or all of hydrogen atoms in an alkyl group having 1 to 5 carbon atoms such as a methyl group, an ethyl group, a propyl group, an n-butyl group, or a tert-butyl group have been substituted with the above-described halogen atom.

The carbonyl group as the substituent is a group that substitutes a methylene group (—$CH_2$—) constituting the cyclic hydrocarbon group.

Chain-Like Alkyl Group which May have Substituent:

The chain-like alkyl group as $R'^{201}$ may be linear or branched.

The linear alkyl group preferably has 1 to 20 carbon atoms, more preferably 1 to carbon atoms, and most preferably 1 to 10 carbon atoms.

The branched alkyl group preferably has 3 to 20 carbon atoms, more preferably 3 to 15 carbon atoms, and most preferably 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-Like Alkenyl Group which May have Substituent:

Such a chain-like alkenyl group as $R'^{201}$ may be linear or branched, preferably has 2 to 10 carbon atoms, more preferably 2 to 5 carbon atoms, still more preferably 2 to 4 carbon atoms, and particularly preferably 3 carbon atoms. Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group.

Among the above, the chain-like alkenyl group is preferably a linear alkenyl group, more preferably a vinyl group or a propenyl group, and particularly preferably a vinyl group.

Examples of the substituent in the chain-like alkyl group or alkenyl group as $R'^{201}$, an alkoxy group, a halogen atom, a halogenated alkyl group, a hydroxyl group, a carbonyl group, a nitro group, an amino group, a cyclic group as $R'^{201}$ or the like may be used.

As the cyclic group which may have a substituent, the chain-like alkyl group which may have a substituent, or the chain-like alkenyl group which may have a substituent, as $R'^{201}$, a group that is the same as the acid-dissociable group represented by above-described General Formula (a1-r-2) can be mentioned as the cyclic group which may have a substituent or the chain-like alkyl group which may have a substituent, in addition to the groups described above.

Among them, $R'^{201}$ is preferably a cyclic group which may have a substituent and more preferably a cyclic hydrocarbon group which may have a substituent. More specific examples thereof preferably include a phenyl group, a naphthyl group, a group in which one or more hydrogen atoms have been removed from a polycycloalkane, lactone-containing cyclic groups each represented by any one of General Formulae (a2-r-1) to (a2-r-7), and —SO$_2$—-containing cyclic groups each represented by any one of General Formulae (a5-r-1) to (a5-r-4).

In General Formulae (ca-1) to (ca-5), in a case where $R^{201}$ to $R^{203}$, $R^{206}$ and $R^{207}$, or $R^{211}$ and $R^{212}$ are bonded to each other to form a ring with a sulfur atom in the formula, these groups may be bonded to each other via a hetero atom such as a sulfur atom, an oxygen atom or a nitrogen atom, or a functional group such as a carbonyl group, —SO—, —SO$_2$—, —SO$_3$—, —COO—, —CONH—, or —N(R$_N$)— (here, R$_N$ represents an alkyl group having 1 to 5 carbon atoms). As the ring to be formed, a ring containing the sulfur atom in the formula in the ring skeleton thereof is preferably a 3- to 10-membered ring and particularly preferably a 5- to 7-membered ring including the sulfur atom. Specific examples of the ring to be formed include a thiophene ring, a thiazole ring, a benzothiophene ring, a benzothiophene ring, a dibenzothiophene ring, a 9H-thioxanthene ring, a thioxanthone ring, a thianthrene ring, a phenoxathiin ring, a tetrahydrothiophenium ring, and a tetrahydrothiopyranium ring.

$R^{208}$ and $R^{209}$ each independently represent a hydrogen atom or an alkyl group having 1 to 5 carbon atoms and are preferably a hydrogen atom or an alkyl group having 1 to 3 carbon atoms. In a case where $R^{208}$ and $R^{209}$ each independently represent an alkyl group, $R^{208}$ and $R^{209}$ may be bonded to each other to form a ring.

$R^{210}$ represents an aryl group which may have a substituent, an alkyl group which may have a substituent, an alkenyl group which may have a substituent, or a —SO$_2$—-containing cyclic group which may have a substituent.

Examples of the aryl group as $R^{210}$ include an unsubstituted aryl group having 6 to 20 carbon atoms, and a phenyl group or a naphthyl group is preferable.

The alkyl group as $R^{210}$, a chain-like or cyclic alkyl group having 1 to 30 carbon atoms is preferable.

The alkenyl group as $R^{210}$ preferably has 2 to 10 carbon atoms.

The —SO$_2$—-containing cyclic group which may have a substituent, as $R^{210}$, is preferably a "—SO$_2$—-containing polycyclic group", and more preferably a group represented by General Formula (a5-r-1).

Each $Y^{201}$ independently represent an arylene group, an alkylene group, or an alkenylene group.

Examples of the arylene group as $Y^{201}$ include groups in which one hydrogen atom has been removed from an aryl group mentioned as the aromatic hydrocarbon group represented by $R^{101}$ in General Formula (b-1) described above.

Examples of the alkylene group and alkenylene group as $Y^{201}$ include groups in which one hydrogen atom has been removed from the chain-like alkyl group or the chain-like alkenyl group as $R^{101}$ in General Formula (b-1) described above.

In General Formula (ca-4), x represents 1 or 2.

$W^{201}$ represents an (x+1)-valent linking group, that is, a divalent or trivalent linking group.

The divalent linking group as $W^{201}$ is preferably a divalent hydrocarbon group which may have a substituent, and as examples thereof include the same divalent hydrocarbon group, which may have a substituent, as Ya$^{21}$ in General Formula (a2-1). The divalent linking group as $W^{201}$ may be linear, branched or cyclic, and cyclic is more preferable. Among these, an arylene group having both terminals at which two carbonyl groups are combined is preferable. Examples of the arylene group include a phenylene group and a naphthylene group, and a phenylene group is particularly preferable.

Examples of the trivalent linking group as $W^{201}$ include a group in which one hydrogen atom has been removed from the above-described divalent linking group as $W^{201}$ and a group in which the divalent linking group has been bonded to another divalent linking group. The trivalent linking group as $W^{201}$ is preferably a group in which two carbonyl groups are bonded to an arylene group.

Specific examples of the suitable cation represented by General Formula (ca-1) include cations each represented by Chemical Formulae (ca-1-1) to (ca-1-70) shown below.

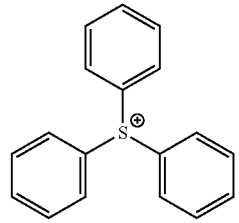

(ca-1-1)

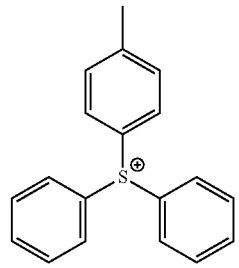

(ca-1-2)

(ca-1-3)
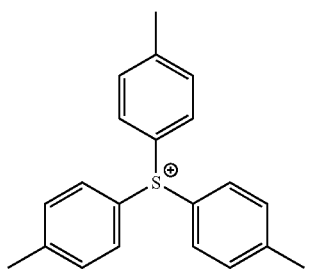
(ca-1-4)
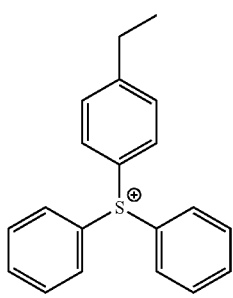
(ca-1-5)
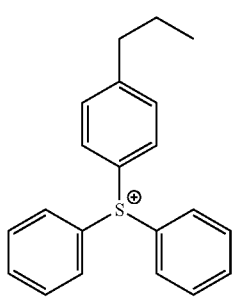
(ca-1-6)
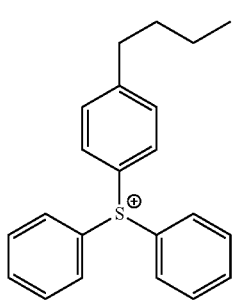
(ca-1-7)
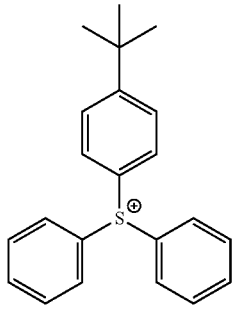
(ca-1-8)
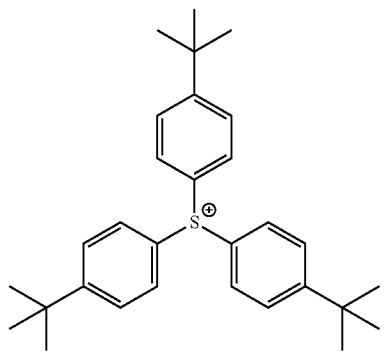
(ca-1-9)
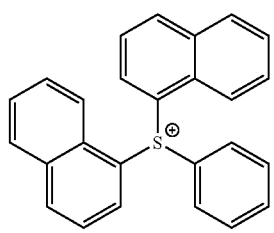
(ca-1-10)
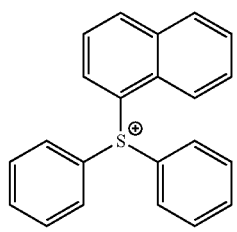
(ca-1-11)
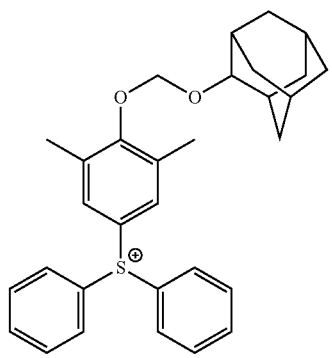
(ca-1-12)
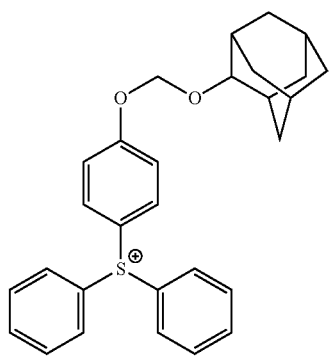

(ca-1-13)
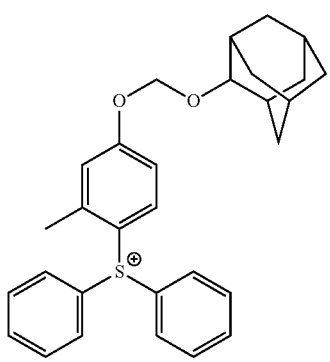
(ca-1-17)
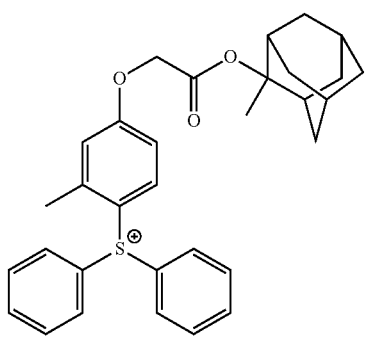
(ca-1-14)
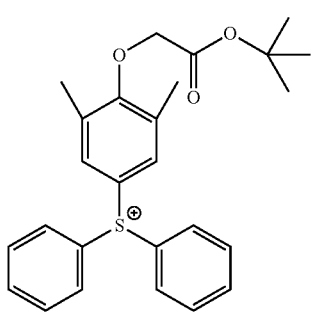
(ca-1-18)
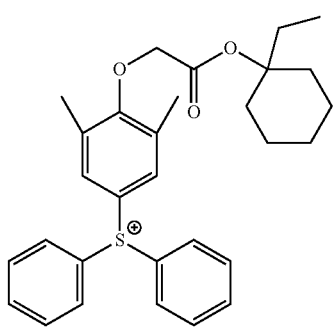
(ca-1-15)
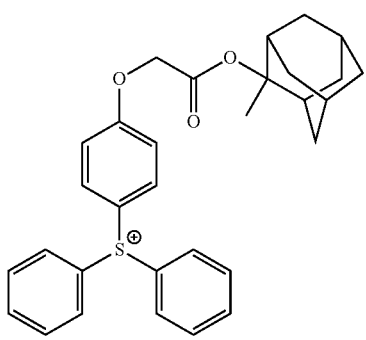
(ca-1-19)
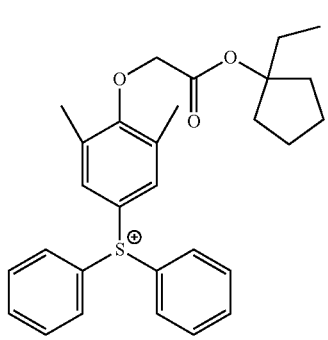
(ca-1-16)
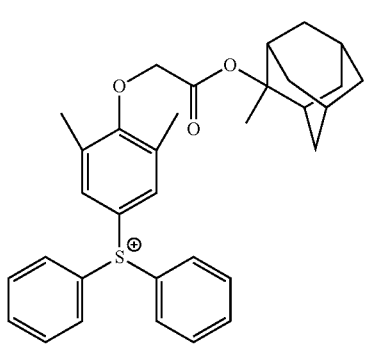
(ca-1-20)
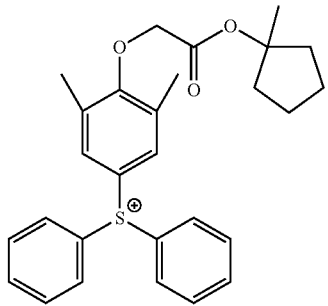

(ca-1-21)
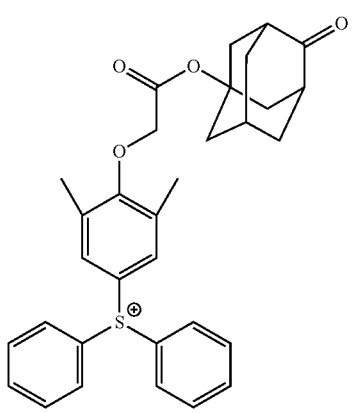
(ca-1-22)
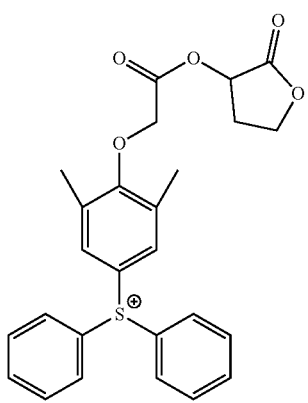
(ca-1-23)
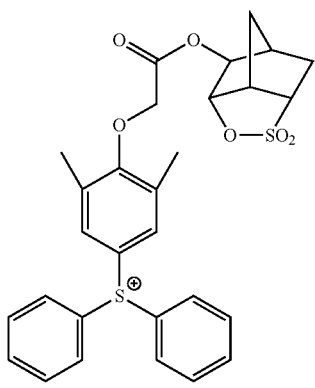
(ca-1-24)
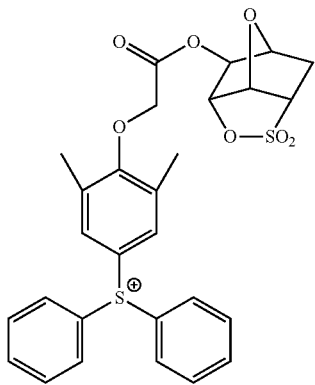
(ca-1-25)
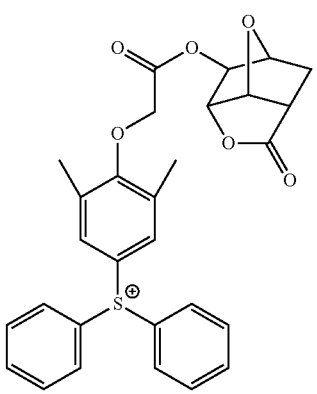
(ca-1-26)
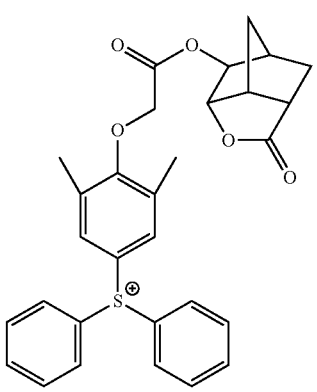
(ca-1-27)
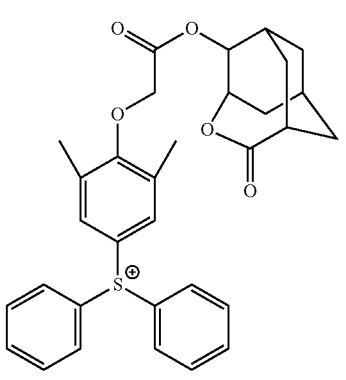
(ca-1-28)
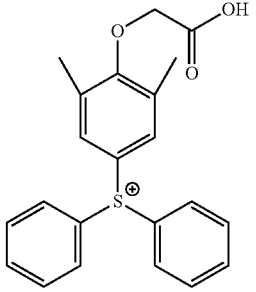

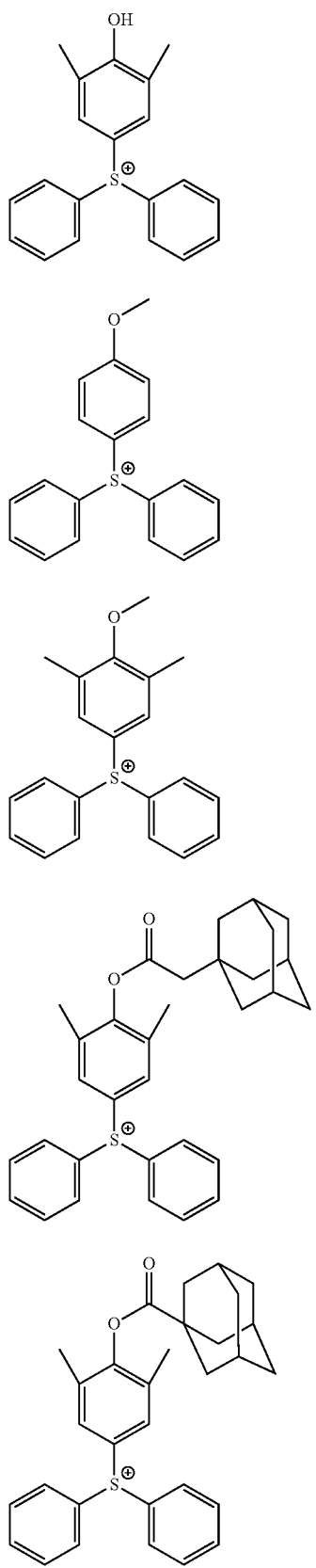
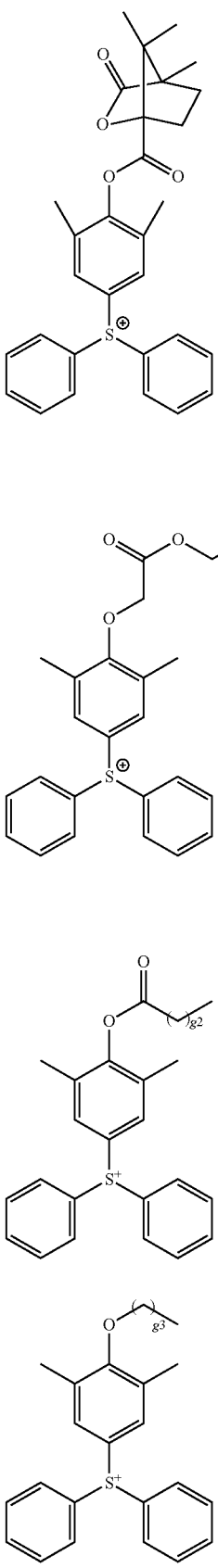

(ca-1-38)
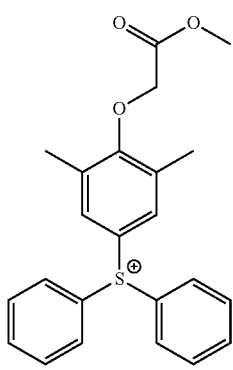
(ca-1-39)
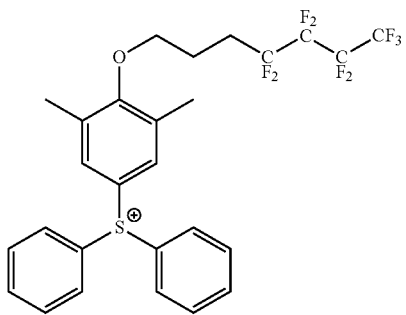
(ca-1-40)
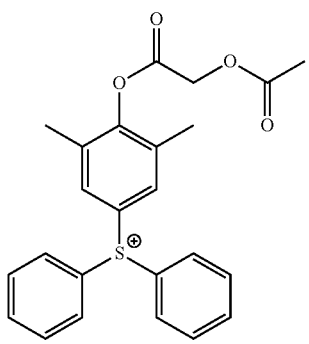
(ca-1-41)
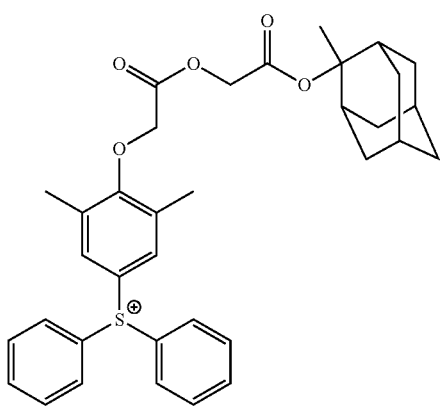
(ca-1-42)
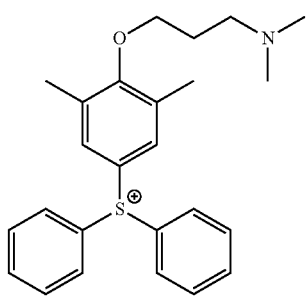
(ca-1-43)
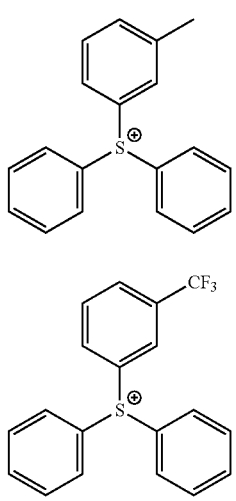
(ca-1-44)
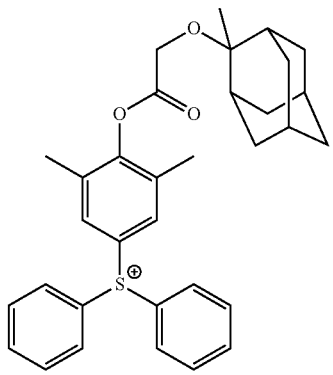
(ca-1-45)
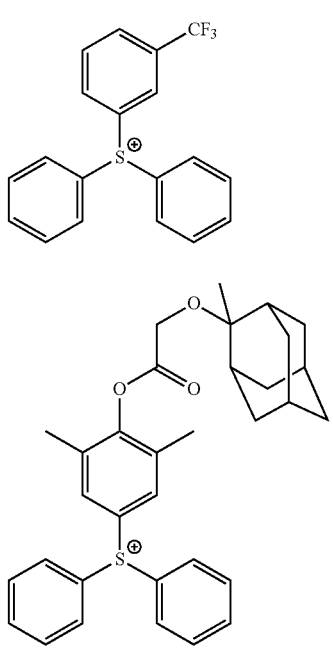
(ca-1-46)
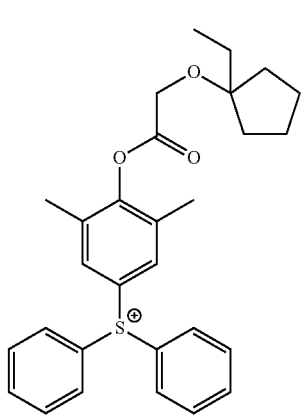

(ca-1-47)
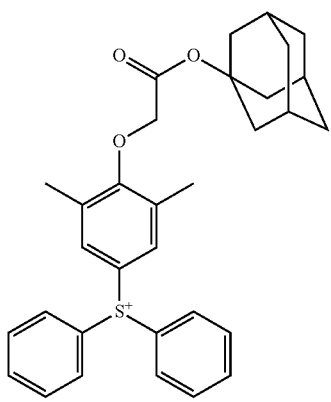
[In the formula, g1, g2, and g3 represent the numbers of repetitions, g1 is an integer in a range of 1 to 5, g2 is an integer in a range of 0 to 20, and g3 is an integer in a range of 0 to 20.]
(ca-1-48)
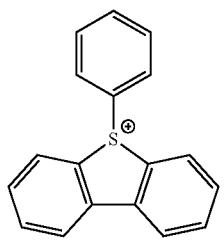
(ca-1-49)
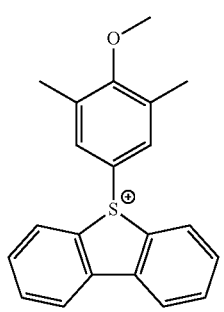
(ca-1-50)
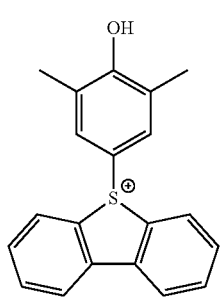
(ca-1-51)
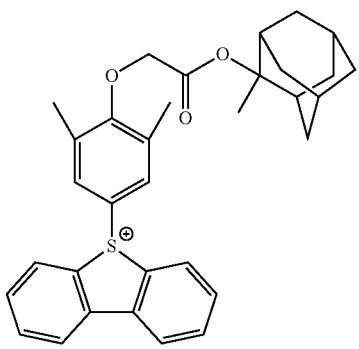
(ca-1-52)
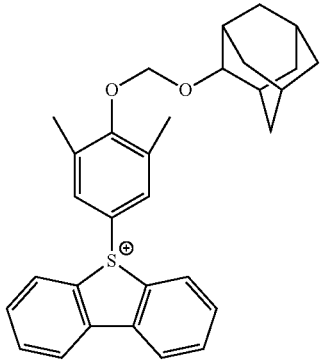
(ca-1-53)
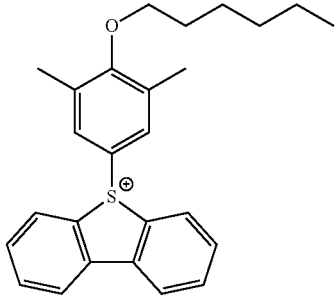
(ca-1-54)
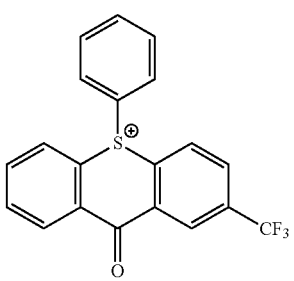
(ca-1-55)
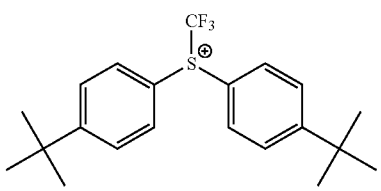

(ca-1-56)
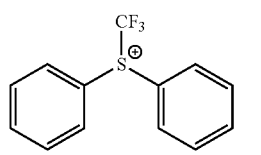
(ca-1-57)
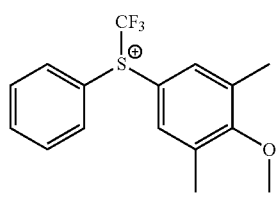
(ca-1-58)
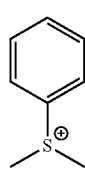
(ca-1-59)
(ca-1-60)
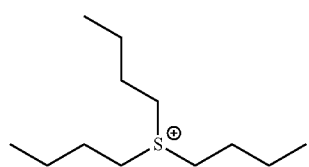
(ca-1-61)
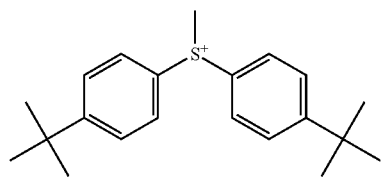
(ca-1-62)
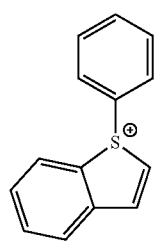
(ca-1-63)
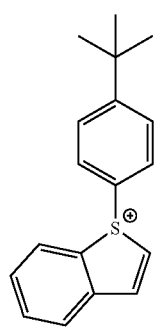
(ca-1-64)
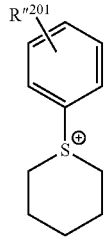
(ca-1-65)
(ca-1-66)
(ca-1-67)

-continued

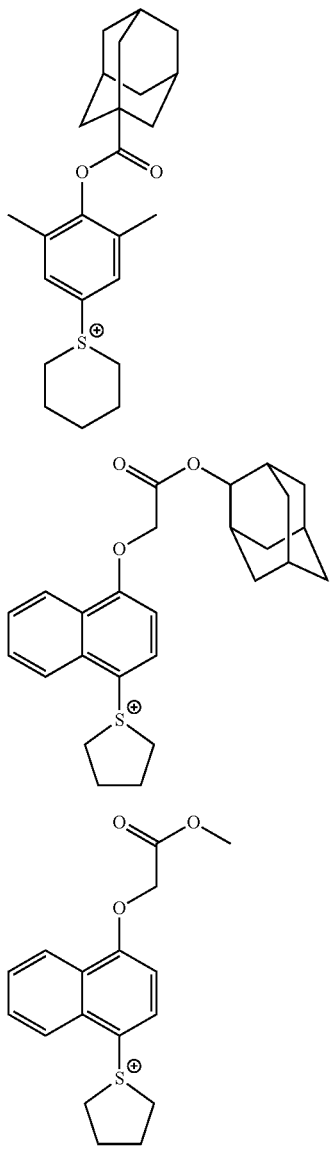

[In the formula, R″²⁰¹ represents a hydrogen atom or a substituent, and examples of the substituent include the same substituent as that exemplified as the substituent which $R^{201}$ to $R^{207}$ and $R^{210}$ to $R^{212}$ may have.]

Specific examples of suitable cations represented by General Formula (ca-2) include a diphenyliodonium cation and a bis(4-tert-butylphenyl)iodonium cation.

Specific examples of the suitable cations each represented by General Formula (ca-3) include cations each represented by General Formulae (ca-3-1) to (ca-3-6) shown below.

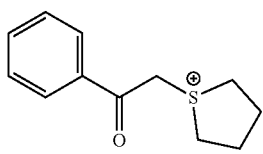

-continued

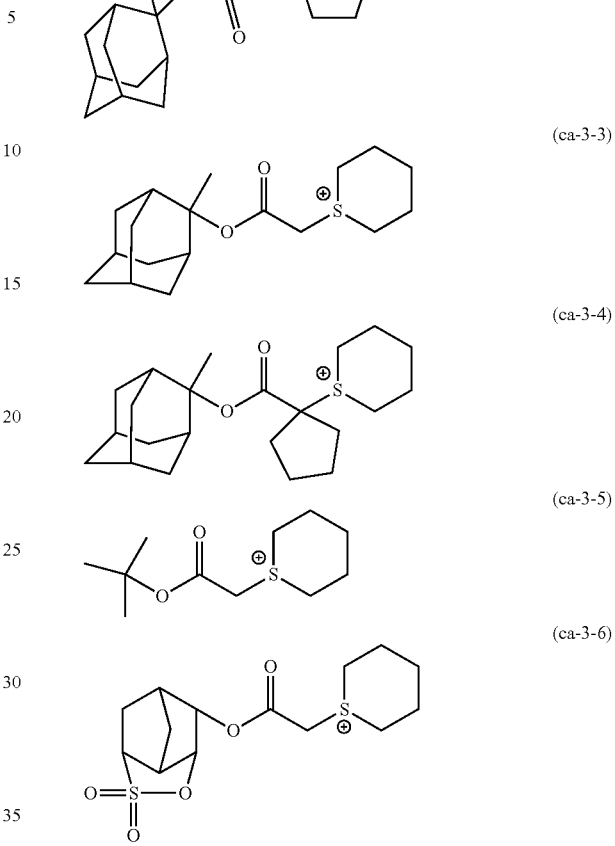

Specific examples of the suitable cations each represented by General Formula (ca-4) include cations each represented by General Formulae (ca-4-1) and (ca-4-2) shown below.

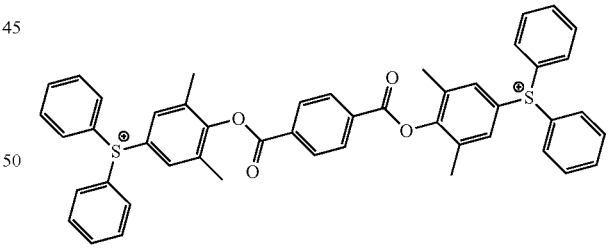

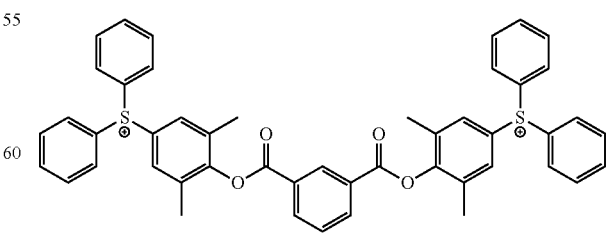

Specific examples of the suitable cations each represented by General Formula (ca-5) include cations each represented by General Formulae (ca-5-1) to (ca-5-3) shown below.

(ca-5-1)
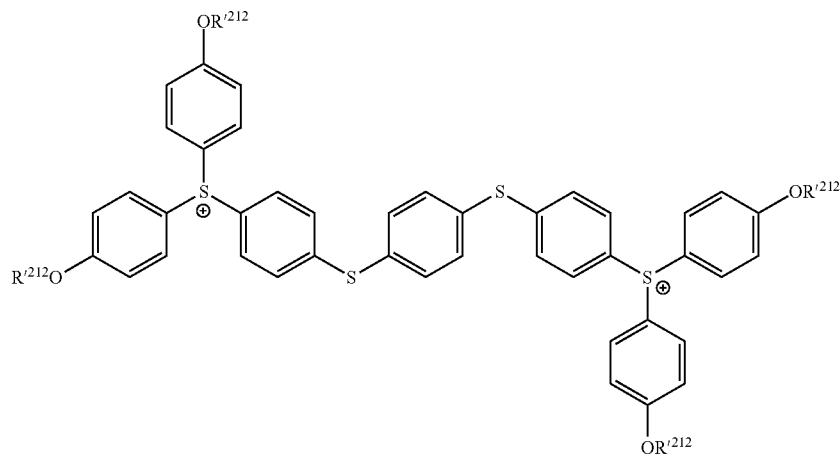
(ca-5-2)
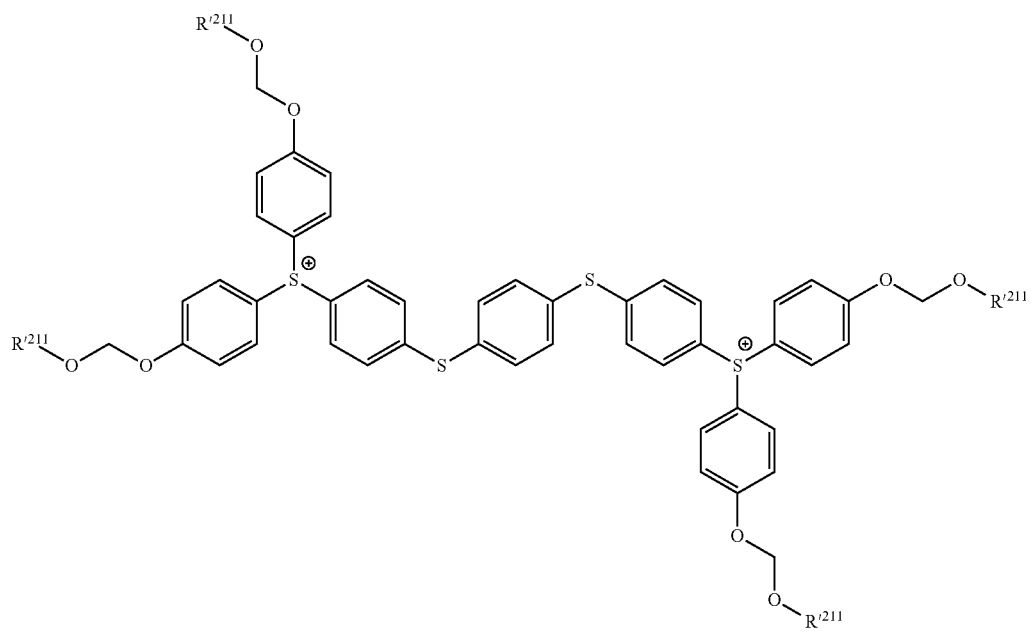
(ca-5-3)
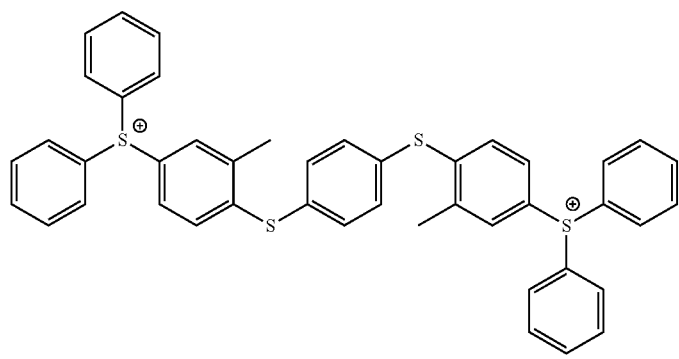

Among the above cations, as the cation moiety $((M^{m+})_{1/m})$, a cation represented by General Formula (ca-1) is preferable Suitable specific examples of the component (B2) are shown below.

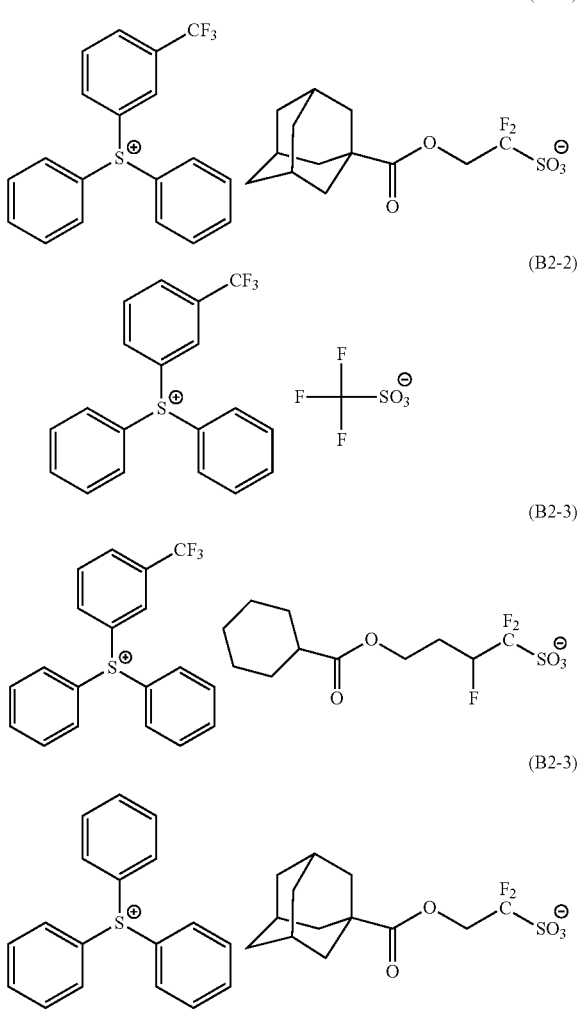

(B2-1)

(B2-2)

(B2-3)

(B2-3)

In the resist composition according to the present embodiment, the component (B2) may be used alone or in a combination of two or more kinds thereof.

In the resist composition according to the present embodiment, the content of the component (B2) is preferably in a range of 1 to 50 parts by mass, more preferably in a range of 3 to 30 parts by mass, and still more preferably in a range of 5 to 25 parts by mass with respect to 100 parts by mass of the component (A).

In a case where the content of the component (B2) is equal to or greater than the lower limit value of the above preferred range, the lithography characteristics such as sensitivity, resolution performance, roughness reduction property, and pattern rectangularity are further improved in resist pattern formation. On the other hand, in a case where the content thereof is equal to or lower than the upper limit value of the preferred range, a uniform solution is easily obtained when each of the components of the resist composition is dissolved in an organic solvent, and the storage stability as a resist composition is further improved.

In the resist composition according to the present embodiment, the component (B) may contain an acid generator other than the above-described first acid generator (the component (B1)) and second acid generator (the component (B2)); however, the total proportion of the first acid generator and the second acid generator in the component (B) is preferably 75% by mass or more, is more preferably 85% by mass or more, is still more preferably 95% by mass or more, and may be 100% by mass.

In the resist composition according to the present embodiment, the total content of the first acid generator and the second acid generator is preferably in a range of 10 to 60 parts by mass, more preferably in a range of 15 to 50 parts by mass, and still more preferably in a range of 20 to 40 parts by mass, with respect to 100 parts by mass of the component (A).

In a case where the total content of the first acid generator and the second acid generator is equal to or greater than the lower limit value of the above preferred range, the lithography characteristics such as sensitivity, resolution performance, roughness reduction property, and pattern rectangularity are further improved in resist pattern formation. On the other hand, in a case where the content thereof is equal to or lower than the upper limit value of the preferred range, a uniform solution is easily obtained when each of the components of the resist composition is dissolved in an organic solvent, and the storage stability as a resist composition is further improved.

In the resist composition according to the present embodiment, the mass ratio of the above-described first acid generator to the second acid generator (the content of the first acid generator: the content of the second acid generator) is preferably in a range of 2:8 to 8:2, more preferably in a range of 3:7 to 7:3, and still more preferably in a range of 4:6 to 6:4.

<Other Components>

The resist composition according to the present embodiment may further contain other components in addition to the component (A) and the component (B) described above. Examples of the other components include a component (D), a component (E), a component (F), and a component (S), which are described below.

<<Base Component (D)>>

The resist composition according to the present embodiment further contains preferably a base component (a component (D)) that traps (that is, controls the acid diffusion) an acid generated from the component (B) upon exposure. The component (D) acts as a quencher (an acid diffusion-controlling agent) which traps the acid generated in the resist composition upon exposure.

Examples of the component (D) include a photodecomposable base (D1) having an acid diffusion controllability (hereinafter, referred to as a "component (D1)") which is lost by the decomposition upon exposure and a nitrogen-containing organic compound (D2) (hereinafter, referred to as a "component (D2)") which does not correspond to the component (D1). Among these, the photodecomposable base (the component (D1)) is preferable since it is easy to enhance the characteristics of high sensitivity, roughness reduction, and suppression of the occurrence of coating defects.

In Regard to Component (D1)

In a case where a resist composition containing the component (D1) is obtained, the contrast between the exposed portion and the unexposed portion of the resist film can be further improved at the time of the formation of a resist pattern.

The component (D1) is not particularly limited as long as it is decomposed upon exposure and loses the acid diffusion controllability. The component (D1) is preferably one or more compounds selected from the group consisting of a compound represented by General Formula (d1-1) (hereinafter, referred to as a "component (d1-1)"), a compound represented by General Formula (d1-2) (hereinafter, referred to as a "component (d1-2)"), and a compound represented by General Formula (d1-3) (hereinafter, referred to as a "component (d1-3)").

At the exposed portion of the resist film, the components (d1-1) to (d1-3) are decomposed and then lose the acid diffusion controllability (basicity), and thus the components (d1-1) to (d1-3) cannot act as a quencher, whereas the components (d1-1) to (d1-3) act as a quencher at the unexposed portion of the resist film.

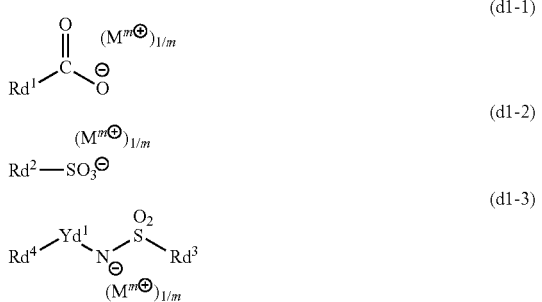

[In the formulae, Rd to Rd represents cyclic groups which may have a substituent, chain-like alkyl groups which may have a substituent, or chain-like alkenyl groups which may have a substituent. Here, the carbon atom adjacent to the S atom as $Rd^2$ in General Formula (d1-2) has no fluorine atom bonded thereto. $Yd^1$ represents a single bond or a divalent linking group, m represents an integer of 1 or greater, and each $M^{m+}$ independently represents an m-valent organic cation.]

{Component (d1-1)}
Anion Moiety

In General Formula (d1-1), $Rd^1$ represents a cyclic group which may have a substituent, a chain-like alkyl group which may have a substituent, or a chain-like alkenyl group which may have a substituent, and examples thereof include the same group as $R'^{201}$.

Among these, $Rd^1$ is preferably an aromatic hydrocarbon group which may have a substituent, an aliphatic cyclic group which may have a substituent, or a chain-like alkyl group which may have a substituent. Examples of the substituent which these groups may have include a hydroxyl group, an oxo group, an alkyl group, an aryl group, a fluorine atom, a fluorinated alkyl group, lactone-containing cyclic groups each represented by any of General Formulae (a2-r-1) to (a2-r-7), an ether bond, an ester bond, and a combination thereof. In a case where an ether bond or an ester bond is included as the substituent, the substituent may be bonded via an alkylene group, and linking groups each represented by any of Formulae (y-a1-1) to (y-a1-5) are preferable as the substituent.

As the aromatic hydrocarbon group, a phenyl group, a naphthyl group, and a polycyclic structure (a polycyclic structure including a bicyclooctane skeleton and a ring structure other than the bicyclooctane skeleton) including a bicyclooctane skeleton can be suitably mentioned.

The aliphatic cyclic group is preferably a group in which one or more hydrogen atoms have been removed from a polycycloalkane such as adamantane, norbornane, isobornane, tricyclodecane, or tetracyclododecane.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl group, or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group.

In a case where the chain-like alkyl group is a fluorinated alkyl group having a fluorine atom or a fluorinated alkyl group as a substituent, the fluorinated alkyl group preferably has 1 to 11 carbon atoms, more preferably 1 to 8 carbon atoms, and still more preferably 1 to 4 carbon atoms. The fluorinated alkyl group may contain an atom other than a fluorine atom. Examples of the atom other than a fluorine atom include an oxygen atom, a sulfur atom, and a nitrogen atom.

As $Rd^1$, a fluorinated alkyl group in which part or all of hydrogen atoms constituting a linear alkyl group have been substituted with a fluorine atom is preferable, and a fluorinated alkyl group in which all of the hydrogen atoms constituting a linear alkyl group have been substituted with a fluorine atom (a linear perfluoroalkyl group) is particularly preferable.

Specific examples of the preferred anion moiety for the component (d1-1) are shown below.

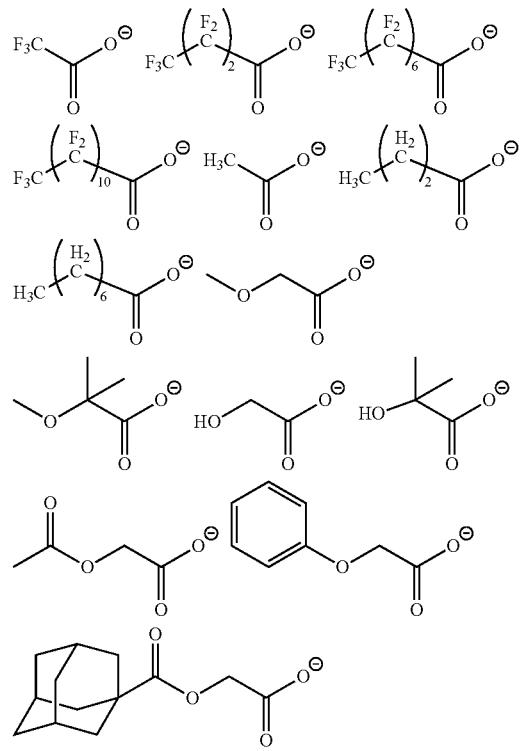

-continued

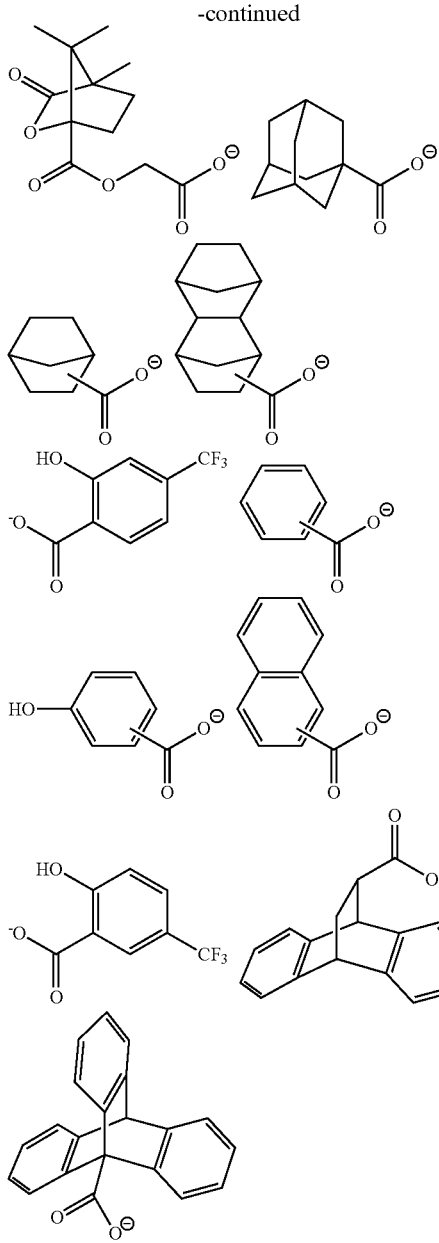

Cation Moiety

In General Formula (d1-1), $M^{m+}$ represents an m-valent organic cation.

The organic cations of $M^{m+}$ are suitably the same as those each represented by General Formulae (ca-1) to (ca-5), the cations each represented by General Formula (ca-1) are preferable, and cations each represented by Formulae (ca-1-1) to (ca-1-70) are more preferable.

The component (d 1-1) may be used alone or in a combination of two or more kinds thereof.

{Component (d1-2)}

Anion Moiety

In General Formula (d1-2), $Rd^2$ represents a cyclic group which may have a substituent, a chain-like alkyl group which may have a substituent, or a chain-like alkenyl group which may have a substituent, and examples thereof include the same group as $R'^{201}$.

Here, the carbon atom adjacent to the S atom in $Rd^2$ has no fluorine atom bonded thereto (the carbon atom adjacent to the S atom in $Rd^2$ is not substituted with a fluorine atom). As a result, the anion of the component (d1-2) becomes an appropriately weak acid anion, thereby improving the quenching ability of the component (D).

$Rd^2$ is preferably a chain-like alkyl group which may have a substituent or an aliphatic cyclic group which may have a substituent. The chain-like alkyl group preferably has 1 to 10 carbon atoms and more preferably 3 to 10 carbon atoms. The aliphatic cyclic group is more preferably a group (which may have a substituent) in which one or more hydrogen atoms have been removed from adamantane, norbornane, isobornane, tricyclodecane, tetracyclododecane, or the like; and a group in which one or more hydrogen atoms have been removed from camphor or the like.

The hydrocarbon group as $Rd^2$ may have a substituent. Examples of the substituent include the same substituent as that which the hydrocarbon group (an aromatic hydrocarbon group, an aliphatic cyclic group, or a chain-like alkyl group) as $Rd^1$ in General Formula (d1-1) may have.

Specific examples of the preferred anion moiety for the component (d1-2) are shown below.

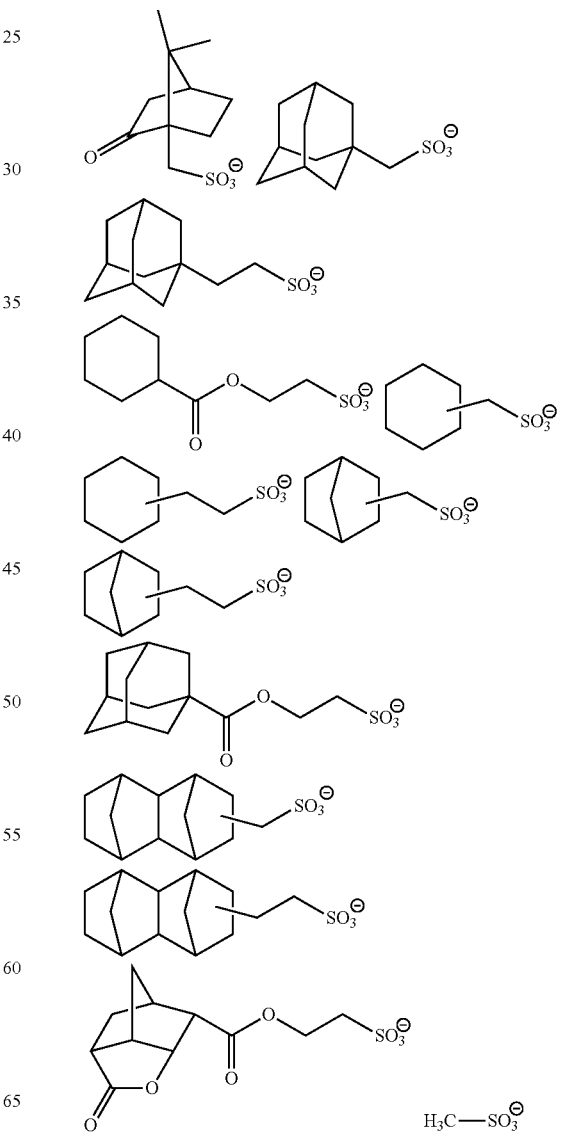

-continued

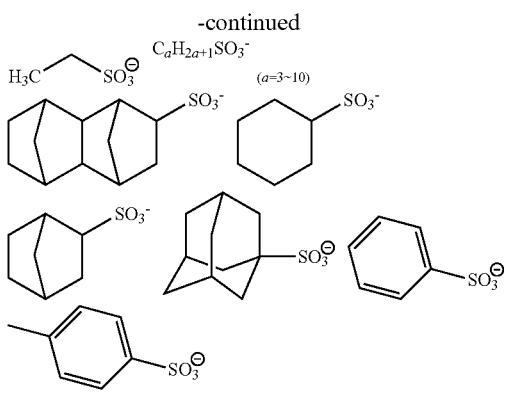

Cation Moiety

In General Formula (d1-2), $M^{m+}$ represents an m-valent organic cation and is the same as $M^{m+}$ in General Formula (d1-1).

The component (d1-2) may be used alone or in a combination of two or more kinds thereof.

{Component (d1-3)}

Anion Moiety

In General Formula (d1-3), $Rd^3$ represents a cyclic group which may have a substituent, a chain-like alkyl group which may have a substituent, or a chain-like alkenyl group which may have a substituent, examples thereof include the same groups as $R'^{201}$, and a cyclic group containing a fluorine atom, a chain-like alkyl group, or a chain-like alkenyl group is preferable. Among them, a fluorinated alkyl group is preferable, and the same fluorinated alkyl group as that described above as $Rd^1$ is more preferable.

In General Formula (d1-3), $Rd^4$ represents a cyclic group which may have a substituent, a chain-like alkyl group which may have a substituent, or a chain-like alkenyl group which may have a substituent, and examples thereof include the same group as $R'^{201}$.

Among them, an alkyl group which may have a substituent, an alkoxy group which may have a substituent, an alkenyl group which may have a substituent, or a cyclic group which may have a substituent is preferable.

The alkyl group as $Rd^4$ is preferably a linear or branched alkyl group having 1 to carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. A part of hydrogen atoms in the alkyl group as $Rd^4$ may be substituted with a hydroxyl group, a cyano group, or the like.

The alkoxy group as $Rd^4$ is preferably an alkoxy group having 1 to 5 carbon atoms, and specific examples of the alkoxy group having 1 to 5 carbon atoms include a methoxy group, an ethoxy group, an n-propoxy group, an iso-propoxy group, an n-butoxy group, and a tert-butoxy group. Among these, a methoxy group and an ethoxy group are preferable.

Examples of the alkenyl group as $Rd^4$ include the same group as $R'^{201}$, and a vinyl group, a propenyl group (an allyl group), a 1-methylpropenyl group, or a 2-methylpropenyl group is preferable. These groups may have an alkyl group having 1 to carbon atoms or a halogenated alkyl group having 1 to 5 carbon atoms as a substituent.

Examples of the cyclic group as $Rd^4$ include the same cyclic group as $R'^{201}$ and an alicyclic group in which one or more hydrogen atoms have been removed from a cycloalkane such as cyclopentane, cyclohexane, adamantane, nor-bornane, isobornane, tricyclodecane, or tetracyclododecane, or an aromatic group such as a phenyl group or a naphthyl group is preferable. In a case where $Rd^4$ represents an alicyclic group, the resist composition can be satisfactorily dissolved in an organic solvent, thereby improving the lithography characteristics. In a case where $Rd^4$ is an aromatic group, the resist composition is excellent in light absorption efficiency and thus has good sensitivity and lithography characteristics in the lithography using EUV or the like as a light source for exposure.

In General Formula (d1-3), $Yd^1$ represents a single bond or a divalent linking group.

The divalent linking group as $Yd^1$ is not particularly limited, and examples thereof include a divalent hydrocarbon group (an aliphatic hydrocarbon group or an aromatic hydrocarbon group) which may have a substituent and a divalent linking group containing a hetero atom. The divalent linking groups are the same as those described above as the divalent hydrocarbon group which may have a substituent and the divalent linking group containing a hetero atom described above as the divalent linking group as $Ya^{21}$ in General Formula (a2-1).

As $Yd^1$, a carbonyl group, an ester bond, an amide bond, an alkylene group, or a combination of these is preferable. As the alkylene group, a linear or branched alkylene group is more preferable, and a methylene group or an ethylene group is still more preferable.

Specific examples of the preferred anion moiety for the component (d1-3) are shown below.

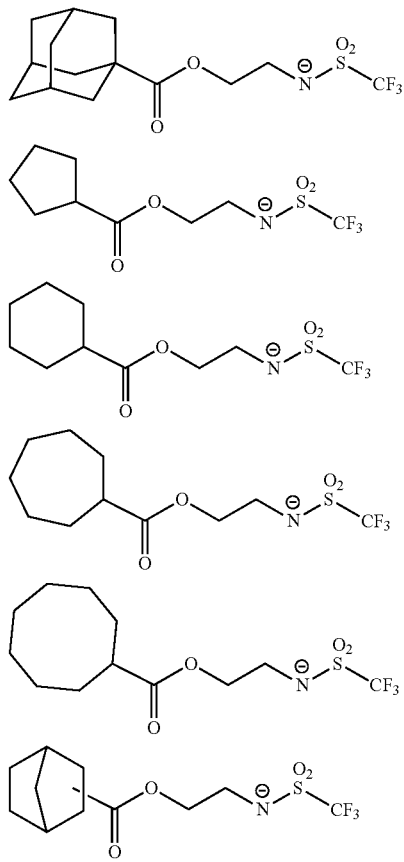

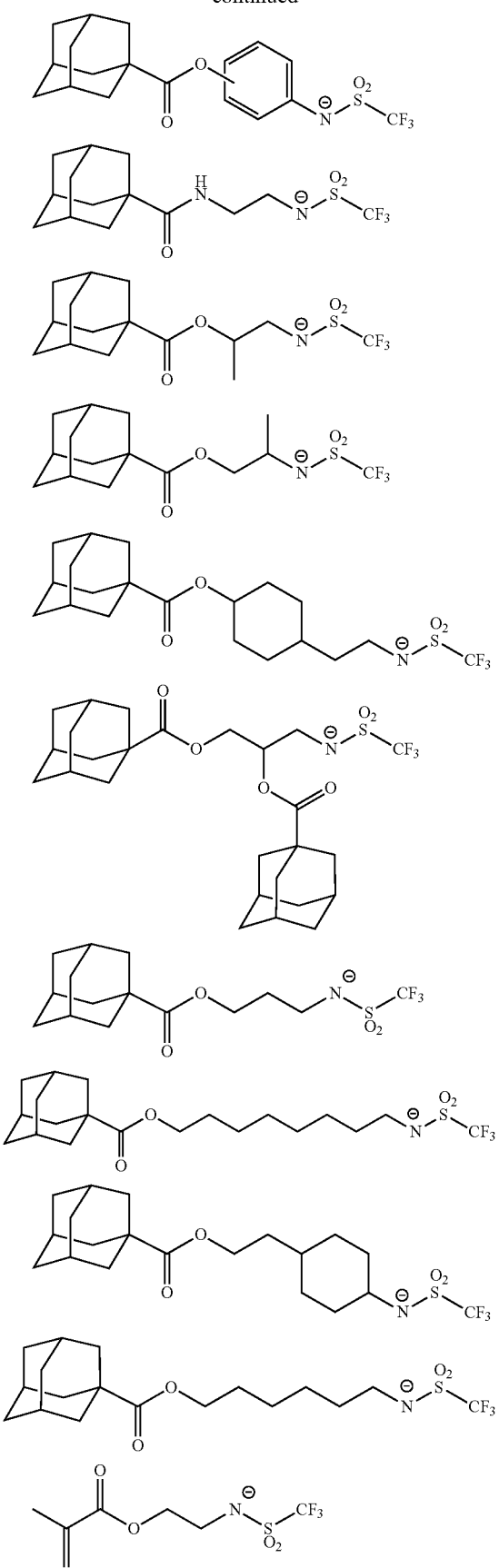

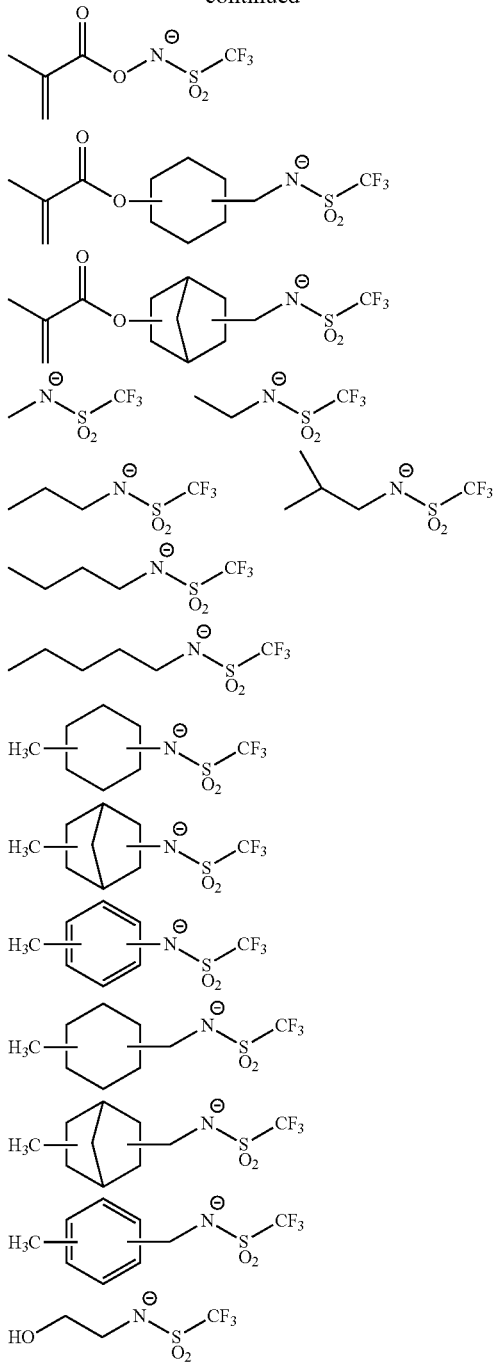

Cation Moiety

In General Formula (d1-3), $M^{m+}$ represents an m-valent organic cation and is the same as $M^{m+}$ in General Formula (d1-1).

The component (d1-3) may be used alone or in a combination of two or more kinds thereof.

As the component (D1), only one of the above-described components (d1-1) to (d1-3) or a combination of two or more kinds thereof may be used.

In a case where the resist composition contains the component (D1), the content of the component (D1) in the resist composition is preferably in a range of 0.5 to 20 parts by mass, more preferably in a range of 1 to 15 parts by mass, and still more preferably in a range of 2 to 10 parts by mass with respect to 100 parts by mass of the component (A).

In a case where the content of the component (D1) is equal to or greater than the preferred lower limit, excellent lithography characteristics and an excellent resist pattern shape are easily obtained. On the other hand, in a case where the content of the component (D1) is equal to or lower than the upper limit, the sensitivity can be maintained satisfactorily and the throughput is also excellent.

Method of Producing Component (D1):

The methods of producing the components (d1-1) and (d1-2) are not particularly limited, and the components (d1-1) and (d1-2) can be produced by conventionally known methods.

Further, the method of producing the component (d1-3) is not particularly limited, and the component (d1-3) can be produced in the same manner as disclosed in United States Patent Application, Publication No. 2012-0149916.

In Regard to Component (D2)

The component (D) may contain a nitrogen-containing organic compound component (hereinafter, referred to as a "component (D2)") which does not correspond to the above-mentioned component (D1).

The component (D2) is not particularly limited as long as it acts as an acid diffusion controlling agent and does not correspond to the component (D1), and any known compound may be used. Among the above, aliphatic amines are preferable, and among the aliphatic amines, a secondary aliphatic amine or a tertiary aliphatic amine is more preferable.

An aliphatic amine is an amine having one or more aliphatic groups, and the aliphatic groups preferably have 1 to 12 carbon atoms.

Examples of these aliphatic amines include an amine in which at least one hydrogen atom of ammonia ($NH_3$) has been substituted with an alkyl group or hydroxyalkyl group having 12 or fewer carbon atoms (alkyl amines or alkyl alcohol amines) and a cyclic amine.

Specific examples of alkyl amines and alkyl alcohol amines include monoalkyl amines such as n-hexyl amine, n-heptyl amine, n-octyl amine, n-nonyl amine, and n-decyl amine; dialkyl amines such as diethyl amine, di-n-propyl amine, di-n-heptyl amine, di-n-octyl amine, and dicyclohexyl amine; trialkyl amines such as trimethyl amine, triethyl amine, tri-n-propyl amine, tri-n-butyl amine, tri-n-hexyl amine, tri-n-pentyl amine, tri-n-heptyl amine, tri-n-octyl amine, tri-n-nonyl amine, tri-n-decyl amine, and tri-n-dodecyl amine; and alkyl alcohol amines such as diethanol amine, triethanol amine, diisopropanol amine, triisopropanol amine, di-n-octanol amine, and tri-n-octanol amine. Among these, trialkyl amines of 5 to 10 carbon atoms are preferable, and tri-n-pentyl amine and tri-n-octyl amine are particularly preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris {2-(2-methoxyethoxy) ethyl}amine, tris {2-(2-methoxyethoxymethoxy) ethyl}amine, tris{2-(l-methoxyethoxy)ethyl}amine, tris{2-(l-ethoxyethoxy)ethyl}amine, tris{2-(l-ethoxypropoxy) ethyl}amine, tris[2-{2-(2-hydroxyethoxy)ethoxy}ethyl] amine and triethanol amine triacetate, and triethanol amine triacetate is preferable.

In addition, as the component (D2), an aromatic amine may be used.

Examples of aromatic amines include 4-dimethylaminopyridine, pyrrole, indole, pyrazole, imidazole, and derivatives thereof, tribenzylamine, 2,6-diisopropylaniline, and N-tert-butoxycarbonylpyrrolidine.

The component (D2) may be used alone or in a combination of two or more kinds thereof.

In a case where the resist composition contains the component (D2), the content of the component (D2) in the resist composition is typically in a range of 0.01 to 5 parts by mass with respect to 100 parts by mass of the component (A). By setting the content within the above range, the resist pattern shape, the post-exposure temporal stability, and the like are improved.

Among the above, the component (D) in the present embodiment is preferably the component (D1) and more preferably the component (d1-1).

<<At Least One Compound (E) Selected from the Group Consisting of Organic Carboxylic Acid, Phosphorus Oxo Acid, and Derivatives Thereof>>

For the purpose of preventing any deterioration in sensitivity, and improving the resist pattern shape and the post-exposure temporal stability, the resist composition according to the present embodiment may contain, as an optional component, at least one compound (E) (hereinafter referred to as a component (E)) selected from the group consisting of an organic carboxylic acid, and a phosphorus oxo acid and a derivative thereof.

Examples of suitable organic carboxylic acids include acetic acid, malonic acid, citric acid, malic acid, succinic acid, benzoic acid, and salicylic acid.

Examples of phosphorus oxo acid include phosphoric acid, phosphonic acid, and phosphinic acid. Among these, phosphonic acid is particularly preferable.

Examples of the phosphorus oxo acid derivative include an ester obtained by substituting a hydrogen atom in the above-described oxo acid with a hydrocarbon group. Examples of the hydrocarbon group include an alkyl group having 1 to 5 carbon atoms and an aryl group having 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate, and dibenzyl phosphonate.

Examples of phosphinic acid derivatives include phosphinic acid esters and phenylphosphinic acid.

In the resist composition according to the present embodiment, the component (E) may be used alone or in a combination of two or more kinds thereof.

In a case where the resist composition contains the component (E), the content of the component (E) is typically in a range of 0.01 to 5 parts by mass with respect to 100 parts by mass of the component (A).

<<Fluorine Additive Component (F)>>

The resist composition according to the present embodiment may further include a fluorine additive component (hereinafter, referred to as a "component (F)") in order to impart water repellency to the resist film or to improve lithography characteristics.

As the component (F), a fluorine-containing polymer compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be mentioned.

Specific examples of the component (F) include polymers having a constitutional unit (f1) represented by General Formula (f1-1) shown below. This polymer is preferably a polymer (homopolymer) consisting of a constitutional unit (f1) represented by General Formula (f1-1) shown below; a copolymer of the constitutional unit (f1) and the constitutional unit (a1); and a copolymer of the constitutional unit (f1), a constitutional unit derived from acrylic acid or methacrylic acid, and the above-described constitutional unit (a1). As the constitutional unit (a1) to be copolymerized with the constitutional unit (f1), a constitutional unit derived from 1-ethyl-1-cyclooctyl (meth)acrylate and a constitutional unit derived from 1-methyl-1-adamantyl (meth)acrylate are preferable.

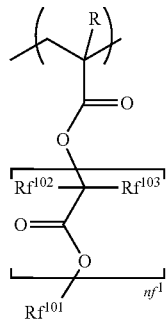

(f1-1)

[In the formula, R has the same definition as described above. $Rf^{102}$ and $Rf^{103}$ each independently represent a hydrogen atom, a halogen atom, an alkyl group having 1 to 5 carbon atoms, or a halogenated alkyl group having 1 to 5 carbon atoms, and $Rf^{102}$ and $Rf^{103}$ may be the same as or different from each other, $nf^1$ represents an integer in a range of 0 to 5 and $Rf^{101}$ represents an organic group containing a fluorine atom.]

In General Formula (f1-1), R bonded to the carbon atom at the α-position has the same definition as described above. R is preferably a hydrogen atom or a methyl group.

In General Formula (f1-1), the halogen atom of $Rf^{102}$ and $Rf^{103}$ is preferably a fluorine atom. Examples of the alkyl group having 1 to 5 carbon atoms as $Rf^{102}$ and $Rf^{103}$ include those described above as the alkyl group having 1 to 5 carbon atoms as R, and a methyl group or an ethyl group is preferable. Specific examples of the halogenated alkyl group having 1 to 5 carbon atoms as $Rf^{102}$ and $Rf^{103}$ include groups in which part or all of hydrogen atoms of the above-described alkyl groups of 1 to 5 carbon atoms have been substituted with a halogen atom. The halogen atom is preferably a fluorine atom. Among these examples, as $Rf^{102}$ and $Rf^{103}$, a hydrogen atom, a fluorine atom, or an alkyl group having 1 to 5 carbon atoms is preferable, and a hydrogen atom, a fluorine atom, a methyl group, or an ethyl group is more preferable.

In General Formula (f1-1), $nf^1$ represents an integer in a range of 0 to 5, preferably an integer in a range of 0 to 3, and more preferably an integer of 1 or 2.

In General Formula (f1-1), $Rf^{101}$ represents an organic group containing a fluorine atom and is preferably a hydrocarbon group containing a fluorine atom.

The hydrocarbon group containing a fluorine atom may be linear, branched, or cyclic, and preferably has 1 to 20 carbon atoms, more preferably 1 to 15 carbon atoms, and particularly preferably 1 to 10 carbon atoms.

In addition, in the hydrocarbon group containing a fluorine atom, 25% or more of the hydrogen atoms in the hydrocarbon group are preferably fluorinated, more preferably 50% or more are fluorinated, and particularly preferably 60% or more are fluorinated since the hydrophobicity of the resist film at the time of dipping exposure increases.

Among them, $Rf^{101}$ is preferably a fluorinated hydrocarbon group having 1 to 6 carbon atoms, more preferably a trifluoromethyl group, and particularly preferably —$CH_2$—$CF_3$, —$CH_2$—$CF_2$—$CF_3$, or —$CH(CF_3)_2$, —$CH_2$—$CH_2$—$CF_3$, or —$CH_2$—$CH_2$—$CF_2$—$CF_2$—$CF_3$.

The weight-average molecular weight (Mw) (based on the polystyrene-equivalent value determined by gel permeation chromatography) of the component (F) is preferably in a range of 1,000 to 50,000, more preferably in a range of 5,000 to 40,000, and most preferably in a range of 10,000 to 30,000. In a case where the weight-average molecular weight is equal to or lower than the upper limit value of this range, the resist composition exhibits sufficiently satisfactory solubility in a solvent for a resist to be used as a resist. On the other hand, in a case where the weight-average molecular weight is equal to or greater than the lower limit value of this range, water repellency of the resist film is excellent.

Further, the dispersity (Mw/Mn) of the component (F) is preferably in a range of 1.0 to 5.0, more preferably in a range of 1.0 to 3.0, and most preferably in a range of 1.0 to 2.5.

In the resist composition according to the present embodiment, the component (F) may be used alone or in a combination of two or more kinds thereof.

In a case where the resist composition contains the component (F), the content of the component (F) is typically at a proportion in a range of 0.5 to 10 parts by mass, with respect to 100 parts by mass of the component (A).

<<Organic solvent component (S)>>

The resist composition according to the present embodiment may be produced by dissolving the resist materials in an organic solvent component (hereinafter, referred to as a "component (S)").

The component (S) may be any organic solvent which can dissolve each of the components to be used to obtain a uniform solution, and optional organic solvent can be suitably selected from those which are conventionally known as solvents for a chemical amplification-type resist composition and then used.

Examples of the component (S) include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkyl ether (such as monomethyl ether, monoethyl ether, monopropyl ether or monobutyl ether) or monophenyl ether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzyl ether, cresylmethyl ether, diphenyl ether, dibenzyl ether, phenetole, butylphenyl ether, ethyl benzene, diethyl benzene, pentyl benzene, isopropyl benzene, toluene, xylene, cymene and mesitylene; and dimethylsulfoxide (DMSO).

In the resist composition according to the present embodiment, the component (S) may be used alone or as a mixed solvent of two or more kinds thereof. Among these, PGMEA, PGME, γ-butyrolactone, EL, and cyclohexanone are preferable.

Further, a mixed solvent obtained by mixing PGMEA with a polar solvent is also preferable as the component (S). The blending ratio (mass ratio) of the mixed solvent can be suitably determined, taking into consideration the compatibility of the PGMEA with the polar solvent, but is preferably in a range of 1:9 to 9:1 and more preferably in a range of 2:8 to 8:2.

More specifically, in a case where EL or cyclohexanone is blended as the polar solvent, the PGMEA:EL or cyclohexanone mass ratio is preferably in a range of 1:9 to 9:1 and more preferably in a range of 2:8 to 8:2. Alternatively, in a case where PGME is blended as the polar solvent, the PGMEA:PGME mass ratio is preferably in a range of 1:9 to 9:1, more preferably in a range of 2:8 to 8:2, and still more preferably in a range of 3:7 to 7:3. Furthermore, a mixed solvent of PGMEA, PGME, and cyclohexanone is also preferable.

Further, the component (S) is also preferably a mixed solvent of at least one selected from PGMEA and EL and γ-butyrolactone. In this case, as the mixing ratio, the mass ratio of the former to the latter is preferably in a range of 70:30 to 95:5.

The amount of the component (S) to be used is not particularly limited and is suitably set, depending on a thickness of a film to be coated, to a concentration at which the component (S) can be applied onto a substrate or the like. Generally, the component (S) is used such that the solid content concentration of the resist composition is in a range of 0.1% to 20% by mass and preferably in a range of 0.2% to 15% by mass.

As desired, other miscible additives can also be added to the resist composition according to the present embodiment. For example, for improving the performance of the resist film, an additive resin, a dissolution inhibitor, a plasticizer, a stabilizer, a colorant, a halation prevention agent, and a dye can be suitably contained therein.

After dissolving the resist material in the component (S), the resist composition according to the present embodiment may be subjected to removal of impurities and the like by using a porous polyimide film, a porous polyamideimide film, or the like. For example, the resist composition may be filtered using a filter made of a porous polyimide film, a filter made of a porous polyamideimide film, or a filter made of a porous polyimide film and a porous polyamideimide film. Examples of the porous polyimide film and the porous polyamideimide film include those described in Japanese Unexamined Patent Application, First Publication No. 2016-155121.

The resist composition according to the present embodiment described above contains two kinds of acid generators (the first acid generator and the second acid generator) having different characteristics.

The anion moiety of the first acid generator (the component (B1)) has a specific bulky structure (a condensed cyclic group containing a condensed ring having at least one aromatic ring). For this reason, the acid diffusivity in the resist film is suitably controlled. As a result, it is can be suppressed that an acid diffuses to the unexposed part, which deteriorates the pattern shape and causes roughness.

In addition, since the cation moiety of the first acid generator (the component (B1)) has an electron-withdrawing group, the decomposition upon exposure is promoted. As a result, the sensitivity in the formation of the resist pattern is increased.

On the other hand, the anion moiety of the second acid generator (the component (B2)) is smaller than the anion moiety of the component (B1), the molar volume of the anion moiety thereof is 250 $cm^3$/mol or less, and thus the second acid generator has a relatively small volume. For this reason, with the resist composition according to the present embodiment, which employs the combination of the first acid generator and the second acid generator, the acid density in the resist film can be increased. As a result, in the formation of a narrow pitch pattern, the deprotection reaction of the base material component (A) in the region where the number of photons is small can be allowed to proceed smoothly, whereby the resolution and the roughness reduction property can be improved.

For this reason, it is presumed that the resist composition according to the present embodiment, which employs the combination of the first acid generator and the second acid generator, has high sensitivity, and a resist pattern having good resolution and roughness reduction property can be formed.

A preferred embodiment of the resist composition according to the present embodiment is a resist composition containing the above-described component (B1), component (B2), and component (D1).

Further, the more preferred embodiment is a resist composition which contains the above-mentioned component (B1), component (B2), and component (D1) where the component (B2) is the (b2-1) component and the component (D1) is the (d 1-1) component.

The resist compositions according to these embodiments have higher sensitivity, and a resist pattern having better resolution and a better roughness reduction property can be formed.

(Method of Forming Resist Pattern)

A method of forming a resist pattern according to the second aspect according to the present invention is a method including a step of forming a resist film on a support using the resist composition according to the first aspect of the present embodiment described above, a step of exposing the resist film, and a step of developing the exposed resist film to form a resist pattern.

Examples of one embodiment of such a method of forming a resist pattern include a method of forming a resist pattern performed as described below.

First, the resist composition of the above-described embodiment is applied onto a support with a spinner or the like, and a baking (post-apply baking (PAB)) treatment is performed, for example, at a temperature condition in a range of 80° C. to 150° C. for 40 to 120 seconds, preferably for 60 to 90 seconds to form a resist film.

Following the selective exposure performed on the resist film by, for example, exposure through a mask (mask pattern) having a predetermined pattern formed on the mask by using a lithography apparatus such as an electron beam lithography apparatus or an EUV lithography apparatus, or direct irradiation of the resist film for drawing with an electron beam without using a mask pattern, baking treatment (post-exposure baking (PEB)) is performed, for example, under a temperature condition in a range of 80° C. to 150° C. for 40 to 120 seconds and preferably 60 to 90 seconds.

Next, the resist film is subjected to a developing treatment. The developing treatment is performed using an alkali developing solution in a case of an alkali developing process, and a developing solution containing an organic solvent (organic developing solution) in a case of a solvent developing process.

After the developing treatment, it is preferable to conduct a rinse treatment. As the rinse treatment, water rinsing using pure water is preferable in a case of an alkali developing process, and rinsing using a rinse liquid containing an organic solvent is preferable in a case of a solvent developing process.

In a case of a solvent developing process, after the developing treatment or the rinsing, the developing solution or the rinse liquid remaining on the pattern can be removed by a treatment using a supercritical fluid.

After the developing treatment or the rinse treatment, drying is conducted. As desired, baking treatment (post-baking) can be performed following the developing treatment.

In this manner, a resist pattern can be formed.

The support is not specifically limited and a conventionally known support can be used. For example, substrates for electronic components, and such substrates having a predetermined wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the support, any support having the above-described substrate on which an inorganic and/or organic film is provided may be used. As the inorganic film, an inorganic antireflection film (inorganic BARC) can be used. Examples of the organic film include an organic antireflection film (organic BARC) and an organic film such as a lower-layer organic film used in a multilayer resist method.

Here, the multilayer resist method is a method in which at least one layer of an organic film (lower-layer organic film) and at least one layer of a resist film (upper-layer resist film) are provided on a substrate, and a resist pattern formed on the upper-layer resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be performed using radiation such as an ArF excimer laser, a KrF excimer laser, an $F_2$ excimer laser, extreme ultraviolet (EUV) rays, vacuum ultraviolet (VUV) rays, electron beams (EB), X-rays, or soft X-rays. The resist composition is highly useful for a KrF excimer laser, an ArF excimer laser, EB, or EUV, more useful for an ArF excimer laser, EB or EUV, and particularly useful for EB or EUV. That is, the method of forming a resist pattern according to the present embodiment is a particularly useful method in a case where the step of exposing the resist film includes an operation of exposing the resist film to extreme ultraviolet (EUV) rays or electron beams (EB).

The exposure of the resist film can be a general exposure (dry exposure) performed in air or an inert gas such as nitrogen, or liquid immersion exposure (liquid immersion lithography).

In liquid immersion lithography is an exposure method in which the region between the resist film and the lens at the lowermost position of the lithography apparatus is pre-filled with a solvent (liquid immersion medium) that has a larger refractive index than the refractive index of air, and the exposure (dipping exposure) is performed in this state.

As the liquid immersion medium, a solvent that exhibits a refractive index larger than the refractive index of air but smaller than the refractive index of the resist film to be exposed is preferable. The refractive index of the solvent is not particularly limited as long as it satisfies the above-described requirements.

Examples of the solvent which exhibits a refractive index that is larger than the refractive index of air but smaller than the refractive index of the resist film include water, fluorine-based inert liquids, silicone-based solvents, and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$, or $C_5H_3F_7$ as the main component, and the boiling point is preferably in a range of 70° to 180° C. and more preferably in a range of 80° to 160° C. A fluorine-based inert liquid having a boiling point in the above-described range is advantageous in that removing the medium used in the liquid immersion after the exposure can be preferably performed by a simple method.

As a fluorine-based inert liquid, a perfluoroalkyl compound in which all of the hydrogen atoms of the alkyl group are substituted with a fluorine atom is particularly preferable. Examples of these perfluoroalkyl compounds include perfluoroalkyl ether compounds and perfluoroalkyl amine compounds.

Specifically, an example of a suitable perfluoroalkyl ether compound is perfluoro(2-butyl-tetrahydrofuran) (boiling point of 102° C.), and an example of a suitable perfluoroalkyl amine compound is perfluorotributyl amine (boiling point of 174° C.).

As the liquid immersion medium, water is preferable in terms of cost, safety, environment, and versatility.

Examples of the alkali developing solution used for a developing treatment in an alkali developing process include a 0.1% to 10% by mass aqueous solution of tetramethylammonium hydroxide (TMAH).

As the organic solvent contained in the organic developing solution, which is used for a developing treatment in a solvent developing process, any one of the conventionally known organic solvents capable of dissolving the component (A) (component (A) prior to exposure) can be suitably selected from the conventionally known organic solvents. Specific examples of the organic solvent include polar solvents such as a ketone-based solvent, an ester-based solvent, an alcohol-based solvent, a nitrile-based solvent, an amide-based solvent, and an ether-based solvent, and hydrocarbon-based solvents.

A ketone-based solvent is an organic solvent containing C—C(=O)—C in the structure thereof. An ester-based solvent is an organic solvent containing C—C(=O)—O—C in the structure thereof. An alcohol-based solvent is an organic solvent containing an alcoholic hydroxyl group in the structure thereof. An "alcoholic hydroxyl group" indicates a hydroxyl group bonded to a carbon atom of an aliphatic hydrocarbon group. A nitrile-based solvent is an organic solvent containing a nitrile group in the structure thereof. An amide-based solvent is an organic solvent containing an amide group in the structure thereof. An ether-based solvent is an organic solvent containing C—O—C in the structure thereof.

Some organic solvents have a plurality of the functional groups which characterize the above-described solvents in the structure thereof. In such a case, the organic solvent can be classified as any type of solvent having a characteristic functional group. For example, diethylene glycol monomethyl ether can be classified as an alcohol-based solvent or an ether-based solvent.

A hydrocarbon-based solvent consists of a hydrocarbon which may be halogenated and does not have any substituent other than a halogen atom. The halogen atom is preferably a fluorine atom.

Among the above, the organic solvent contained in the organic developing solution is preferably a polar solvent and more preferably a ketone-based solvent, an ester-based solvent, or a nitrile-based solvent.

Examples of ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, propylenecarbonate, γ-butyrolactone and methylamyl ketone (2-heptanone). Among these examples, the ketone-based solvent is preferably methylamyl ketone (2-heptanone).

Examples of the ester-based solvent include methyl acetate, butyl acetate, ethyl acetate, isopropyl acetate, amyl acetate, isoamyl acetate, ethyl methoxyacetate, ethyl ethoxyacetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among these, the ester-based solvent is preferably butyl acetate.

Examples of the nitrile-based solvent include acetonitrile, propionitrile, valeronitrile, and butyronitrile.

As desired, the organic developing solution may have a conventionally known additive blended. Examples of the additive include surfactants. The surfactant is not particularly limited, and for example, an ionic or non-ionic fluorine-based and/or a silicone-based surfactant can be used. As the surfactant, a non-ionic surfactant is preferable, and a non-ionic fluorine-based surfactant or a non-ionic silicone-based surfactant is more preferable.

In a case where a surfactant is blended, the amount of the surfactant to be blended is typically in a range of 0.001% to 5% by mass, preferably in a range of 0.005% to 2% by mass, and more preferably in a range of 0.01% to 0.5% by mass with respect to the total amount of the organic developing solution.

The developing treatment can be performed by a conventionally known developing method. Examples thereof include a method in which the support is immersed in the developing solution for a predetermined time (a dip method), a method in which the developing solution is cast upon the surface of the support by surface tension and maintained for a predetermined period (a puddle method), a method in which the developing solution is sprayed onto the surface of the support (spray method), and a method in which a developing solution is continuously ejected from a developing solution ejecting and applying nozzle and applied onto a support which is scanned at a constant rate while being rotated at a constant rate (dynamic dispense method).

As the organic solvent contained in the rinse liquid used in the rinse treatment after the developing treatment in a case of a solvent developing process, an organic solvent hardly dissolving the resist pattern can be suitably selected and used, among the organic solvents mentioned as organic solvents that are used for the organic developing solution. In general, at least one kind of solvent selected from the group consisting of a hydrocarbon-based solvent, a ketone-based solvent, an ester-based solvent, an alcohol-based solvent, an amide-based solvent, and an ether-based solvent is used. Among these, at least one kind of solvent selected from the group consisting of a hydrocarbon-based solvent, a ketone-based solvent, an ester-based solvent, an alcohol-based solvent, and an amide-based solvent is preferable, at least one kind of solvent selected from the group consisting of an alcohol-based solvent and an ester-based solvent is more preferable, and an alcohol-based solvent is particularly preferable.

The alcohol-based solvent used for the rinse liquid is preferably a monohydric alcohol of 6 to 8 carbon atoms, and the monohydric alcohol may be linear, branched, or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol, and benzyl alcohol. Among these, 1-hexanol, 2-heptanol, and 2-hexanol are preferable, and 1-hexanol and 2-hexanol are more preferable.

As the organic solvent, one kind of solvent may be used alone, or two or more kinds of solvents may be used in combination. Further, an organic solvent other than the above-described examples or water may be mixed thereto. However, in consideration of the development characteristics, the amount of water to be blended in the rinse liquid is preferably 30% by mass or less, more preferably 10% by mass or less, still more preferably 5% by mass or less, and most preferably 3% by mass or less with respect to the total amount of the rinse liquid.

A conventionally known additive can be blended with the rinse liquid as necessary. Examples of the additive include surfactants. Examples of the surfactant include the same surfactants as those described above, the surfactant is preferably a non-ionic surfactant and more preferably a non-ionic fluorine-based surfactant or a non-ionic silicone-based surfactant.

In a case where a surfactant is blended, the amount of the surfactant to be blended is typically in a range of 0.001% to 5% by mass, preferably in a range of 0.005% to 2% by mass, and more preferably in a range of 0.01% to 0.5% by mass with respect to the total amount of the rinse liquid.

The rinse treatment using a rinse liquid (washing treatment) can be performed by a conventionally known rinse method. Examples of the rinse treatment method include a method in which the rinse liquid is continuously ejected and applied onto the support while rotating it at a constant rate (rotational coating method), a method in which the support is immersed in the rinse liquid for a predetermined time (dip method), and a method in which the rinse liquid is sprayed onto the surface of the support (spray method).

According to the method of forming a resist pattern according to the present embodiment described above, since the resist composition according to the first embodiment described above is used, it is possible to form a resist pattern that has high sensitivity, high resolution, reduced roughness.

EXAMPLES

Hereinafter, the present invention will be described in more detail based on Examples, but the present invention is not limited to these Examples.

Preparation of Resist Composition

Examples 1 to 9 and Comparative Examples 1 to 7

Each of the components shown in Tables 1 and 2 was mixed and dissolved to prepare a resist composition of each Example.

TABLE 1

| | Component (A) | Component (B) | | Component (D) | Component (S) |
|---|---|---|---|---|---|
| | | Component (B1) | Component (B2) | | |
| Example 1 | (A)-1 [100] | (B1)-1 [15.0] | (B2)-1 [15.0] | (D)-1 [5.0] | (S)-1 [6400] |
| Example 2 | (A)-1 [100] | (B1)-1 [15.0] | (B2)-2 [15.0] | (D)-1 [5.0] | (S)-1 [6400] |
| Example 3 | (A)-1 [100] | (B1)-1 [15.0] | (B2)-3 [15.0] | (D)-1 [5.0] | (S)-1 [6400] |
| Example 4 | (A)-1 [100] | (B1)-1 [15.0] | (B2)-4 [15.0] | (D)-1 [5.0] | (S)-1 [6400] |
| Example 5 | (A)-1 [100] | (B1)-2 [15.0] | (B2)-1 [15.0] | (D)-1 [5.0] | (S)-1 [6400] |
| Example 6 | (A)-1 [100] | (B1)-3 [15.0] | (B2)-1 [15.0] | (D)-1 [5.0] | (S)-1 [6400] |
| Example 7 | (A)-1 [100] | (B1)-4 [15.0] | (B2)-1 [15.0] | (D)-1 [5.0] | (S)-1 [6400] |
| Example 8 | (A)-1 [100] | (B1)-5 [15.0] | (B2)-1 [15.0] | (D)-1 [5.0] | (S)-1 [6400] |
| Example 9 | (A)-1 [100] | (B1)-6 [15.0] | (B2)-1 [15.0] | (D)-1 [5.0] | (S)-1 [6400] |

TABLE 2

| | Component (A) | Component (B) | | Component (D) | Component (S) |
|---|---|---|---|---|---|
| Comparative Example 1 | (A)-1 [100] | (B1)-1 [15.0] | (B)-3 [15.0] | (D)-1 [5.0] | (S)-1 [6400] |
| Comparative Example 2 | (A)-1 [100] | (B)-1 [15.0] | (B2)-1 [15.0] | (D)-1 [5.0] | (S)-1 [6400] |
| Comparative Example 3 | (A)-1 [100] | (B)-2 [15.0] | (B2)-1 [15.0] | (D)-1 [5.0] | (S)-1 [6400] |
| Comparative Example 4 | (A)-1 [100] | (B1)-1 [15.0] | (B1)-2 [15.0] | (D)-1 [5.0] | (S)-1 [6400] |
| Comparative Example 5 | (A)-1 [100] | (B2)-1 [15.0] | (B2)-2 [15.0] | (D)-1 [5.0] | (S)-1 [6400] |
| Comparative Example 6 | (A)-1 [100] | (B1)-1 [30.0] | | (D)-1 [5.0] | (S)-1 [6400] |
| Comparative Example 7 | (A)-1 [100] | (B2)-1 [30.0] | | (D)-1 [5.0] | (S)-1 [6400] |

In Tables 1 and 2, each abbreviation has the following meaning. The numerical values in the brackets are blending amounts (parts by mass).

(A)-1: The polymer compound represented by Chemical Formula (A-1). This polymer compound (A-1) was obtained by radical polymerization using monomers from which constitutional units constituting the polymer compound are derived, at a predetermined molar ratio. As a result of a GPC measurement to determine the weight-average molecular weight (Mw) in terms of standard polystyrene, this polymer compound (A-1) had a weight-average molecular weight of 7,000 and a polydispersity (Mw/Mn) of 1.70. The copolymerization compositional ratio (the ratio (molar ratio) among constitutional units in the structural formula) determined by $^{13}$C-NMR is 1/m=50/50.

(B1)-1 to (B1)-6: acid generators composed of compounds reach represented by Chemical Formulae (B1-1) to (B1-6).

(B2)-1 to (B2)-4: acid generators composed of compounds reach represented by Chemical Formulae (B2-1) to (B2-4).

(B)-1 to (B)-3: acid generators composed of compounds reach represented by Chemical Formulae (B-1) to (B-3).

The molar volume (cm$^3$/mol) of the anion moiety of each of the compounds represented by Chemical Formulae (B1-1) to (B1-6), (B2-1) to (B2-4), and (B-1) to (B-3), which was calculated based on the database registration value and the estimated value of HSPiP 4th Edition version 4.0.04, was indicated in [ ] under each of the chemical formula names.

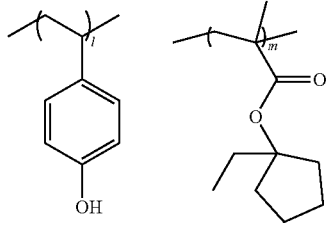

(A-1)

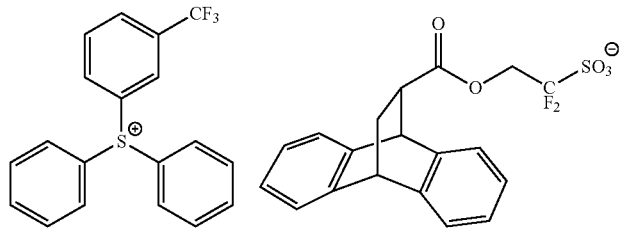

(B1-1)

[275.8]

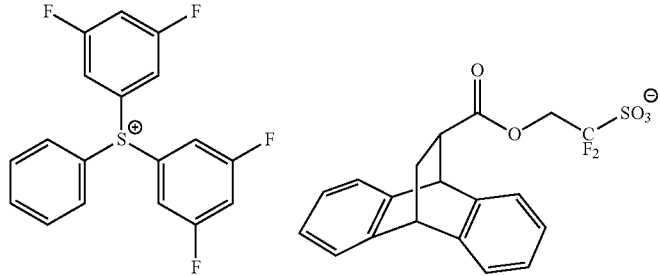

(B1-2)

[275.8]

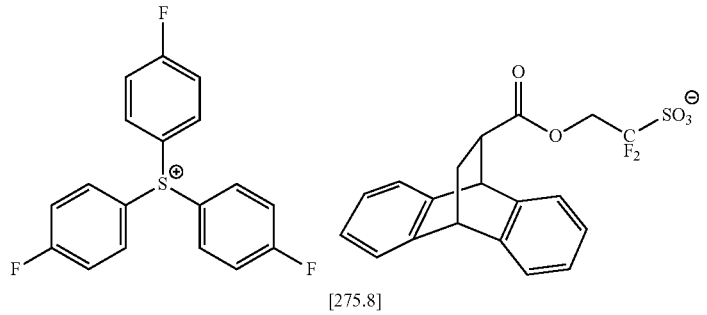

(B1-3)

[275.8]

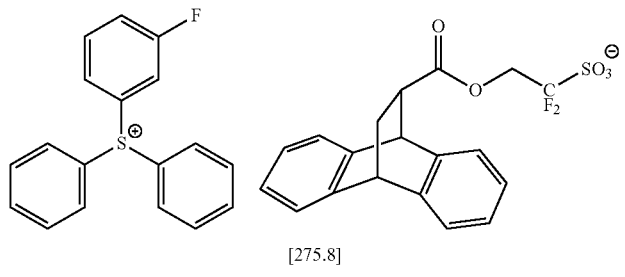

(B1-4)

[275.8]

-continued
(B1-5)
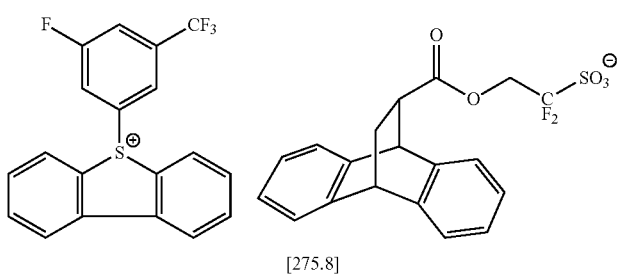
(B1-6)
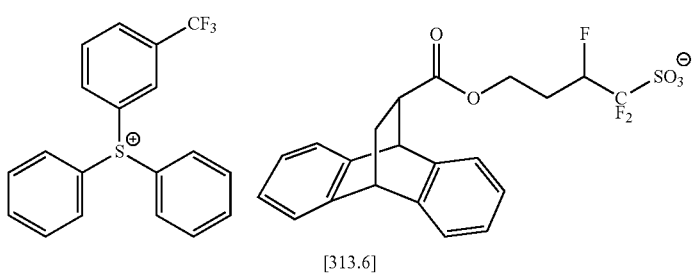
(B2-1)
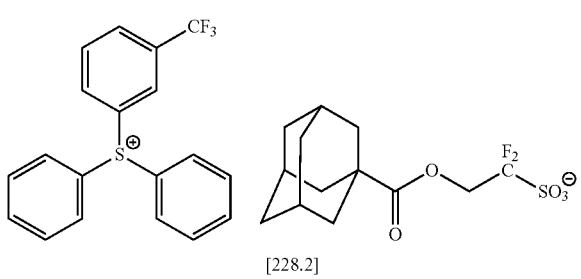
(B2-2)
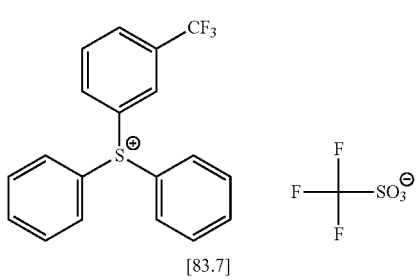
(B2-3)
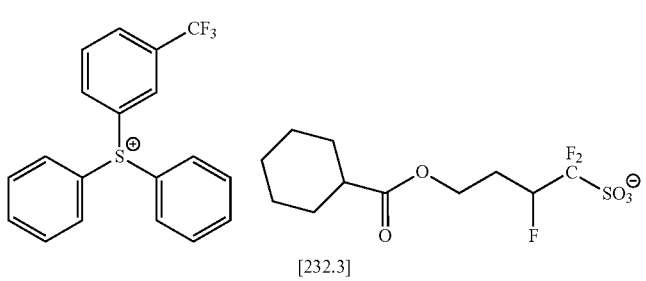
(B2-4)
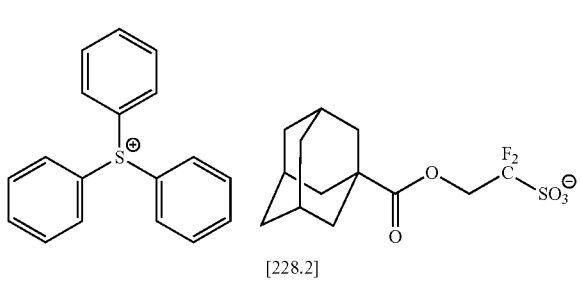

-continued

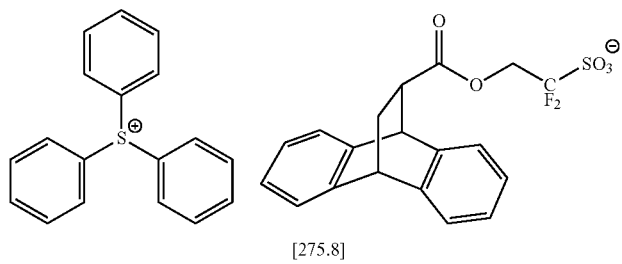

(B-1)

[275.8]

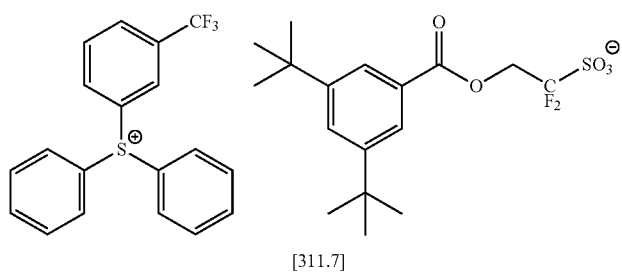

(B-2)

[311.7]

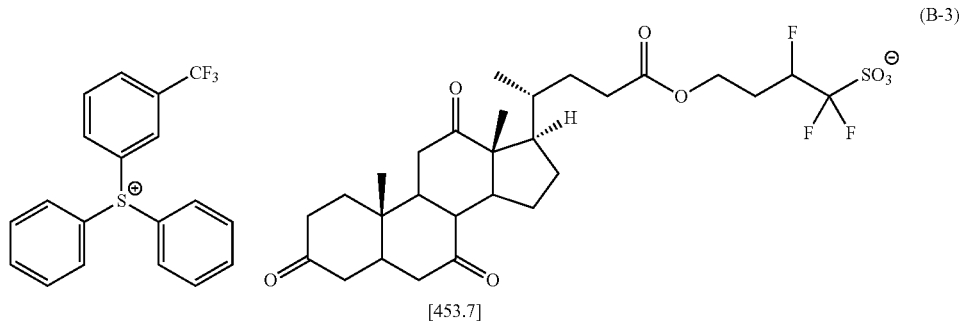

(B-3)

[453.7]

(D)-1: an acid diffusion-controlling agent composed of a compound represented by Chemical Formula (D-1).

(S)-1: a mixed solvent of propylene glycol monomethyl ether acetate/propylene glycol monomethyl ether=60/40 (mass ratio)

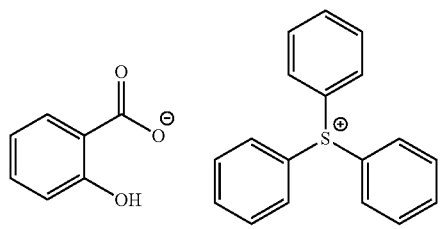

(D-1)

<Formation of Resist Pattern>

The resist composition of each Example was applied onto an 8-inch silicon substrate which had been subjected to a hexamethyldisilazane (HMDS) treatment using a spinner, the coated wafer was subjected to a post-apply baking (PAB) treatment on a hot plate at a temperature of 110° C. for 60 seconds so that the coated wafer was dried to form a resist film having a film thickness of 50 nm.

Next, drawing (exposure) was performed on the resist film by using an electron beam lithography apparatus JEOL-JBX-9300FS (manufactured by JEOL Ltd.), with the target size being set to a 1:1 line-and-space pattern (hereinafter, referred to as an "LS pattern") of a line width of 50 nm, at an accelerating voltage of 100 kV. Thereafter, a post-exposure baking (PEB) treatment was performed on the resist film at 90° C. for 60 seconds.

Subsequently, alkali development was performed at 23° C. for 60 seconds using a 2.38% by mass tetramethylammonium hydroxide (TMAH) aqueous solution "NMD-3" (trade name, manufactured by TOKYO OHKA KOGYO CO., LTD.).

Thereafter, rinsing was performed with pure water for 15 seconds.

As a result, a 1:1 LS pattern having a line width of 50 nm was formed.

[Evaluation of Optimum Exposure Amount (Eop)]

According to <Formation of resist pattern> described above, an optimum exposure amount Eop ($\mu C/cm^2$) for forming the LS pattern having the target size was determined. The results are shown in Tables 3 and 4 as "Eop ($\mu C/cm^2$)".

[Evaluation of Linewise Roughness (LWR)]

3σ of the LS pattern formed in <Formation of resist pattern> described above, which is a scale indicating LWR, was determined. The results are shown in Tables 3 and 4 as "LWR (nm)".

"3σ" indicates a triple value (unit: nm) of the standard deviation (σ) determined from measurement results obtained by measuring 400 line positions in the longitudinal direction of the line with a scanning electron microscope (accelerating voltage: 800V, trade name: S-9380, manufactured by Hitachi High-Tech Corporation)

The smaller the value of 3σ is, the smaller the roughness in the line side wall is, which means an LS pattern having a more uniform line width was obtained.

[Evaluation of Resolution]

LS patterns were formed by gradually increasing the exposure amount from the optimum exposure amount Eop described above, and the minimum dimensions of the pattern that was resolved without being collapsed were determined using a scanning electron microscope S-9380 (manufactured by Hitachi High-Tech Corporation). The results are shown in Tables 3 and 4 as "Resolution (nm)".

TABLE 3

|  | PAB (° C.) | PEB (° C.) | Eop [µC/cm$^2$] | LWR [nm] | Resolution [nm] |
| --- | --- | --- | --- | --- | --- |
| Example 1 | 110 | 90 | 88 | 4.1 | 42 |
| Example 2 | 110 | 90 | 84 | 4.1 | 44 |
| Example 3 | 110 | 90 | 86 | 4.3 | 45 |
| Example 4 | 110 | 90 | 89 | 4.2 | 42 |
| Example 5 | 110 | 90 | 89 | 4.0 | 41 |
| Example 6 | 110 | 90 | 90 | 4.1 | 42 |
| Example 7 | 110 | 90 | 87 | 4.2 | 42 |
| Example 8 | 110 | 90 | 88 | 4.1 | 41 |
| Example 9 | 110 | 90 | 87 | 4.2 | 42 |

TABLE 4

|  | PAB (° C.) | PEB (° C.) | Eop [µC/cm$^2$] | LWR [nm] | Resolution [nm] |
| --- | --- | --- | --- | --- | --- |
| Comparative Example 1 | 110 | 90 | 90 | 4.8 | 47 |
| Comparative Example 2 | 110 | 90 | 92 | 5.0 | 48 |
| Comparative Example 3 | 110 | 90 | 89 | 4.9 | 47 |
| Comparative Example 4 | 110 | 90 | 88 | 4.6 | 48 |
| Comparative Example 5 | 110 | 90 | 91 | 4.7 | 47 |
| Comparative Example 6 | 110 | 90 | 90 | 4.8 | 48 |
| Comparative Example 7 | 110 | 90 | 88 | 4.8 | 47 |

From the results shown in Tables 3 to 4, it can be confirmed that a resist pattern having good sensitivity, resolution, and roughness reduction property in the formation of the resist pattern can be formed with the resist compositions of Examples as compared with the resist compositions of Comparative Examples.

While preferred embodiments of the invention have been described and illustrated above, it should be understood that these are exemplary of the invention and are not to be considered as limiting. Additions, omissions, substitutions, and other modifications can be made without departing from the scope of the invention. Accordingly, the invention is not to be considered as being limited by the foregoing description and is only limited by the scope of the appended claims.

What is claimed is:

1. A resist composition which generates an acid upon exposure and exhibits changed solubility in a developing solution under action of acid, the resist composition comprising:
   a base material component (A) which exhibits changed solubility in a developing solution under action of acid; and
   an acid generator component (B) which generates an acid upon exposure,
   wherein the acid generator component (B) contains a first acid generator and a second acid generator,
   the first acid generator is a compound (B1) represented by General Formula (b1),
   the second acid generator is a compound (B2) represented by General Formula (b2-1) including a cation moiety and an anion moiety having a molar volume of 250 cm$^3$/mol or less, and
   the molar volume of the anion moiety of the compound (B2) is smaller than a molar volume of the anion moiety of the compound (B1):

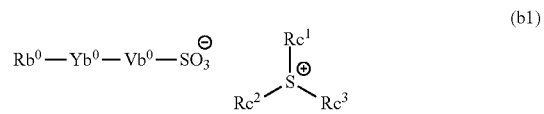

(b1)

wherein in formula (b1) Rb$^0$ represents a condensed cyclic group containing a condensed ring having at least one aromatic ring, Yb 0 represents a divalent linking group or a single bond, Vb$^0$ represents a single bond, an alkylene group, or a fluorinated alkylene group, Rc$^1$ represents an aryl group having an electron-withdrawing group, and Rc$^2$ and Rc$^3$ each independently represent an aryl group which may have a substituent, or Rc$^2$ and Rc$^3$ are bonded to each other to form a ring together with a sulfur atom in the formula,

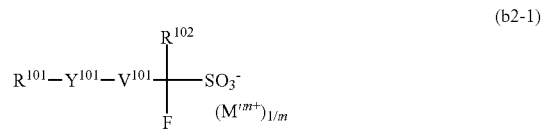

(b2-1)

and wherein in formula (b2-1), R$^{101}$ represents a cyclic group which may have a substituent, a chain alkyl group which may have a substituent, or a chain alkenyl group which may have a substituent, R$^{102}$ represents a fluorinated alkyl group having 1 to 5 carbon atoms or a fluorine atom, Y$^{101}$ represents a divalent linking group containing an oxygen atom or a single bond, V$^{101}$ represents a single bond, an alkylene group, or a fluorinated alkylene group, and M$^{m+}$ represents an m-valent onium cation.

2. The resist composition according to claim 1, wherein the compound (B1) is a compound represented by General Formula (b1-1):

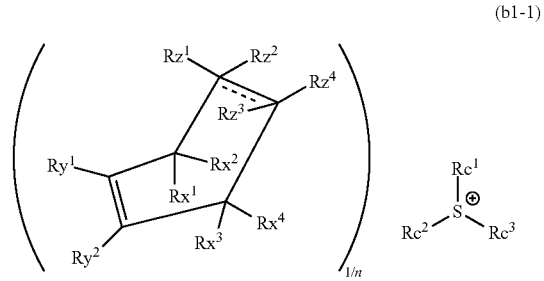

(b1-1)

wherein Rx$^1$ to Rx$^4$ each independently represent a hydrocarbon group which may have a substituent or a hydrogen atom, or alternatively, two or more of Rx$^1$ to Rx$^4$ may be bonded to each other to form a ring structure, and $Ry^1$ and $Ry^2$ each independently represent a hydrocarbon group which may have a substituent or a hydrogen atom, or alternatively, $Ry^1$ and $Ry^2$ may be bonded to each other to form a ring structure,

 is a double bond or a single bond, $Rz^1$ to $Rz^4$ each independently represent, where valence allows, a hydrocarbon group which may have a substituent or a hydrogen atom, or alternatively, two or more $Rz^1$ to $Rz^4$ may be bonded to each other to form a ring structure, provided that two or more of $Rx^1$ to $Rx^4$, $Ry^1$ and $Ry^2$, or two or more of $Rz^1$ to $Rz^4$ are bonded to each other to form an aromatic ring, and at least one of $Rx^1$ to $Rx^4$, $Ry^1$ and $Ry^2$, and $Rz^1$ to $Rz^4$ has an anion group represented by General Formula (b0-r-an1), and an entire anion moiety is an n-valent anion, n represents an integer of 1 or greater, $Rc^1$ represents an aryl group having an electron-withdrawing group, and $Rc^2$ and $Rc^3$ each independently represent an aryl group which may have a substituent or alternatively, $Rc^2$ and $Rc^3$ are bonded to each other to form a ring together with a sulfur atom in the formula:

$$*-Yb^0-Vb^0-SO_3^{\ominus} \quad \text{(b0-r-an1)}$$

wherein $Yb^0$ represents a divalent linking group or a single bond, $Vb^0$ represents a single bond, an alkylene group, or a fluorinated alkylene group, and * represents a bonding site.

3. The resist composition according to claim 1, wherein the molar volume of the anion moiety of the compound (B1) is 270 cm³/mol or more.

4. The resist composition according to claim 1, wherein the electron-withdrawing group in $Rc^1$ represents a fluorine atom or a fluorinated alkyl group.

5. A method of forming a resist pattern, comprising:
   forming a resist film on a support using the resist composition according to claim 1;
   exposing the resist film; and
   developing the exposed resist film to form a resist pattern.

6. The method of forming a resist pattern according to claim 5, wherein the resist film is exposed with extreme ultraviolet (EUV) rays or electron beam (EB).

7. The resist composition according to claim 1, wherein the second acid generator is a compound represented by General Formula (b2-1-1), (b2-1-2) or (b2-1-3):

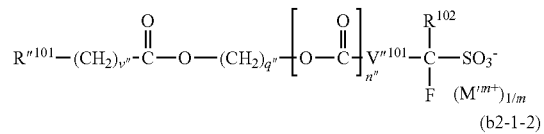

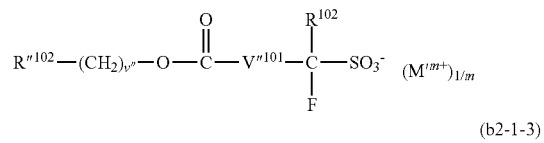

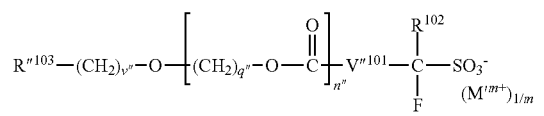

wherein $R''^{101}$ represents an aliphatic cyclic group which may have a substituent or a chain alkyl group which may have a substituent, $R''^{102}$ represents an aliphatic cyclic group which may have a substituent or a chain alkyl group which may have a substituent, $R''^{103}$ represents an aliphatic cyclic group which may have a substituent or a chain alkyl group which may have a substituent, $V''^{101}$ represents a single bond, an alkylene group having 1 to 4 carbon atoms, or a fluorinated alkylene group having 1 to 4 carbon atoms, $R^{102}$ represents a fluorine atom or a fluorinated alkyl group having 1 to 5 carbon atoms, Each v" independently represents an integer in a range of 0 to 3, each q" independently represent an integer in a range of 0 to 20, n" represents 0 or 1, and $M'^{m+}$ represents an m-valent onium cation.

* * * * *